(12) United States Patent
Honda et al.

(10) Patent No.: US 8,480,804 B2
(45) Date of Patent: Jul. 9, 2013

(54) THIN FILM, METHOD AND APPARATUS FOR FORMING THE SAME, AND ELECTRONIC COMPONENT INCORPORATING THE SAME

(75) Inventors: Kazuyoshi Honda, Osaka (JP); Masaru Odagiri, Hyogo-ken (JP); Kiyoshi Takahashi, Osaka (JP); Noriyasu Echigo, Hyogo-ken (JP); Nobuki Sunagare, Shimane-ken (JP)

(73) Assignee: Panasonic Corporation, Osaka (JP)

( * ) Notice: Subject to any disclaimer, the term of this patent is extended or adjusted under 35 U.S.C. 154(b) by 665 days.

(21) Appl. No.: 12/761,036

(22) Filed: Apr. 15, 2010

(65) Prior Publication Data

US 2010/0192858 A1 Aug. 5, 2010

Related U.S. Application Data

(60) Continuation of application No. 10/379,241, filed on Mar. 4, 2003, now abandoned, which is a division of application No. 09/669,116, filed on Sep. 25, 2000, now Pat. No. 6,602,559, which is a division of application No. 09/605,339, filed on Jun. 28, 2000, now Pat. No. 6,488,985, which is a continuation of application No. 08/859,504, filed on May 20, 1997, now Pat. No. 6,153,259.

(30) Foreign Application Priority Data

| May 21, 1996 | (JP) | 8-125400 |
| Mar. 10, 1997 | (JP) | 9-054760 |
| Mar. 17, 1997 | (JP) | 9-062651 |
| Apr. 1, 1997 | (JP) | 9-081768 |

(51) Int. Cl.
*C23C 16/00* (2006.01)

(52) U.S. Cl.
USPC .......................................... 118/726; 118/720

(58) Field of Classification Search
USPC .................................................. 118/726, 720
See application file for complete search history.

(56) References Cited

U.S. PATENT DOCUMENTS

| 3,649,358 A | 3/1972 | Johnston |
| 3,678,888 A | 7/1972 | Davies et al. |

(Continued)

FOREIGN PATENT DOCUMENTS

| EP | 0 261 240 | 6/1986 |
| EP | 0 369 019 | 3/1989 |

(Continued)

OTHER PUBLICATIONS

European Office Action for corresponding application No. 97108188.0 issued Aug. 4, 2009.

(Continued)

*Primary Examiner* — Sylvia R MacArthur
(74) *Attorney, Agent, or Firm* — Renner, Otto, Boisselle & Sklar, LLP

(57) ABSTRACT

A method for forming a thin film includes the steps of: supplying a deposition material in the form of a liquid onto a heated surface; heating and vaporizing the deposition material on the heated surface while the deposition material is undergoing movement; and depositing the deposition material onto a deposition surface. The deposition material is supplied onto a position of the heated surface where the vaporized deposition material does not reach the deposition surface.

13 Claims, 34 Drawing Sheets

U.S. PATENT DOCUMENTS

| | | | |
|---|---|---|---|
| 4,022,925 A | 5/1977 | Reuter et al. | |
| 4,230,650 A | 10/1980 | Guignard | |
| 4,306,954 A | 12/1981 | Wendling et al. | |
| 4,478,876 A | 10/1984 | Chung | |
| 4,543,275 A | 9/1985 | Akashi et al. | |
| 4,722,515 A | 2/1988 | Ham | |
| 4,748,313 A | 5/1988 | de Rudnay | |
| 4,828,905 A | 5/1989 | Wada et al. | |
| 4,842,893 A | 6/1989 | Yializis et al. | |
| 4,954,371 A | 9/1990 | Yializis | |
| 5,032,461 A | 7/1991 | Shaw et al. | |
| 5,076,203 A * | 12/1991 | Vaidya et al. | 118/718 |
| 5,178,902 A | 1/1993 | Wong et al. | |
| 5,429,843 A | 7/1995 | Masaki et al. | |
| 5,496,620 A | 3/1996 | Kitakami et al. | |
| 5,653,813 A | 8/1997 | Benzing et al. | |
| 5,725,909 A | 3/1998 | Shaw et al. | |
| 5,945,174 A | 8/1999 | Shaw et al. | |
| 6,106,627 A | 8/2000 | Yializis | |
| 6,153,259 A | 11/2000 | Honda et al. | |
| 6,264,747 B1 | 7/2001 | Shaw et al. | |
| 6,488,985 B1 | 12/2002 | Honda et al. | |
| 6,602,559 B1 | 8/2003 | Honda et al. | |
| 6,714,401 B2 | 3/2004 | Honda et al. | |
| 6,942,903 B2 | 9/2005 | Honda et al. | |

FOREIGN PATENT DOCUMENTS

| | | |
|---|---|---|
| EP | 0 337 316 | 4/1989 |
| EP | 0 420 533 | 9/1990 |
| EP | 0 436 219 | 12/1990 |
| EP | 0435210 | 12/1990 |
| EP | 0 468 488 | 7/1991 |
| EP | 0 650 168 | 10/1994 |
| EP | 0 684 597 | 11/1994 |
| GB | 1 168 641 | 6/1967 |
| GB | 1 253 124 | 2/1969 |
| JP | 59056227 | 3/1984 |
| JP | 02228036 | 9/1990 |

OTHER PUBLICATIONS

European Search Report for corresponding application No. 97108188.0 dated Jul. 18, 1998.

European Search Report for corresponding application No. 97108188.0 dated Oct. 26, 1998.

Webster's II New Riverside University Dictionary, Houghton Mifflin Company, 1984, p. 135.

Co-pending U.S. Appl. No. 10/379,241, filed Mar. 4, 2003.

* cited by examiner

THIN FILM, METHOD AND APPARATUS FOR FORMING THE SAME, AND ELECTRONIC COMPONENT INCORPORATING THE SAME

CROSS-REFERENCE TO RELATED APPLICATIONS

This application is a continuation of U.S. non-provisional application Ser. No. 10/379,241 filed Mar. 4, 2003, now abandoned, which is a divisional of U.S. non-provisional application Ser. No. 09/669,116 filed on Sep. 25, 2000, now U.S. Pat. No. 6,602,559, which is a divisional of U.S. non-provisional application Ser. No. 09/605,339 filed on Jun. 28, 2000, now U.S. Pat. No. 6,488,985, which is a continuation of U.S. non-provisional application Ser. No. 08/859,504 filed May 20, 1997, now U.S. Pat. No. 6,153,259, the contents of which are hereby incorporated by reference.

BACKGROUND OF THE INVENTION

1. Field of the Invention

The present invention relates to: a thin film suitable for use as an electronic part; a method and an apparatus for forming the thin film; and an electronic component incorporating the thin film.

2. Description of the Related Art

Thin films have a very wide role in today's society and are applied to various kinds of daily products such as wrapping paper, magnetic tape, capacitors or semiconductors. Without these thin films, current high performance or size reducing technology could not be achieved.

Methods for producing thin films that satisfy industrial demands have been undergoing various developments, for example, thin films earmarked for wrapping paper, magnetic tape, capacitors, etc., are produced by combining a vacuum vapor deposition process with a sequential rolling process which is considered to have an advantage in high-speed mass production. In such a method, a material to be deposited (hereinafter, simply referred to as a "deposition material") and a material as a base substrate where the deposition material is deposited are selected depending on the use of the thin film. When necessary, reaction gas may be introduced into a vacuum chamber or the base substrate may be provided with an electric potential in order to form a thin film with the desired characteristics.

A magnetic recording medium with long length can be obtained by using a deposition material containing magnetic elements (e.g., Co, Ni or Fe) and performing reaction deposition while introducing an oxygen gas into the vacuum chamber. In the case of a semiconductor, a sputtering method is generally used.

A thin film made of resin is formed by a coating method. Reverse coating or die coating is industrially employed as a method for providing a coating of resin on the base substrate. Generally, a material is diluted with a solvent before being coated, dried and cured on the base substrate. By a usual coating method, the thickness of the coating material deposited is generally several microns or more. Therefore, in order to form an extremely sheer resin thin film (herein, a "sheer" resin thin film refers to a "thin" resin thin film), the coating material needs to be diluted with a solvent. The lowest limit of the thickness of the resin thin films formed by the above-described methods is, in most of the cases, around 1 μm. Even when the coating material is diluted with the solvent, a resin thin film with a thickness of 1 μm or less is hard to obtain. Additionally, dilution with a solvent tends to cause defects in the dried coating film and is associated with other problems including environmental problems.

Recently, various composite thin films made from laminated thin films of different kinds have become available and have been used in various industrial fields. An application of composite thin films as chip-shaped electronic components has been receiving much attention. The composite thin films allow for the size reduction of, while still maintaining a high performance, for example, capacitors, coils, resistors or combined components thereof and have already been produced and the market for such products is expanding.

As described above, various methods are available for forming resin thin films. However, by the general coating method, the thickness of the coating material would be several microns or more at the thinnest. Therefore, in order to form an extremely sheer resin thin film, the coating material needs to be diluted with a solvent. Even when the coating material is diluted with a solvent, a resin thin film with a thickness of 1 μm or less is hard to obtain. Additionally, dilution with a solvent tends to cause defects in the dried coating film and is associated with other problems including environmental problems.

In the case of a laminate film, adhesion between the film layers is important as well as the performance of each film layer. Insufficient adhesion between the film layers will cause a minor separation between the film layers during subsequent production steps or during actual usage. Such a minor separation often results in separation of the entire adhesion area between the film layers. Therefore, from a practical standpoint, such a problem needs to be solved.

SUMMARY OF THE INVENTION

According to one aspect of the present invention, a method for forming a thin film includes the steps of: supplying a deposition material in the form of a liquid onto a heated surface; heating and vaporizing the deposition material on the heated surface while the deposition material is undergoing movement; and depositing the deposition material onto a deposition surface. The deposition material is supplied onto a position of the heated surface where the vaporized deposition material does not reach the deposition surface.

In one embodiment of the present invention, the deposition material on the heated surface is carried in accordance with a rotational movement of the heated surface.

In another embodiment of the present invention, the step of supplying the deposition material in the form of a liquid onto the heated surface includes a step of supplying the deposition material in either an atomized state or a vaporized state.

In still another embodiment of the present invention, the step of supplying the deposition material includes one of the steps of: ultrasonic atomizing; spraying atomizing; mechanical atomizing; and evaporating.

In yet still another embodiment of the present invention, the step of supplying the deposition material, the step of heating and vaporizing and the step of depositing the deposition material onto the deposition surface are conducted in a vacuum state.

In still another embodiment of the present invention, the deposition material is a curable resin material. The method further includes, following the step of depositing the deposition material onto the deposition surface, a step of curing the deposited deposition material.

In still another embodiment of the present invention, the method further includes a step of forming another layer made of a material different from the deposition material on a resin thin film made from the cured deposition material.

In still another embodiment of the present invention, the step of supplying the deposition material is conducted in a vacuum state that is different from a vacuum state for the step of curing the deposited deposition material and the step of forming another layer made of the material different from the deposition material on the resin thin film made from the cured deposition material.

In still another embodiment of the present invention, the method includes a step of alternately conducting a step of forming the resin thin film and a step of forming another layer.

In still another embodiment of the present invention, the deposition material on the heated surface is carried by running the deposition material along the heated surface.

In still another embodiment of the present invention, the method includes a step of running the deposition material on a plurality of heated surfaces, said heated surfaces being at different temperatures.

In still another embodiment of the present invention, a region of the heated surface where the deposition material in the form of a liquid is supplied is maintained at a lower temperature than a temperature of other regions of the heated surface.

In still another embodiment of the present invention, the deposition material moves in the form of a liquid on the plurality of heated surfaces.

In still another embodiment of the present invention, the method further includes the steps of: supplying the deposition material on the heated surface undergoing rotational movement; and carrying the deposition material by rotating the heated surface.

In still another embodiment of the present invention, the method further includes a step of collecting part of the deposition material in the form of a liquid that is carried along the heated surface of a container.

According to another aspect of the present invention, the method for forming a thin film includes a step of depositing a deposition material onto a deposition surface. The method further includes, prior to depositing the deposition material onto the deposition surface, a step of radiating a charged particle beam onto at least one of the deposition material or the deposition surface.

In one embodiment of the present invention, the step of depositing the deposition material on the deposition surface includes a step of depositing at least one of the deposition material which is in either an atomized state or a vaporized state, onto the deposition surface.

In another embodiment, the step of depositing includes one of the steps of: ultrasonic atomizing; spraying atomizing; mechanical atomizing; and evaporating.

In still another embodiment, the step of evaporating includes a step of supplying the deposition material in the form of a liquid to the heated surface, and the step of supplying the deposition material is a step of supplying the deposition material which is in either an atomized state or a vaporized state, onto the deposition surface.

In yet still another embodiment of the present invention, the charged particle beam includes at least one of an electron beam or an ion beam.

In still another embodiment of the present invention, an acceleration voltage of the charged particle beam is about 50 V or more.

In still another embodiment of the present invention, the deposition material is a curable resin material. The method further includes, following the step of depositing the deposition material onto the deposition surface, a step of curing the deposited deposition material.

In still another embodiment of the present invention, a viscosity of the curable resin material at a normal temperature and a normal pressure is in a range of about 30 cps to about 800 cps.

In still another embodiment of the present invention, the step of depositing the deposition material onto the deposition surface and the step of radiating the charged particle beam are conducted in different vacuum states.

According to another aspect of the present invention, a method for forming a resin thin film and a metal thin film under a vacuum condition includes the steps of: forming the resin thin film; performing a discharge treatment by exposing the resin thin film to a discharge atmosphere containing oxygen gas; and forming the metal thin film on the resin thin film.

In one embodiment of the present invention, the step of forming the resin thin film, the step of performing the discharge treatment and the step of forming the metal thin film are sequentially conducted in a vacuum atmosphere.

In another aspect of the present invention, a method for forming a resin thin film and a metal thin film includes the steps of: depositing an ultraviolet curable resin; forming the cured resin thin film which is incompletely cured by radiating ultraviolet light onto the ultraviolet curable resin in a atmosphere containing oxygen gas; and forming the metal thin film on the resin thin film.

In one embodiment of the present invention, the step of forming the metal thin film is conducted by employing an electron beam deposition method.

In another embodiment of the present invention, the step of forming the metal thin film includes a step of depositing a metal thin film while radiating an electron beam onto the resin thin film.

In another embodiment of the present invention, the ultraviolet curable resin includes an acrylic-type resin.

In another embodiment of the present invention, the method further includes a step of alternately conducting a step of forming the resin thin film and a step of forming the metal thin film.

According to another aspect of the present invention, a thin film formation apparatus includes: a heater having a heated surface for heating and vaporizing a deposition material while carrying the deposition material; a supplier which supplies the deposition material to the heated surface; a support body which maintains a substrate with a deposition surface such that the deposition material which is vaporized is deposited onto the deposition surface; and a curing device which cures the deposition material on the deposition surface. The deposition material is supplied at a position of the heated surface where the vaporized deposition material does not reach the deposition surface.

In one embodiment of the present invention, the heater includes the heated surface which rotates and carries the deposition material supplied to the heated surface at a position where the deposition material, when vaporized, directly reaches the deposition surface.

In another embodiment of the present invention, the heater is a heated roller having the heated surface.

In still another embodiment of the present invention, the heater is a heated belt having the heated surface.

In yet still another embodiment of the present invention, the film formation apparatus further includes a supplier for supplying the deposition material which is in either an atomized state or a vaporized state, to the prescribed position.

In still another embodiment of the present invention, the supplier includes one of an ultrasonic atomizing device; a spray atomizing device; a mechanical atomizing device; and an evaporating device.

In still another embodiment of the present invention, the heated surface of the heater is tilted so that the deposition material supplied to the heated surface flows, the deposition material being heated and vaporized while moving thereon.

In still another embodiment of the present invention, the film formation apparatus further includes an obstruction wall between the position where the deposition material is supplied to the heated surface and the deposition surface, so that the deposition material is prevented from reaching the deposition surface in a linear manner.

In still another embodiment of the present invention, the film formation apparatus further includes a second heater, the second heater having a first heated surface which rotates and receives the deposition material on the first heated surface from the heater and heats and vaporizes the deposition material while carrying the deposition material.

In still another embodiment of the present invention, the other heater includes at least one of a heated roller having a heated surface and a heated belt having a heated surface.

In still another embodiment of the present invention, the thin film formation apparatus further includes a container for collecting the deposition material.

In still another embodiment of the present invention, the thin film formation apparatus further includes a vacuum chamber. The vacuum chamber has the heater, the support body and the curing device, the supplier supplies the deposition material to the heated surface of the heater from outside of the vacuum chamber.

In still another embodiment of the present invention, the curing device includes at least one of a UV light radiation device, an electron beam radiation device and a thermosetting device.

In still another embodiment of the present invention, the curing device includes a UV light radiation device and an oxygen gas inlet provided in the UV light radiation device.

According to another aspect of the present invention, a thin film formation apparatus includes: a first supplier which supplies a deposition material that is atomized or vaporized; a support body which maintains a substrate with a deposition surface such that the deposition material which is atomized or vaporized is deposited onto the deposition surface; and a device for radiating a charged particle beam onto at least one of the deposition material and the deposition surface.

In one embodiment of the present invention, the first supplier includes one of an ultrasonic atomizing device; a spray atomizing device; a mechanical atomizing device; and an evaporating device.

In another embodiment of the present invention, the thin film formation apparatus having the first supplier with the heated surface for vaporizing the deposition material further includes a second supplier supplying at least one of the deposition material which is atomized and the deposition material which is vaporized on the heated surface of the first supplier.

In still another embodiment of the present invention, the charged particle radiation device includes at least one of an electron beam radiation device and an ion beam radiation device.

In yet still another embodiment of the present invention, the thin film formation apparatus further includes a curing device for curing the deposition material deposited on the deposition surface, the curing device having at least one of an UV light radiation device, an electron radiation device and a thermosetting device.

According to another aspect of the present invention, a thin film formation apparatus for continuously forming a resin thin film and a metal thin film in a vacuum state is provided. The surface of the resin thin film is exposed to discharge atmosphere containing oxygen gas after the resin thin film is formed.

According to another aspect of the present invention, a thin film formation apparatus for continuously forming a resin thin film and a metal thin film in a vacuum state, includes a UV light radiation device for radiating the surface of the resin thin film with UV light in atmosphere containing oxygen after the resin thin film is formed.

According to another aspect of the present invention, a thin film has an interface between a resin thin film and a metal thin film which are laminated. A concentration of oxygen in the vicinity of the interface between the resin thin film and the metal thin film is higher than a concentration of oxygen in a middle portion of the resin thin film in its thickness direction.

In one embodiment of the present invention, the concentration of oxygen in the vicinity of the interface is about 1.3 times or more the concentration of oxygen in a middle portion of the resin thin film in its thickness direction.

In another embodiment of the present invention, the resin thin film contains at least one acrylate monomer.

In still another embodiment of the present invention, the resin thin film and the metal thin film are alternately laminated.

According to another aspect of the present invention, an electronic component having the above-described thin film is provided.

In one embodiment of the present invention, the thickness of the metal thin film is in a range of about 50 nm to about 2000 nm, and the thickness of the resin thin film is in a range of about 0.05 to about 3 µm.

In another embodiment of the present invention, the metal thin film is a stripe-like thin film.

In still another embodiment of the present invention, the metal thin film includes a layer made of different metal materials.

In yet still another embodiment of the present invention, the thickness of the metal thin film is in a range of about 15 to about 100 nm, and a thickness of a resin thin film is in a range of about 0.05 µm to about 1 µm.

In still another embodiment of the present invention, an outermost layer of the resin thin film is thicker than the other resin thin film layers.

Thus, the invention described herein makes possible the advantage of: (1) providing a method and an apparatus for forming a high-quality resin thin film suitable for use as an electronic component or the like, the method requiring no solvent and thus realizing superior productivity of the thin film and environmental protection; (2) providing a method and an apparatus for forming a resin thin film having superior flatness so as to provide a high-performance electronic components; and (3) providing a method and an apparatus for forming a laminate film with strong adhesion between the film layers so as to provide a highly-reliable high-performance electronic components.

These and other advantages of the present invention will become apparent to those skilled in the art upon reading and understanding the following detailed description with reference to the accompanying figures.

DESCRIPTION OF THE PREFERRED EMBODIMENTS

Figure 1:
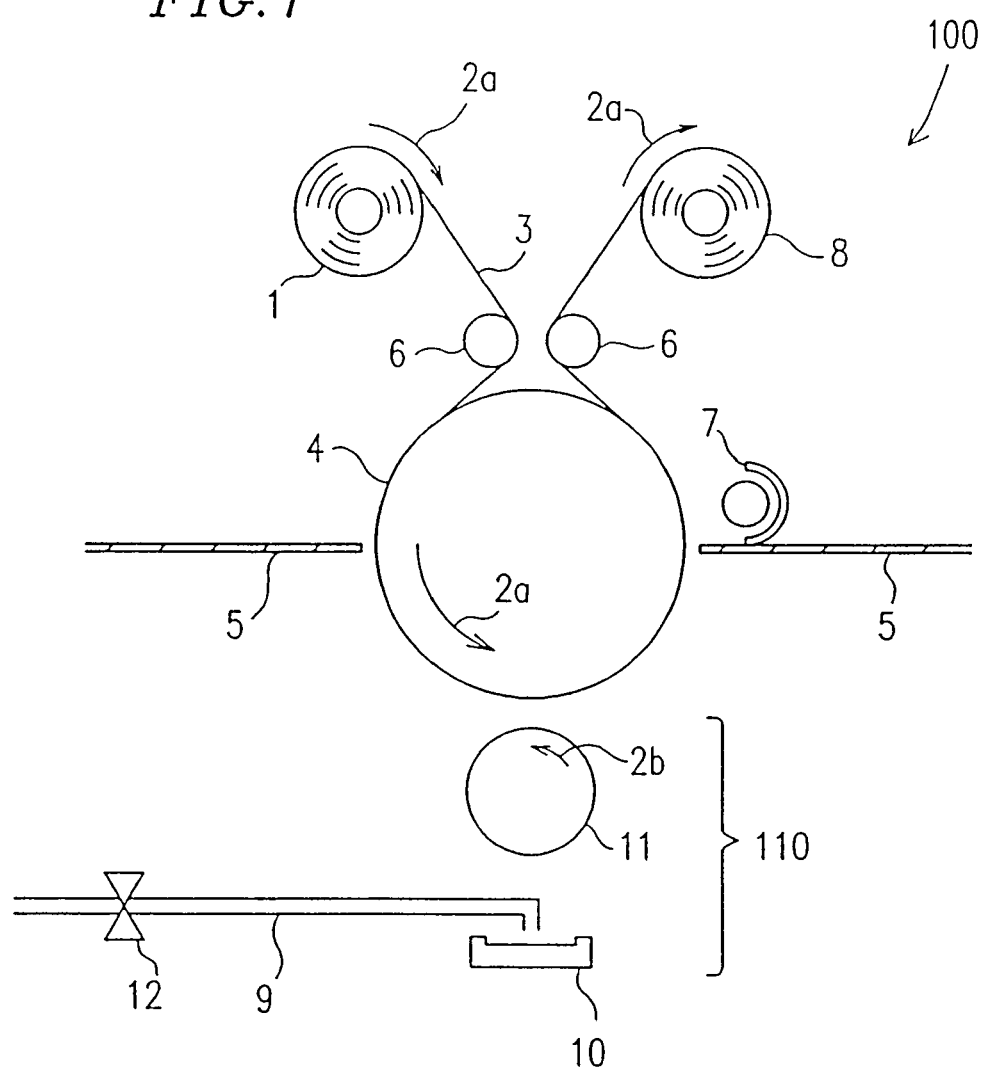
FIG. 1 is a schematic view showing one example of a thin film formation apparatus for forming a thin film according to a first aspect of the present invention.

According to a first aspect of the present invention, a method for producing a thin film includes the steps of heating and vaporizing a deposition material while changing the position thereof. The deposition material in the form of a liquid (i.e., in a liquid state) is applied to a position where it does not reach a deposition surface of a base substrate (i.e., a surface where the deposition material is to be finally deposited) when evaporated, whereby the deposition material is heated and vaporized while being carried. While the deposition material is heated, vaporized and carried to a position where it can reach a deposition surface of a base substrate, anomalous particles (i.e., coarse particles) of the deposition material resulting from rapid heating and vaporization of the deposition material in an excessive manner can be controlled. As a result, a uniform high-quality resin thin film which is extremely thin can be formed on the base substrate (e.g., a film).

The deposition material may be applied onto a moving surface of a heated body (i.e., a heated surface) to be heated to a desired temperature and vaporized while the deposition material is carried by the moving heated surface. In this case, the deposition material, in the form of a liquid, is initially applied to a position on the moving heated body where the vaporized deposition material cannot reach a deposition surface of a base substrate. Preferably, the deposition material is applied to the moving heated surface by being atomized and/or vaporized. Atomization and/or vaporization of the deposition material allows a small amount of the deposition material to be supplied to the heated surface at a steady rate. In this case, generation of anomalous particles can be further controlled.

Furthermore, the deposition material, in the form of a liquid, may also be supplied to a tilted heated surface so that the deposition material runs (i.e., flows) onto the heated surface while being heated to a desired temperature and vaporized. In this case, the liquid deposition material is initially applied to a position on the heated surface where the vaporized deposition material cannot reach a deposition surface of a base substrate. The heated surface may be inclined and vibrated (for example, in a seesaw-like motion). Vaporization (evaporation) of the running deposition material allows for an enhanced and steady vaporization rate.

The above-described methods can be used individually or in combination.

Hereinafter, Examples 1 through 9 and Examples 10 through 14 will be described to explain the first aspect of the present invention.

In Examples 1 through 9, the steps of heating and vaporizing the flowing deposition material are conducted by applying a liquid deposition material to a moving heated surface. By doing so, the deposition material on the heated surface can be heated to a desired temperature and vaporized while the heated surface is moving. In Examples 1 through 9, an acrylic resin thin film is formed on an Al deposition film. Hereinafter, the surface of the base substrate where the resin thin film is to be deposited will be referred to as a deposition surface.

Example 1

FIG. 1 is a schematic view showing a thin film formation apparatus 100 according to Example 1 of the present invention. Hereinafter, components having substantially the same functions are denoted by the same reference numerals.

An Al deposition film 3 runs from an dispensing roller 1 through a guiding roller 6 to a cylindrical can 4. The Al deposition film 3 runs along the round surface of the cylindrical can 4, continuing through another guiding roller 6 and is taken up by a receiving roller 8. In FIG. 1, the running direction of the Al deposition film 3 is represented by the arrows 2a. A deposition material (acrylic monomer) is supplied to the Al deposition film 3 running along the round surface of the cylindrical can 4 exposed between shielding plates 5. The deposition material is then cured by being exposed to an UV radiation device 7, thereby forming an acrylic resin thin film.

A deposition material supplying section 110 of the thin film formation apparatus 100 according to Example 1 of the present invention includes an ultrasonic oscillator 10 and a heated roller 11. The liquid deposition material delivered from a liquid delivery tube 9 to the ultrasonic oscillator 10 is atomized by the ultrasonic oscillator 10 in order for application to the surface of the heated roller 11. The heated roller 11, at a desired temperature, is rotated in the direction represented by the arrow 2b. The deposition material on the heated roller 11 is heated to a desired temperature and vaporized from the surface thereof while the heated roller 11 is continuously rotating in the direction represented by the arrow 2b so as to be deposited on the surface of the Al deposition film 3 (i.e., the deposition surface).

The particles of the deposition material generated by the ultrasonic vibration of the ultrasonic oscillator 10 are relatively large. The diameter of each particle is several microns with some of them having a diameter of several tens of microns. Herein, particles having a diameter of 3 μm or more are referred to as anomalous particles. When such anomalous particles are directly deposited on the Al deposition film 3, an uneven thickness of the film and/or defects in the film occur. According to Example 1, the particles of the deposition material generated by the ultrasonic oscillator 10 are, at first, applied to the surface of the heated roller 11 so that the deposition material is not directly deposited on the Al deposition film 3. The deposition material on the surface of the heated roller 11 is heated until vaporized and carried up to the upper part of the heated roller 11 where the vaporized deposition material is deposited on the Al deposition film 3. The portion of the heated roller 11 applied with the deposition material (i.e., the lower half of the heated roller 11) does not face the deposition surface of the Al deposition film 3. Therefore, even in the case where anomalous particles of the deposition material are rapidly heated by the heated roller 11 in an excessive manner and regenerate anomalous particles, the anomalous particles are prevented from reaching the surface of the Al deposition film 3.

The rate of supply of the deposition material can be controlled by adjusting a valve 12 on the liquid delivery tube 9, the output of the ultrasonic oscillator 10, or the size, the temperature and/or rotation rate of the heated roller 11. For example, the radius of the heated roller 11 (e.g., about 120 mm) is set to be about 0.3 times the radius of the can 4 (e.g., about 400 mm to about 500 mm). The effective widths of the can 4 and the heated roller 11 are set to be, for example, about 500 mm. The rotation rates of the heated roller 11 and the can 4 are set to be, for example, about 100 rpm and about 2 to 3 rpm, respectively. These conditions can be suitably set depending on the application, by taking into consideration the size, thickness, property of the deposition material (evaporating temperature, evaporation rate, viscosity, etc.) and the like of the thin film to be formed. The temperature of the heated roller 11 is not limited to the temperature illustrated herein and can be changed depending on the material to be used or the conditions chosen for film formation. Basically, the heated roller 11 can be rotated either in a clockwise direction or in an anticlockwise direction. These options equally apply to the case of the later-described examples according to the present invention.

According to Example 1, a polyethylene terephthalate film having a thickness of about 2 μm with an Al layer having a thickness of about 30 nm formed thereon is used as the Al deposition film 3. 1,9-nonanediol diacrylate mixed with 10% by weight of a photopolymerization initiator is used as the deposition material. The temperature of the heated roller 11 is set to be 130° C.

Example 2

Figure 2:
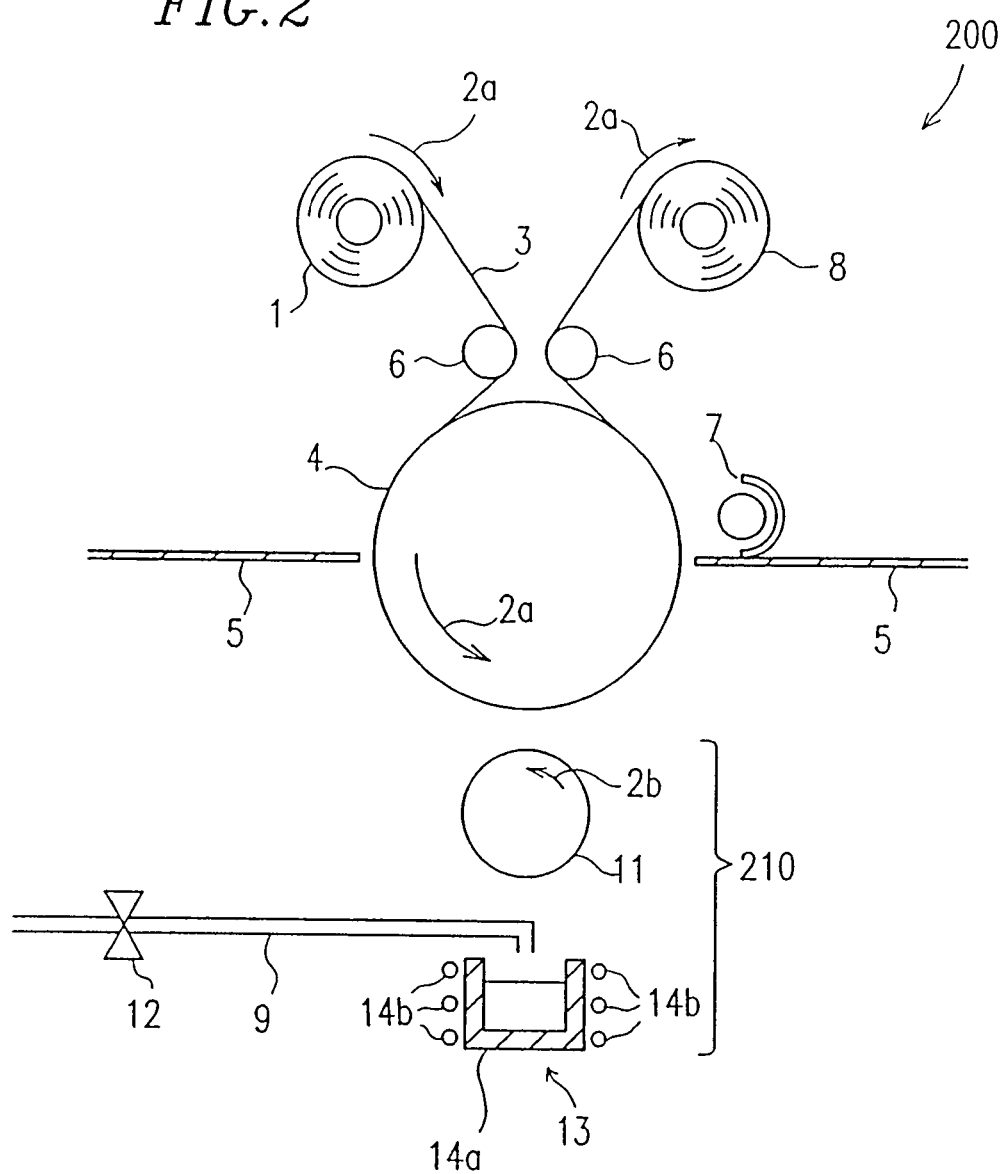
FIG. 2 is a schematic view showing another example of a thin film formation apparatus for forming a thin film according to the first aspect of the present invention.

FIG. 2 is a schematic view showing a thin film formation apparatus 200 according to Example 2 of the present invention. The thin film formation apparatus 200 differs from the thin film formation apparatus 100 according to Example 1 in that it has a deposition material supplying section 210 with a structure different from that of the deposition material supplying section 110.

The deposition material supplying section 210 includes a heated evaporation source 13 and a heated roller 11. The heated evaporation source 13 is provided with a container 14a and heaters 14b. A liquid deposition material delivered from a liquid delivery tube 9, is heated to a desired temperature and vaporized so as to be applied on the surface of a heated roller 11.

The heated evaporation source 13 rapidly heats the liquid deposition material delivered from the liquid delivery tube 9 and thus may generate anomalous particles (droplets having larger particle sizes) due to the bumping phenomenon. According to Example 2, such anomalous particles are not directly deposited on the Al deposition film 3 but first, they are deposited on the surface of the heated roller 11. Accordingly, the same effect as that of Example 1 can be obtained.

According to Example 2 of the present invention, a polyethylene terephthalate film having a thickness of 5 μm with an Al layer having a thickness of 50 nm formed thereon is used as the Al deposition film 3. Dimethylol-tri-cyclodecane diacrylate mixed with 0.5% by weight of a photopolymerization initiator is used as the deposition material. The temperatures of the heated roller 11 and the heated evaporation source 13 are set to be 110° C. and 150° C., respectively. Alternatively, the heated roller 11 and the heated evaporation source 13 may be set to the same temperature. The temperatures of the heated roller 11 and the heated evaporation source 13 may be suitably set so that the difference between the temperatures falls within about 50° C., either one of the temperatures being higher.

Example 3

Figure 3:
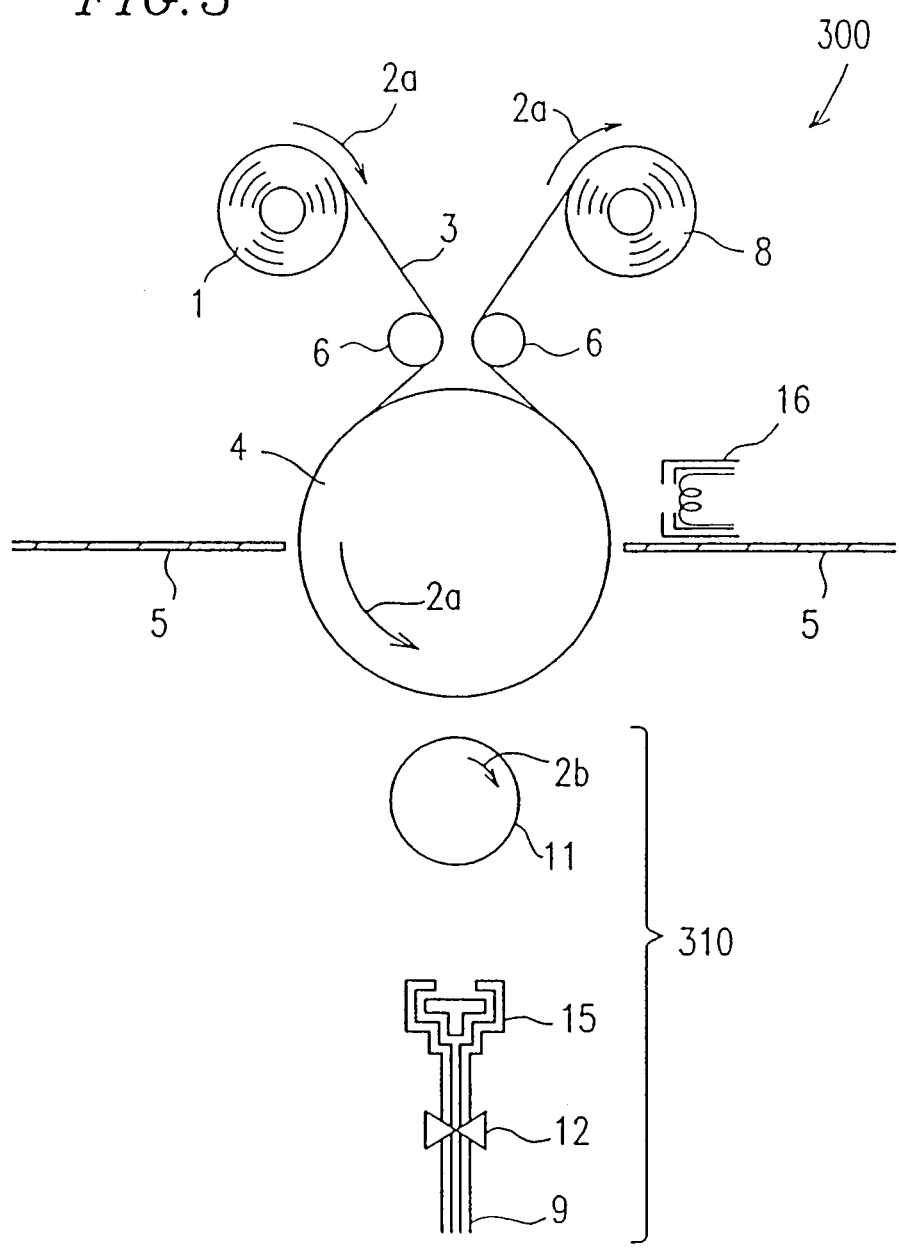
FIG. 3 is a schematic view showing another example of a thin film formation apparatus for forming a thin film according to the first aspect of the present invention.

FIG. 3 is a schematic view showing a thin film formation apparatus 300 according to Example 3 of the present invention. The thin film formation apparatus 300 differs from the thin film formation apparatus 100 according to Example 1 of the present invention in that it has a deposition material supplying section 310 with a structure different from the deposition material supplying section 110 and an electron beam radiation device 16 for curing acrylic monomer.

The deposition material supplying section 310 is provided with a spray nozzle 15. A liquid deposition material supplied from a liquid delivery tube 9 is atomized by the spray nozzle 15 so as to be applied on the surface of a heated roller 11.

The size of the particles formed by the spray nozzle 15 are relatively large. Each particle has a diameter of about several microns or more with some particles having a diameter of about several tens of microns. When such anomalous particles are directly deposited on the Al deposition film 3, an uneven thickness of the film and/or defects in the film occur. According to Example 3 of the present invention, the particles of the deposition material formed by the spray nozzle 15 are, at first, supplied to the surface of the heated roller 11 to avoid direct deposition onto the Al deposition film 3. Accordingly, the same effect as that of Example 1 can be obtained.

According to Example 3, a polyethylene terephthalate film having a thickness of about 4 μm with an Al layer having a thickness of about 70 nm formed thereon is used as the Al deposition film 3. A mixture of 1,9-nonanediol diacrylate and dimethylol-tri-cyclodecane diacrylate in a weight ratio of 1:1 is used as the deposition material. The temperature of the heated roller 11 is set to be 120° C.

Example 4

Figure 4:
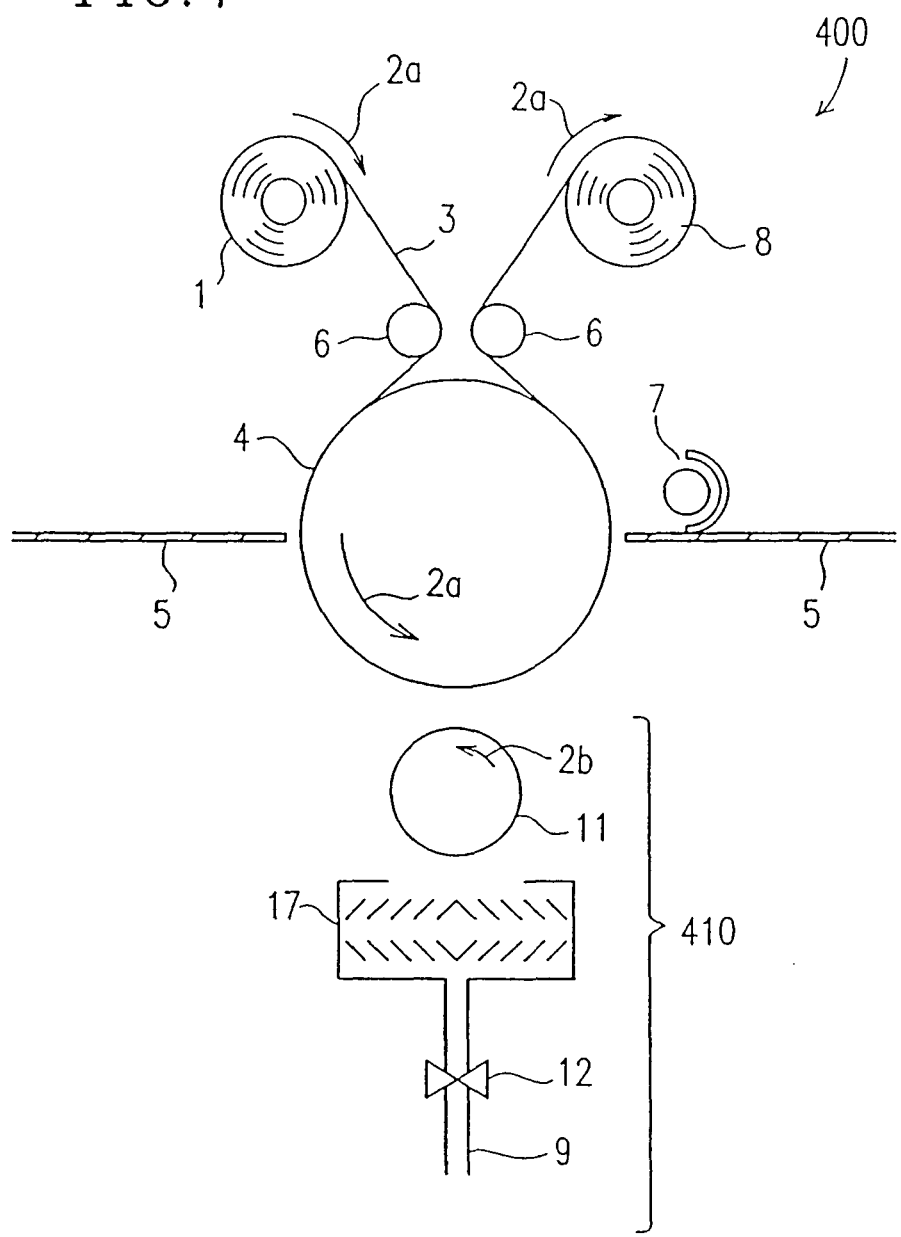
FIG. 4 is a schematic view showing another example of a thin film formation apparatus for forming a thin film according to the first aspect of the present invention.

FIG. 4 is a schematic view showing a thin film formation apparatus 400. The thin film formation apparatus 400 differs from the thin film formation apparatus 100 according to Example 1 of the present invention in that it has a deposition material supplying section 410 with a structure different from the deposition material supplying section 110.

The deposition material supplying section 410 of the thin film formation apparatus 400 includes a mechanical atomization device 17. A liquid deposition material delivered from a liquid delivery tube 9 is atomized by the mechanical atomization device 17 so as to be applied on the surface of a heated roller 11. Although the mechanical atomization device 17 used in Example 4 consists of two opposing rotating wings, it can be replaced with other known devices.

The size of the particles formed by the mechanical atomization device 17 are relatively large. Each particle has a diameter of about several microns or more with some particles having a diameter of about several tens of microns. When such anomalous particles are directly deposited on the Al deposition film 3, an uneven thickness of the film and/or defects in the film occur. According to Example 4 of the present invention, the particles of the deposition material formed by the mechanical atomization device 17 are, at first, supplied onto the surface of the heated roller 11 to avoid direct deposition onto the Al deposition film 3. Accordingly, the same effect as that of Example 1 can be obtained.

According to Example 4, a polypropylene sulfide film having a thickness of about 12 μm with an Al layer having a thickness of about 50 nm formed thereon is used as the Al deposition film 3. Isobornyl acrylate mixed with 1% by weight of photopolymerization initiator is used as the deposition material. The temperature of the heated roller 11 is set to be 80° C.

Example 5

Figure 5:
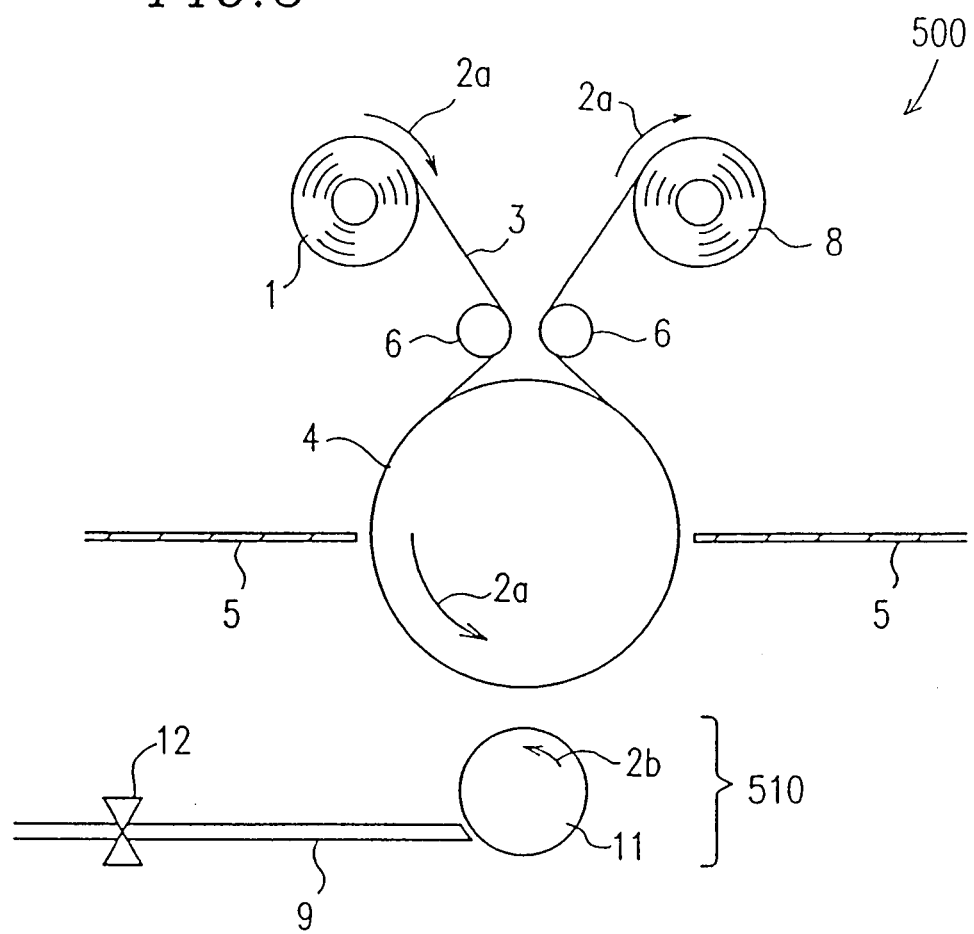
FIG. 5 is a schematic view showing another example of a thin film formation apparatus for forming a thin film according to the first aspect of the present invention.

FIG. 5 is a schematic view showing a thin film formation apparatus 500 according to Example 5 of the present invention. The thin film formation apparatus 500 differs from the thin film formation apparatuses 100 through 400 according to Examples 1 through 4 in that a deposition material supplying section 510 is not provided with a first supplying device for applying a vaporized or an atomized deposition material to a heated roller 11 (i.e., the ultrasonic oscillator 10 in Example 1, the heated evaporation source 13 in Example 2, the spray nozzle 15 in Example 3 and the mechanical atomization device 17 in Example 4).

According to Example 5, the liquid deposition material is directly applied to the surface of the heated roller 11 from the liquid delivery tube 9. The deposition material is supplied on the lower half of the surface of the heated roller 11 (i.e., the portion of the surface that does not oppose the deposition surface of the Al deposition film 3). As a result, even when anomalous particles of the deposition material are generated due to rapid heating by the heated surface of the heated roller 11, the anomalous particles are not directly deposited on the surface of the Al deposition film 3. Since the liquid deposition material is directly supplied to the surface of the heated roller 11, anomalous particles may be directly deposited onto the deposition surface due to rotation of the heated roller. Therefore, greater amounts of anomalous particles may be deposited onto the deposition surface as compared to the methods according to Examples 1 through 4, but less when compared to a conventional method where no heated roller is used.

According to Example 5 of the present invention, a polyethylene terephthalate film having a thickness of about 5 μm with an Al layer having a thickness of about 50 nm thereon is used as the Al deposition film 3. Dimethylol-tri-cyclodecane diacrylate mixed with 0.5% by weight of photopolymerization initiator is used as the deposition material. The temperature of the heated roller 11 is set to be 150° C.

Comparative Example 1

A resin thin film was formed under the same conditions as those in Example 1 using an apparatus that is substantially the same as apparatus 100, according to Example 1, except that no heated roller 11 was used.

Comparative Example 2

A resin thin film was formed under the same conditions as those in Example 2 using an apparatus that is substantially the same as apparatus 200, according to Example 2, except that no heated roller 11 was used.

Comparative Example 3

A resin thin film was formed under the same conditions as those in Example 3 using an apparatus that is substantially the same as apparatus 300, according to Example 3, except that no heated roller 11 was used.

Comparative Example 4

A resin thin film was formed under the same conditions as those in Example 4 using an apparatus that is substantially the same as the apparatus 400, according to Example 4, except that no heated roller 11 was used.

Comparative Example 5

Figure 6:
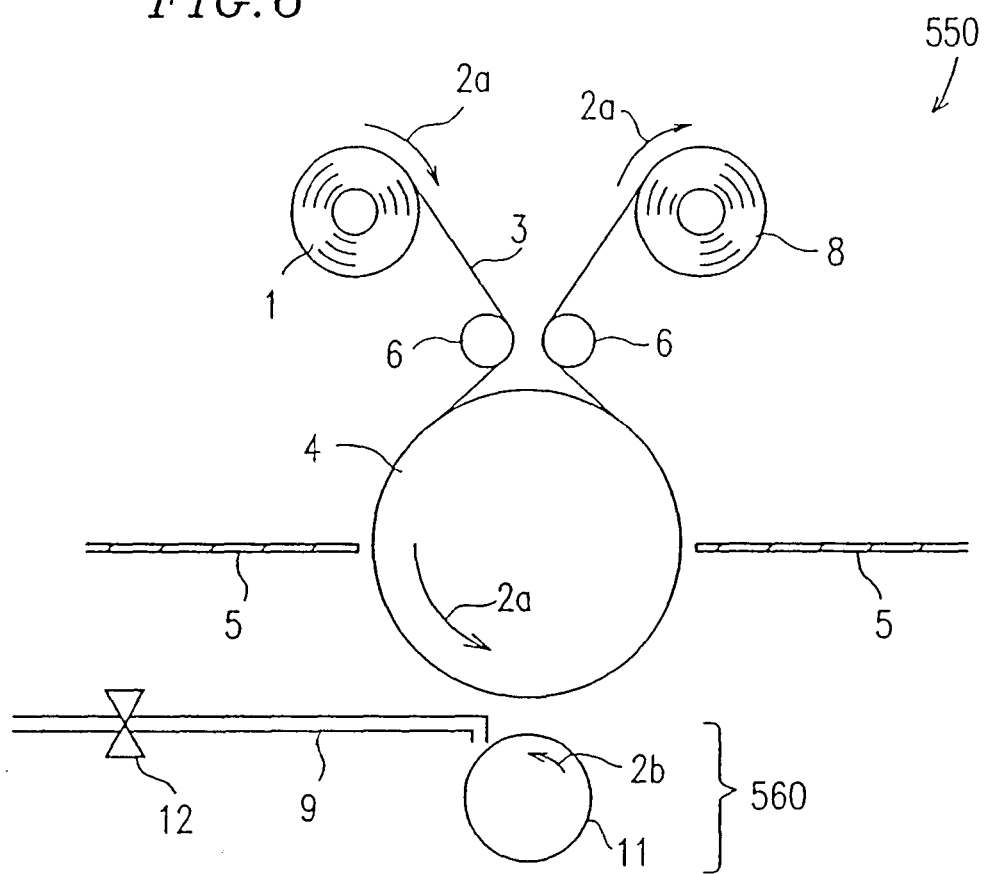
FIG. 6 is a schematic view showing a thin film formation apparatus according to a comparative example.

FIG. 6 is a schematic view showing a thin film formation apparatus 550 according to Comparative Example 5. The thin film formation apparatus 550 is substantially the same as the thin film formation apparatus 500, according to Example 5 of the present invention, except that the deposition material supplying section 560 has a different structure from that of the deposition material supplying section 510 of the apparatus 500. The deposition material supplying section 560 includes a liquid delivery tube 9 arranged such that the liquid deposition material is supplied on the upper half surface of the heated roller 11 (i.e., the surface opposing the deposition surface of the Al deposition film 3). Other than that, a resin thin film is formed under the same conditions as those of Example 5.

Resin thin films of various thickness were formed according to each of the methods described in Examples 1 through 5 and Comparative Examples 1 through 5 while varying the running rate of the Al deposition film 3. Resin thin films having a thickness of about 0.1 μm and about 0.8 μm were observed for an area of 5 cm×5 cm by an optical microscope. The maximum particle size of the anomalous particles and the number of the anomalous particles having a diameter of about 3 μm or more were observed. When a large amount of anomalous particles were present within the area, an area of 1 cm×1 cm was observed and the obtained value was multiplied by 25. The thickness of each film was measured by peeling off a part of the resin thin film by use of adhesive tape, etc. and the cross-section of the peeled resin thin film was observed through an electron microscope.

An Al layer (1 cm×1 cm) having a thickness of 100 nm was further formed on each of the resin thin films. Accordingly, this film has three layers. A first Al layer (the Al deposition film 3), a resin thin film and a second Al layer. The two Al layers sandwich the resin thin film so as to enable the Al layers to be used as electrodes. Resistance under the application of a DC voltage of 5V was measured in order to evaluate the insulation characteristics of the film. The thickness of the Al layer of the Al deposition film 3 was set to 50 nm. The results are shown in Table 1. Even when a polymer film with no Al deposition layer was used as the base substrate, the maximum sizes (diameters) and the numbers of the anomalous particles showed little difference from the above-mentioned results.

TABLE 1

Results of the Evaluation of the Resin Thin Films (Examples 1-5 and Comparative Examples 1-5)

| | Thickness 0.1 μm | | | Thickness 0.8 μm | | |
| --- | --- | --- | --- | --- | --- | --- |
| | Number of anomalous particles | Maximum particle size (μm) | Resistance (Ω) | Number of anomalous particles | Maximum particle size (μm) | Resistance (Ω) |
| Example 1 | 12 | 8 | $5 \times 10^6$ | 80 | 10 | $3 \times 10^8$ |
| Example 2 | 10 | 6 | $2 \times 10^6$ | 60 | 8 | $1 \times 10^8$ |
| Example 3 | 20 | 30 | $1 \times 10^4$ | 150 | 40 | $5 \times 10^6$ |
| Example 4 | 18 | 30 | $1 \times 10^5$ | 120 | 30 | $1 \times 10^7$ |
| Example 5 | 32 | 35 | $1 \times 10^5$ | 160 | 40 | $1 \times 10^7$ |
| Comparative Example 1 | 90 | 14 | $2 \times 10^4$ | 650 | 20 | $5 \times 10^6$ |
| Comparative Example 2 | 125 | 12 | $8 \times 10^3$ | 950 | 16 | $1 \times 10^6$ |
| Comparative Example 3 | 450 | 50 | <5 | 2800 | 75 | <5 |
| Comparative Example 4 | 275 | 45 | <5 | 1650 | 60 | <5 |
| Comparative Example 5 | 200 | 22 | <5 | 1550 | 22 | <5 |

As can be appreciated by comparing the results of Examples 1 through 4 with Comparative Examples 1 through 4, in the case where vaporized or atomized deposition material is, at first, supplied to the heated roller 11 by the first supplying device (the ultrasonic oscillator 10 in Example 1, the heated evaporation source 13 in Example 2, the spray nozzle 15 in Example 3, and the mechanical vaporization device 17 in Example 4) and then heated and vaporized while being carried, the amount of anomalous particles in the resin thin films was greatly reduced. Results of the resistance measurements also reveal that uniform resin thin films with less defects were formed according to Examples 1 through 4. This is considered to be due to the following reasons.

According to Examples 1 through 4, the anomalous particles generated by the first supplying device are, at first, applied to the surface of the heated roller 11 and thus are not directly deposited on the Al deposition film 3. The deposition material on the heated surface of the heated roller 11 is heated for vaporization while being carried to the upper portion of the heated roller 11, thereby being deposited onto the Al deposition film 3. Since the surface of the heated roller 11 where the deposition material is first supplied (i.e., the lower half of the heated roller) does not oppose the deposition surface of the Al deposition film 3, even when the anomalous particles of the deposition material are rapidly heated upon contact with the heated roller 11 and reform as anomalous particles, the reformed anomalous particles are not directly deposited onto the Al deposition film 3.

As a result, the deposition material deposited onto the deposition surface of the Al deposition film 3 is considered to contain minute amount of anomalous particles.

As is apparent from the results of Comparative Example 5, when the deposition material is directly applied to the upper surface of the heated roller 11 (the portion of the surface opposing the surface of the base substrate, i.e., the deposition surface, where the resin thin film is formed), a large amount of anomalous particles are generated. However, when the results of Example 5 and Comparative Example 5 are compared, it is obvious that when the deposition material is, at first, supplied to the lower half surface (the portion of the surface that does not oppose the deposition surface of the Al deposition film 3) of the heated roller 11, even when the deposition material is rapidly heated to form anomalous particles, the anomalous particles are prevented from being directly deposited onto the Al deposition film 3. Thus, a thin film with a relatively minute amount of defects can be formed.

Accordingly, it is important that the deposition material is first supplied to the surface of the heated roller where it does not face the deposition surface of the base substrate (i.e., the portion of the surface where the resin thin film is to be formed) and then is moved to a position where it faces the deposition surface of the base substrate. Moreover, it can be also understood by comparing Example 1 through 4 with Example 5 that use of the first supplying device further enhances the quality of the resin thin film.

Examples 6 through 9

Figure 7:
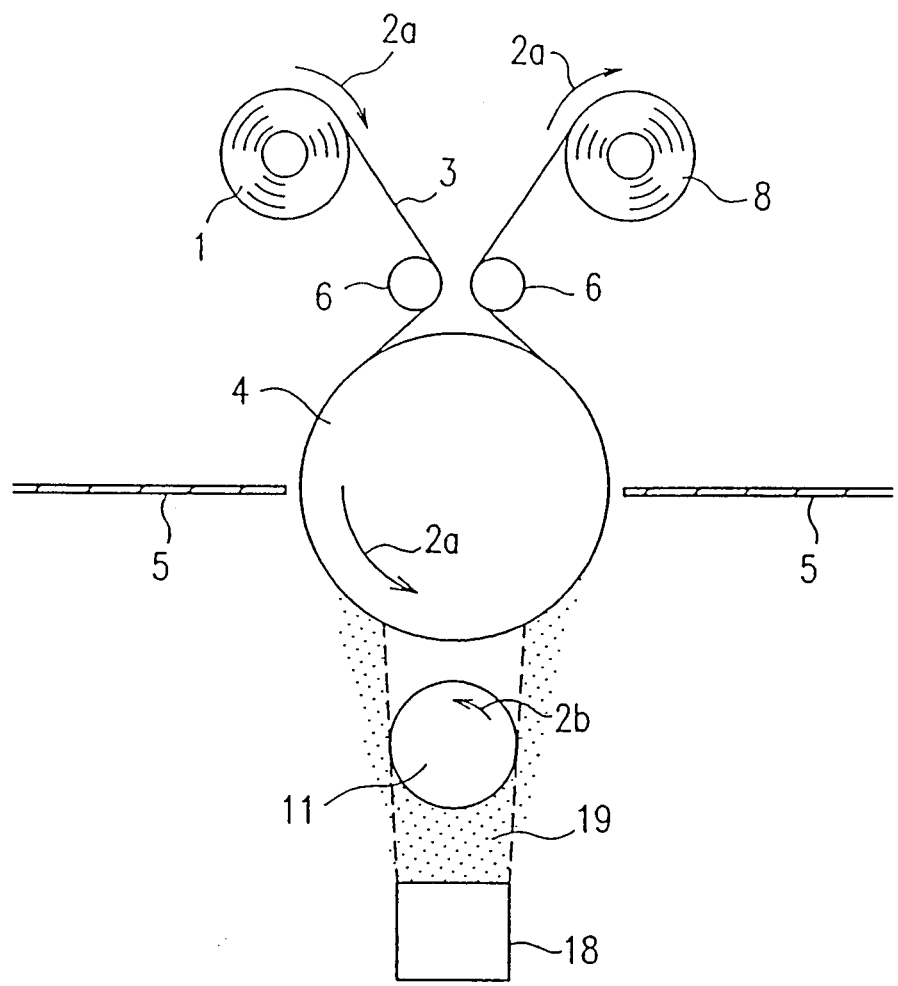
FIG. 7 is a schematic view showing one positional relationship of a first supplying device and a heated roller in a thin film formation apparatus according to the first aspect of the present invention.

The positional relationship among a first supplying device, a heated roller and a region of the base substrate where the resin thin film is to be deposited were studied. In the case of Examples 1 through 4, as shown in FIG. 7, primary particles 19 of the deposition material generated by a first supplying device 18 are also applied (splashed) outside of a space enclosed by broken lines extending from the ends of the first supplying device to the ends of the heated roller 11. In other words, the primary particles generated by the first supplying device 18 reach the deposition surface. As a result, the anomalous particles included in the primary particles reach the deposition surface, thereby deteriorating the quality of the resultant resin thin film.

Figure 8:
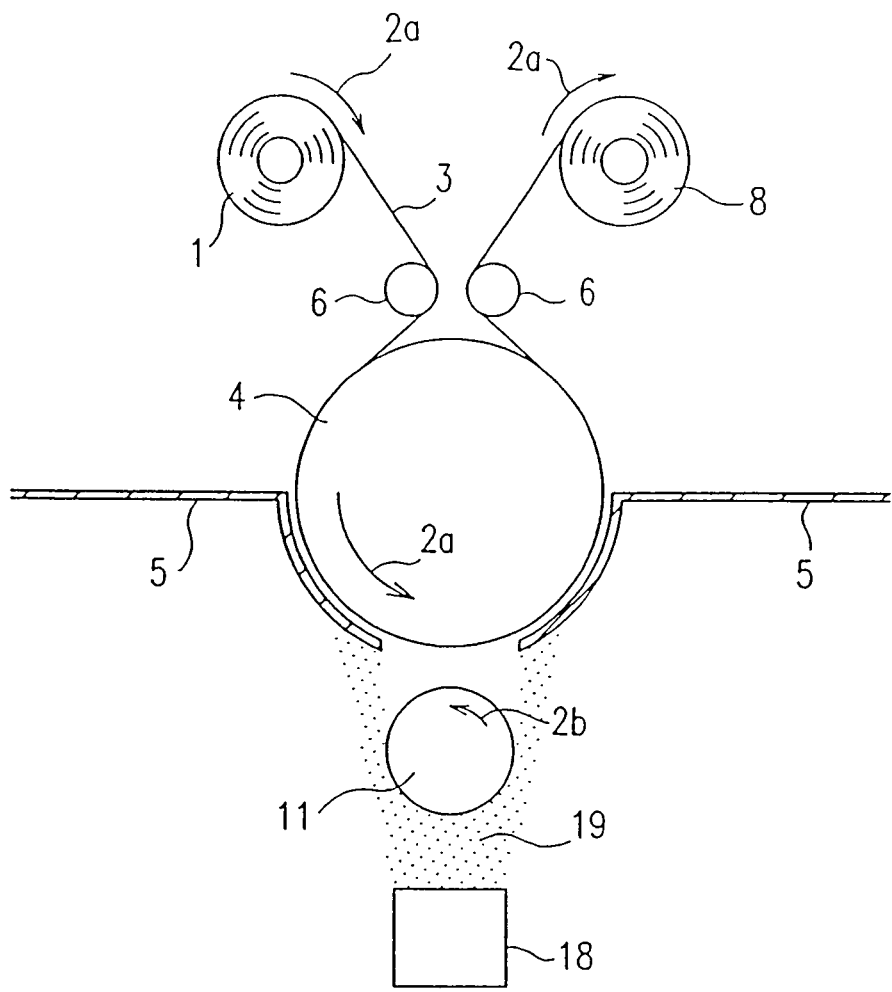
FIG. 8 is a schematic view showing another positional relationship of a first supplying device and a heated roller in a thin film formation apparatus according to the first aspect of the present invention.

According to Examples 6 through 9, shielding plates 5 are provided as shown in FIG. 8 so as to restrain the primary particles 19 of the deposition material from directly reaching the deposition surface. The direct path of the applied deposition material (i.e., primary particles) from the first supplying device to the region defined by the opening between the shielding plates 5 is blocked by the heated roller 11. Examples 6 through 9 employ substantially the same apparatus as the thin film formation apparatuses 100 through 400 according to Examples 1 through 4, respectively, with the shielding plates 5. Resin thin films were produced according to each of Examples 6 through 9 in the same manner as Examples 1 through 4, respectively. The obtained resin thin films were evaluated as described above. The results are shown in Table 2.

TABLE 2

Results of the Evaluation of the Resin Thin Films (Examples 6-9)

| | Thickness 0.1 μm | | | Thickness 0.8 μm | | |
| --- | --- | --- | --- | --- | --- | --- |
| | Number of anomalous particles | Maximum particle size (μm) | Resistance (Ω) | Number of anomalous particles | Maximum particle size (μm) | Resistance (Ω) |
| Example 6 | 2 | 4 | $2 \times 10^9$ | 10 | 4 | $5 \times 10^{11}$ |
| Example 7 | 2 | 5 | $5 \times 10^8$ | 12 | 6 | $2 \times 10^{11}$ |
| Example 8 | 4 | 8 | $5 \times 10^7$ | 28 | 11 | $2 \times 10^9$ |
| Example 9 | 3 | 6 | $1 \times 10^8$ | 25 | 10 | $5 \times 10^9$ |

Examples 6 through 9 exhibited further enhanced results when compared with those obtained in Examples 1 through 4. It can be understood that by completely shielding the pathway of the deposition material extending from the first supplying device to the region where the resin thin film is to be formed, the number of the anomalous particles contained in the obtained region thin film is further reduced. Furthermore, the resistance values are also improved by approximately 2 digits, which suggests that a smaller number of defects result in a resin thin film with a higher insulation characteristic. Most of the anomalous particles resulted from the deposition material (primary particles) generated by the first supplying device which have directly been deposited on the base substrate.

Thus, although the methods described in Examples 6 through 9 have lower production efficiency (i.e., lower material usage efficiency and a lower film formation rate) compared to the methods described in Examples 1 through 4, they are superior in producing resin thin films with higher qualities.

Figure 9:
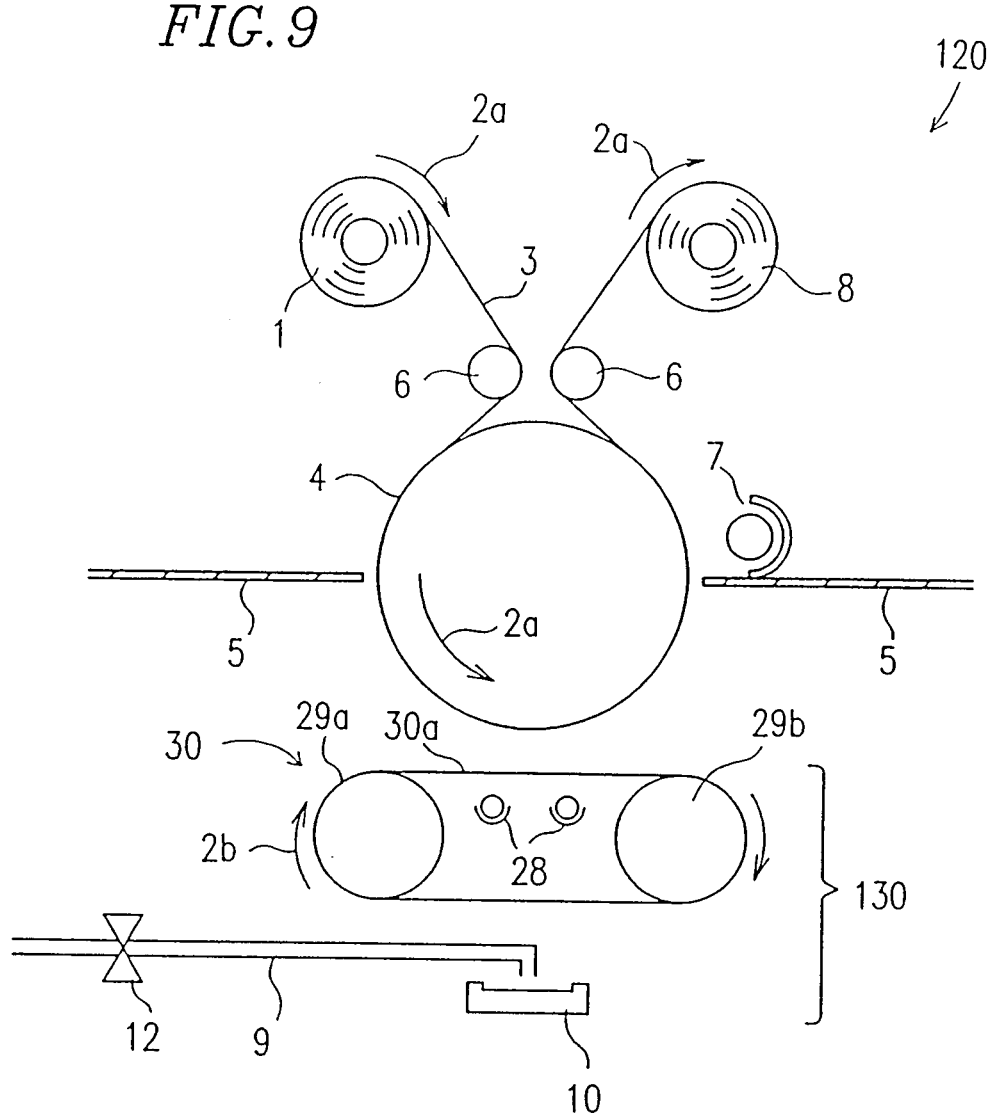
FIG. 9 is a schematic view showing another example of a thin film formation apparatus for forming a thin film according to the first aspect of the present invention.

Although a heated roller is used in the above-described examples for heating, vaporizing and carrying the deposition material, the heated roller may be replaced by other heated device. For example, as shown in FIG. 9 (a thin film formation apparatus 120), the heated roller 11 of the deposition material supplying section 110 in Example 1 can be replaced with a heated belt 30.

A deposition material supplying section 130 of the thin film formation apparatus 120 includes a ultrasonic oscillator 10 and the heated belt 30. The heated belt 30 includes a belt 30a, driving rollers 29a and 29b and heating lamps 28. The belt 30a is rotated by the driving rollers 29a and 29b.

A deposition material in the form of a liquid is delivered to the ultrasonic oscillator 10, which is delivered from a liquid delivery tube 9, is atomized by the ultrasonic oscillator 10 and applied to the surface of the belt 30a. The deposition material on the surface of the belt 30a is moved to a position where it faces the deposition surface of an Al deposition film 3 in accordance with the rotational movement of the belt 30a (shown by the arrows 2b). The region of the belt 30a where it faces the deposition surface is heated to a desired temperature by the heating lamp 28, whereby the deposition material is vaporized again so as to be deposited onto the surface of the Al deposition film 3. Since primary particles of the deposition material generated by the ultrasonic oscillator 10 (i.e., the first supplying device) are prevented from reaching the deposition surface of the film, the same effect as that obtained in Example 1 is obtained.

By using the heated belt 30, size reduction of the equipment and enhanced usage efficiency of the primary particles can be achieved. Moreover, when the driving roller 29b is cooled, the deposition material is prevented from vaporizing from the region of the surface of the belt 30a on the side of the first supplying device, thereby further enhancing the usage efficiency of the primary particles.

Furthermore, although only the resin thin films having thicknesses of about 0.1 μm and about 0.8 μm are described in the above-described examples, resin thin films having a thickness in a range of about 0.05 μm to about 3 μm were confirmed to have similar characteristics. Although only 3 types of acrylic resin were used in the above-described examples, the present invention is widely applicable to the case where other types of acrylic resin or a resin other than an acrylic is used. The curing is not limited to curing with UV light or electron beam irradiation, for example, curing with heat may be also employed.

The method for producing the resin thin film according to the present invention is not limited by the pressure or the gas of the atmosphere. In order to accelerate the evaporation rate of the deposition material so as to enhance the film formation rate, vacuum atmosphere is preferably employed. Additionally, when the evaporation rate of the deposition material is accelerated under a vacuum atmosphere, the deposition material can be maintained at a low temperature, thereby preventing the deposition material on the heated portion of the belt 30a from being cured or adhering to the belt 30a. This effect is particularly prominent when the material does not exhibit a high vapor pressure unless it comes into the vicinity of the heated portion of the belt 30a. A vacuum atmosphere has other advantages such as it is more stable for UV curing, it is easier to introduce electric beam curing and is capable of producing a composite laminate film when combined with a later-described method and apparatus for producing a thin film. Alternatively, instead of vacuum atmosphere, the UV light curing may also be conducted in a stable manner in inert gas atmosphere.

When a region where the deposition material is to be deposited and a region where the deposition material is to be cured are separated from each other, the pressure and the atmosphere at each region can be independently controlled. Moreover, depending on the resin material, heat curing in the atmosphere (i.e., atmosphere in the air) can be performed.

An Al deposition film 3 is used as the base substrate of the resin thin film in Examples 1 through 9. However, the present invention is not limited thereto. A film such as a polymer film and a metal film, a substrate made of metal, glass, a semiconductor, etc. can be also used as the base substrate. The shape of the base substrate is not limited and may be altered, for example, to a flat-plate-like substrate or a curved-shaped substrate. Also, the method of running the base substrate may appropriately changed in accordance with the material and application of the thin film. For example, resin thin films can be repeatedly formed on a film rolled on a can.

The angle (the incident angle) for the deposition material to be deposited on the deposition surface of the substrate is not limited to those in the above-described examples. The positions of the deposition material supplying section and the deposition surface of the substrate may be suitably chosen so as to optimize the incident angle.

[Method and Apparatus for Producing Lamination Thin Film]

Hereinafter, methods and apparatuses for producing laminated films (composite films), realized by modifying the above-described examples will be described.

Figure 10:
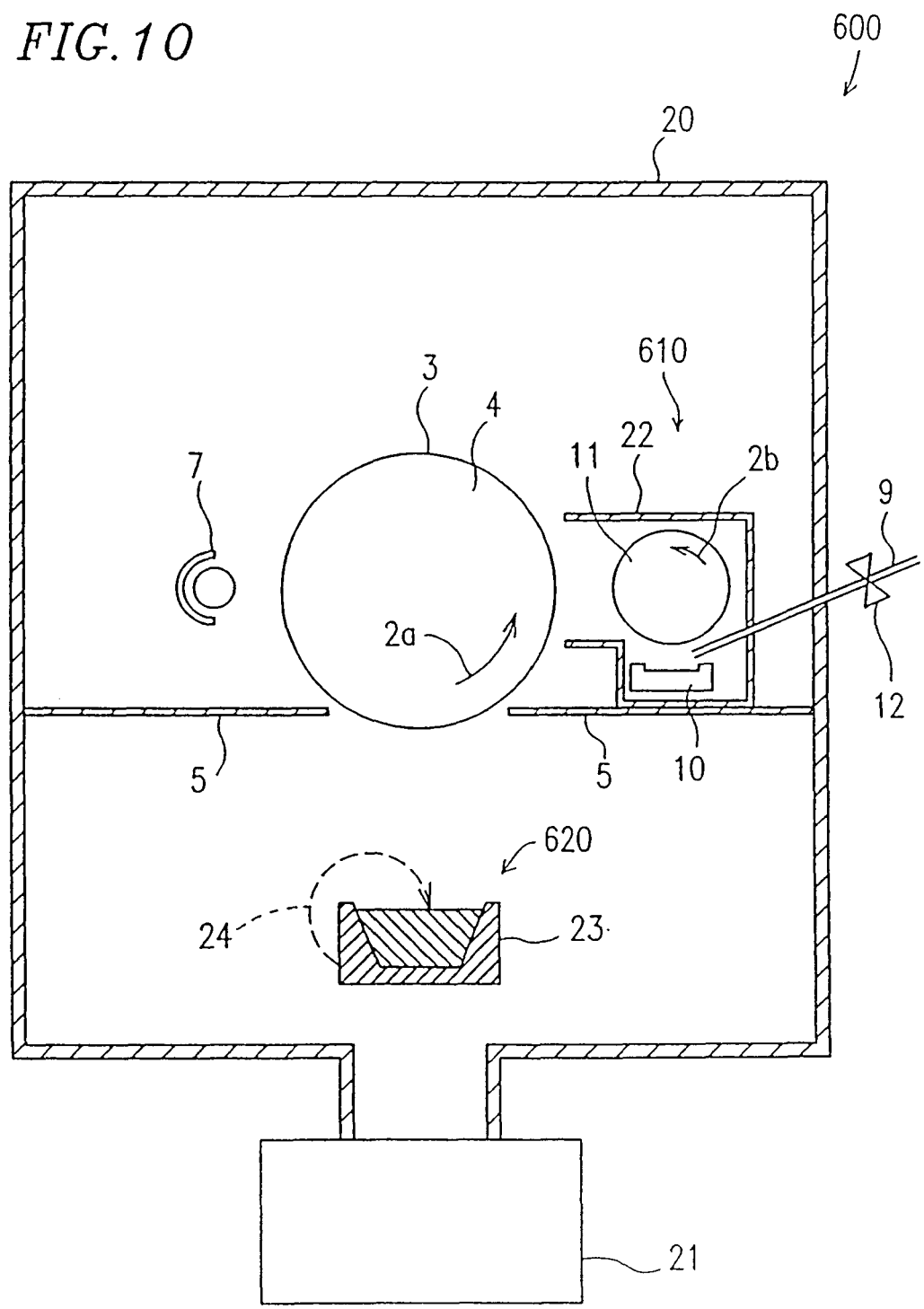
FIG. 10 is a schematic view showing another example of a thin film formation apparatus for forming a thin film according to the first aspect of the present invention.

FIG. 10 is a schematic view showing a thin film formation apparatus 600. The thin film formation apparatus 600 includes a resin thin film depositing section 610 and a metal thin film depositing section 620 in a vacuum chamber 20 so as to produce a laminate film including alternately laminated resin thin films and metal thin films. The vacuum chamber 20 is maintained in a vacuum state by a vacuum system 21.

The resin thin film depositing section 610 basically has the same structure as the deposition material supplying section 110 according to Example 1. The resin thin film depositing section 610 is isolated by differential pressure walls 22 in the vacuum chamber 20. A deposition material supplied from the resin thin film depositing section 610 is deposited on a deposition surface of a film 3 placed along the peripheral surface of a can 4. The deposition material deposited on the film 3 is cured by UV light from the UV light radiation device 7 so as to form a resin thin film. On the other hand, the metal thin film depositing section 620 supplies metal vapor on the deposition surface of the film 3 by radiating an electron beam 24 to a metal material in an electron beam deposition source 23, thereby forming a metal thin film. By repeating the above-described processes, a composite film including alternately laminated resin thin films and metal thin films can be formed. In the case of repeated lamination, the laminate film can be formed on the can 4 directly or on an underlying layer. The laminated film can be peeled off from the can 4 after the lamination process.

Figure 11:
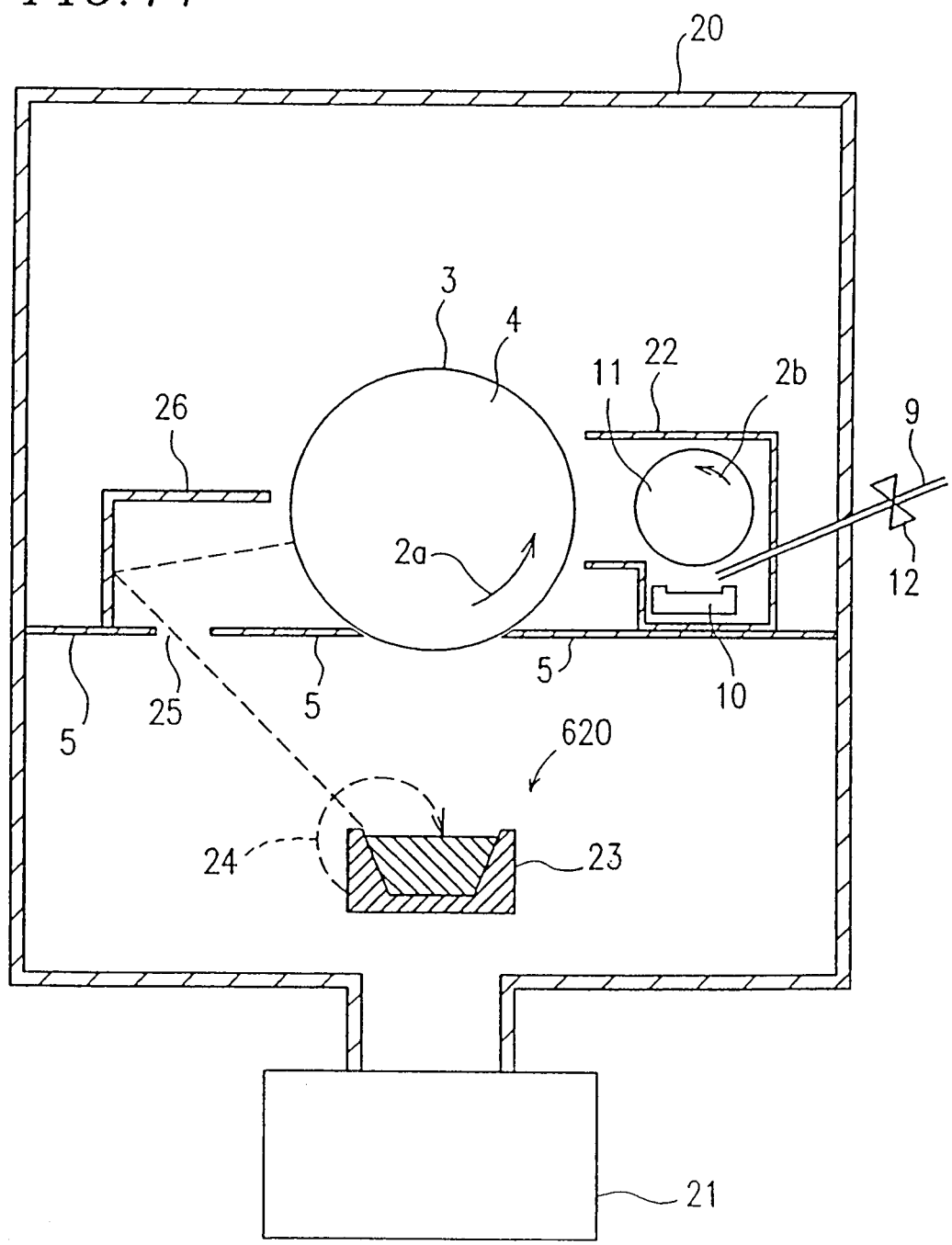
FIG. 11 is a schematic view showing another example of a thin film formation apparatus for forming a thin film according to the first aspect of the present invention.

When an electron beam is used for curing the resin thin film, for example, by using the structure shown in FIG. 11, the UV light radiation device 7 of the thin film formation apparatus 600 can be omitted. The deposition material deposited on the film 3 can be cured by reflecting part of the electron beam 24 generated by the metal thin film depositing section 620 incident to an opening provided through the shielding plate 5 to be reflected off a water-cooled plate 26.

Figure 12:
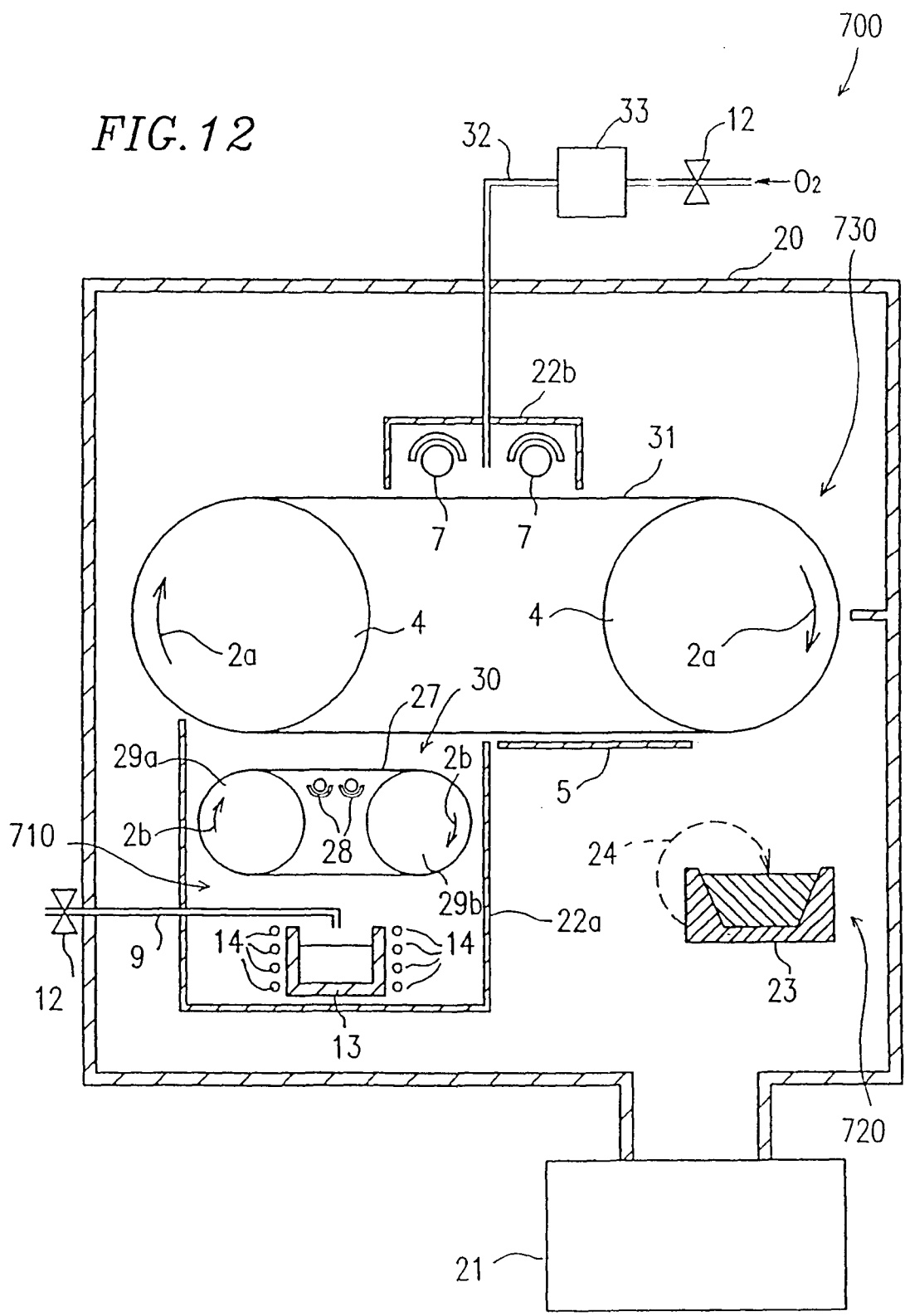
FIG. 12 is a schematic view showing another example of a thin film formation apparatus for forming a thin film according to the first aspect of the present invention.

FIG. 12 is a schematic view showing a thin film formation apparatus 700. The thin film formation apparatus 700 includes a resin thin film depositing section 710 and a metal thin film depositing section 720 in a vacuum chamber 20. Belt mechanisms are used for the resin thin film deposition section 710 and a base substrate running section 730, respectively. The resin thin film depositing section 710 and the metal thin film depositing section 720 are located in different pressure zones by using a differential plate 22a and a belt 31 of the base substrate running section 730. The belt 31 can be made of a stainless thin plate, a polymer film band, etc.

Furthermore, a differential plate 22b is provided around the UV light radiation device 7 so that atmosphere in the region where the UV light is radiated on the deposited material can be independently controlled. In this example, oxygen is introduced from the oxygen inlet tube 32 so as to control the concentration of oxygen in the atmosphere during the UV light curing. The concentration of oxygen can be adjusted by a flow regulating device 33 on the oxygen inlet tube 32. By employing such a structure, the degree of curing of a resin thin film made of materials that are restrained from curing when oxygen is present (e.g., acrylic type material) can be controlled. For example, the degree of curing can be held to a minimum (i.e., an incompletely cured state) at the time of the deposition of the resin thin film and heat curing can be performed to cure the laminated thin film once it is flat. By forming the laminate film in such a manner, deformation (e.g., warping) or the like occurring during the resin thin film formation can be readily corrected. Moreover, the degree of curing can be changed in the thickness direction (i.e., the laminated direction) of the laminate film so that the laminated film can be subjected to the subsequent step in a state such that only the resin in the vicinity of the upper and the lower surface are cured in order to withstand later handling and the middle portion in the thickness direction has a low degree of curing.

Laminate films formed by the above-described thin film formation apparatus are widely applicable in various fields. For example, a laminate film of alternating metal thin films such as Al or Cu and a resin thin film with an excellent insulation characteristic can be used as a conductor having a small loss at high frequency. Furthermore, a capacitor can be formed by alternately providing leading electrodes in the above-described structure. These will be described in detail below.

Example 10

Figure 13:
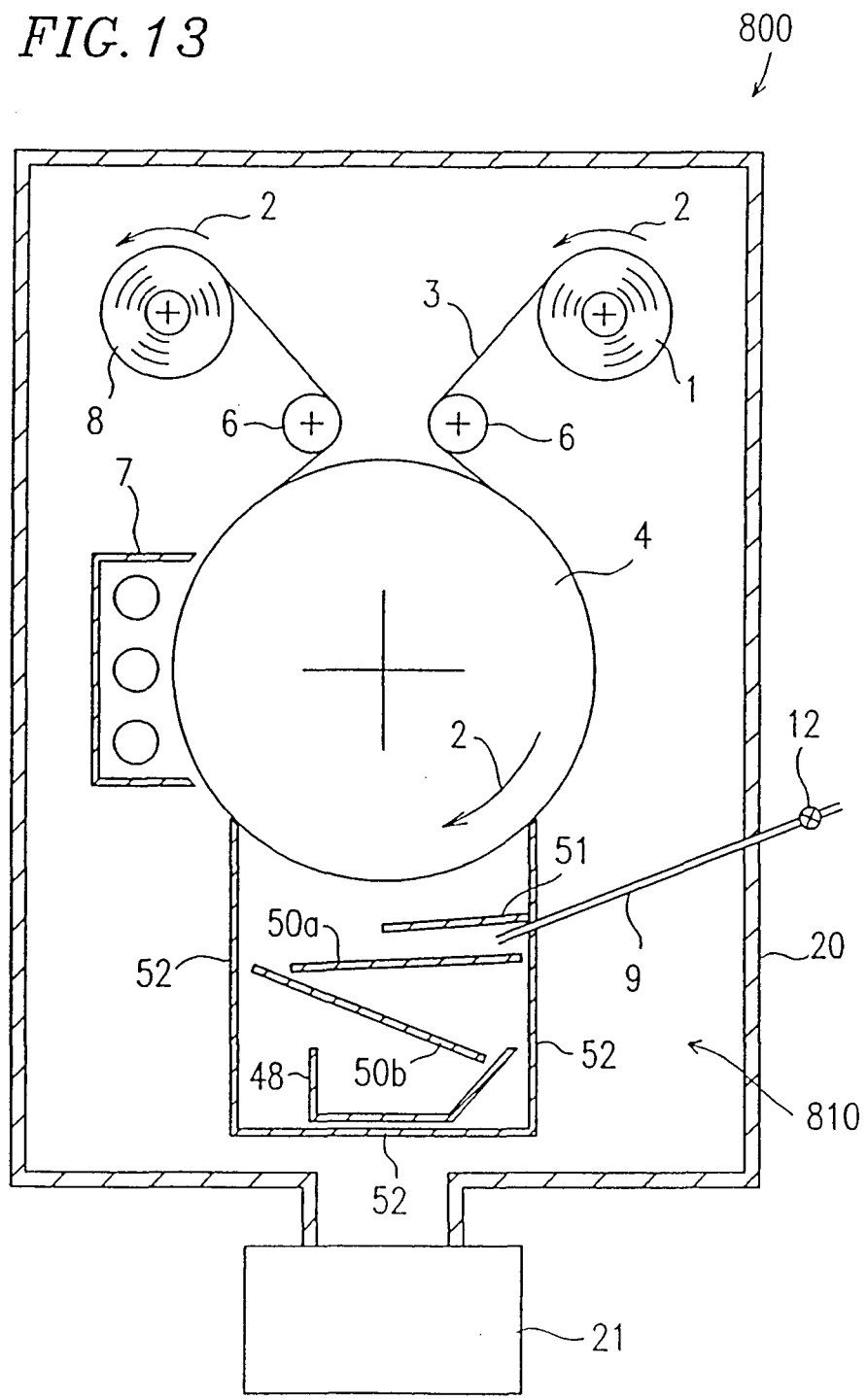
FIG. 13 is a schematic view showing another example of a thin film formation apparatus for forming a thin film according to the first aspect of the present invention.

FIG. 13 is a schematic view showing a thin film formation apparatus 800 according to Example 10 of the present invention. The thin film formation apparatus 800 has a vacuum chamber 20 which includes a deposition material supplying section 810, a substrate running section and a UV radiation device 7. The deposition material supplying section 810 is surrounded by walls 52 so as to avoid an excessive decrease in the vacuum of the vacuum chamber 20. The thin film formation apparatus 800 is different from the thin film formation apparatuses according to Examples 1 through 9 in that the deposition material supplying section 810 is different from those of the apparatuses according to Examples 1 to 9. Components having substantially the same functions as those in the above-described examples are denoted by the same reference numerals.

The deposition material supplying section 810 includes a first tilted heated plate 50*a*, a second tilted heated plate 50*b*, a obstruction wall 51 and a liquid delivery tube 9. A liquid deposition material is delivered to the first tilted heated plate 50*a* from the liquid delivery tube 9 and starts to run down along the slope. While running down, the deposition material spreads out as a thin liquid layer and partially vaporizes. The deposition material may generate coarse particles upon contact with the first heated plate 50*a* due to excessive temperature rise in the deposition material (for example, due to the bumping phenomenon). In order to prevent these coarse particles from directly reaching the deposition surface, the obstruction wall 51 is provided between a portion of the first heated plate 50*a* where the deposition material initially makes contact with the first heated plate 50*a* and the deposition surface. Once reaching the end of the first heated plate 50*a*, the deposition material drops down to the second heated plate 50*b* and continues to run down and vaporize on the surface.

By using a plurality of heated plate 50*a* and 50*b*, a relatively large vaporization area can be obtained within a small space, the vaporization rate can be enhanced and at the same time the variation in the vaporization rate can be controlled. Furthermore, the temperature of the plurality of heated plates can be individually set so as to realize an optimal distribution of the rise in temperature.

Once reaching the end of the second heated plate 50*b*, the deposition material drops down to the cup 48. The cup 48 may be heated to further evaporate the deposition material in the cup 48. As shown in FIG. 13, an inner wall of the cup 48 may be inclined so as to provide a wider evaporation area for the deposition material and prevent the deposition material from being cured in the cup 48. Preferably, the walls 52 and the obstruction wall 51 are also heated so that droplets, i.e., the deposition material, on the walls 52 and the obstruction wall 51 can be re-evaporated and removed therefrom. By adjusting the amount of deposition material delivered from the liquid delivery tube 9 and the amount of deposition material evaporated from the heated plates 50*a* and 50*b*, the full amount of deposition material can be completely evaporated by the time the deposition material reaches the end of the second heated plate 50*b*. In such a case, the cup 48 can be omitted. The amount of the deposition material evaporated from the heated plates 50*a* and 50*b* can be adjusted, for example, by adjusting the areas, tilt angles and the temperature of the heated plates 50*a* and 50*b*. Additionally, the deposition material can be collected in a cooled cup 48 so as to be reused.

Example 11

Figure 14:
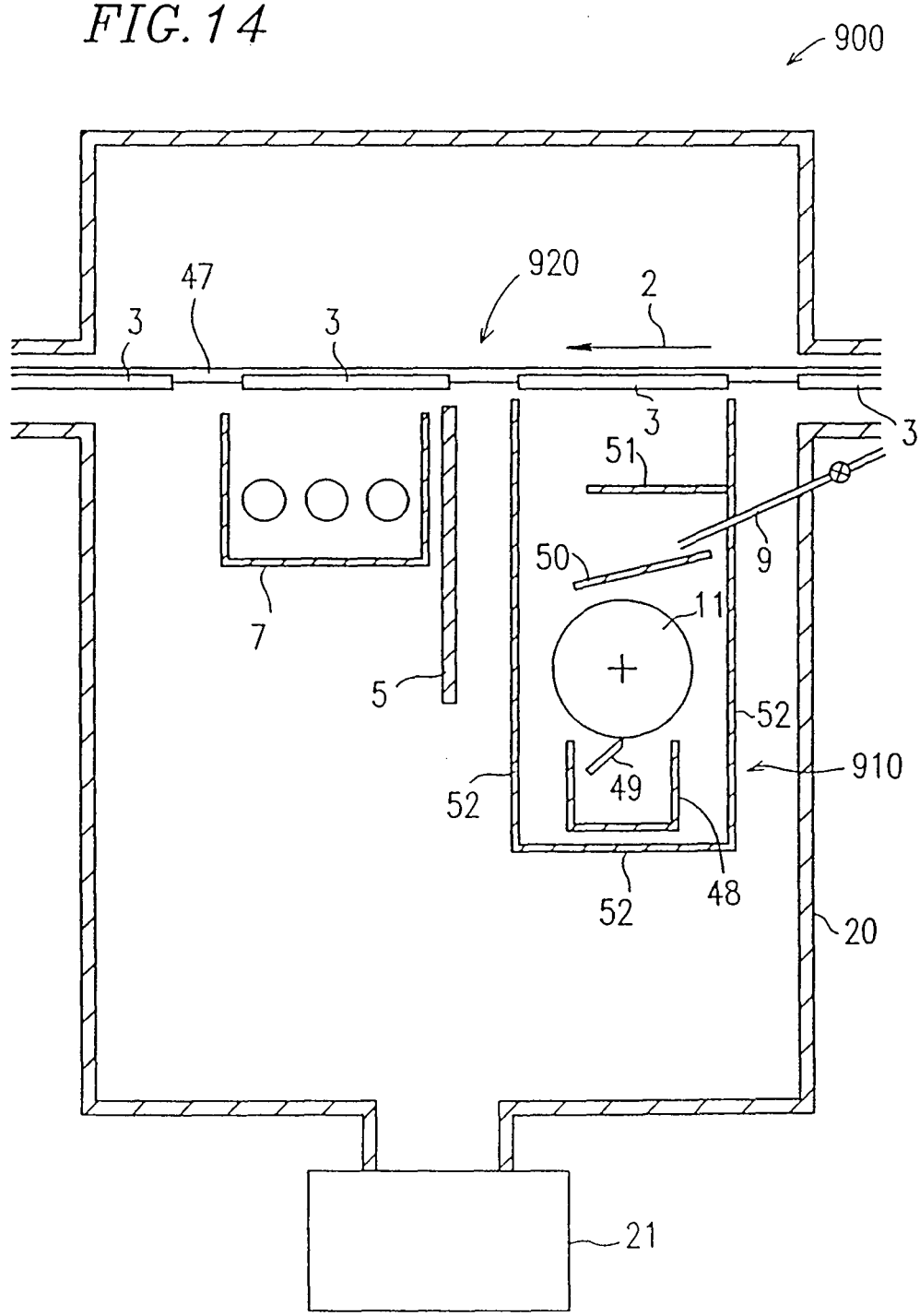
FIG. 14 is a schematic view showing another example of a thin film formation apparatus for forming a thin film according to the first aspect of the present invention.

FIG. 14 is a schematic view showing a thin film formation apparatus 900 according to Example 11. The thin film formation apparatus 900 has a vacuum chamber 20 which includes a deposition material supplying section 910, a substrate running section 920 and a UV radiation device 7. A depositing section and a curing section are partitioned by a shielding plate 5.

The substrate running section 920 is different from the substrate running section according to Example 10 in that it carries individual plate-like base substrates 3. The substrate running section 920 includes a carrier 47 which carries and continuously runs the plurality of base substrates 3 in a direction represented by an arrow 2. It can be appreciated that the substrate running section 920 and the above-described substrate running section according to Example 10 are replaceable with each other. This replacement equally applies to the later-described examples.

The deposition material supplying section 910 differs from the deposition material supplying section 810 according to Example 10 in having a heated roller 11. A liquid deposition material is delivered from the liquid delivery tube 9 to a first tilted heated plate 50 and starts to run down along the slope. While running down, the deposition material spreads out as a thin liquid layer and partially vaporizes. The deposition material may form coarse particles upon contact with the first heated plate 50 due to excessive temperature rise (for example, due to bumping phenomenon). In order to prevent these coarse particles from directly reaching the deposition surface, the obstruction wall 51 is provided between a portion of the first heated plate 50 where the deposition material makes initial contact and the deposition surface. Once reaching the end of the first heated plate 50, the deposition material drops down to the heated roller 11 and continues to run down and vaporize on the surface thereof.

The heated roller 11 provides greater area and time for the deposition material to evaporate compared to the second heated plate 50b according to Example 10. Thus, even when the size of the apparatus is reduced, the evaporation state is still stable. When the deposition material on the heated roller 11 exceeds the capacity of the heated roller 11, the excess amount of the deposition material drops down from the lowermost portion of the heated roller 11 or is swept by a blade 49, etc. into a cup 48. According to Example 11, the cup 48 is heated for re-evaporation, the cup 48 can be cooled to collect and reuse the deposition material.

Example 12

Figure 15:
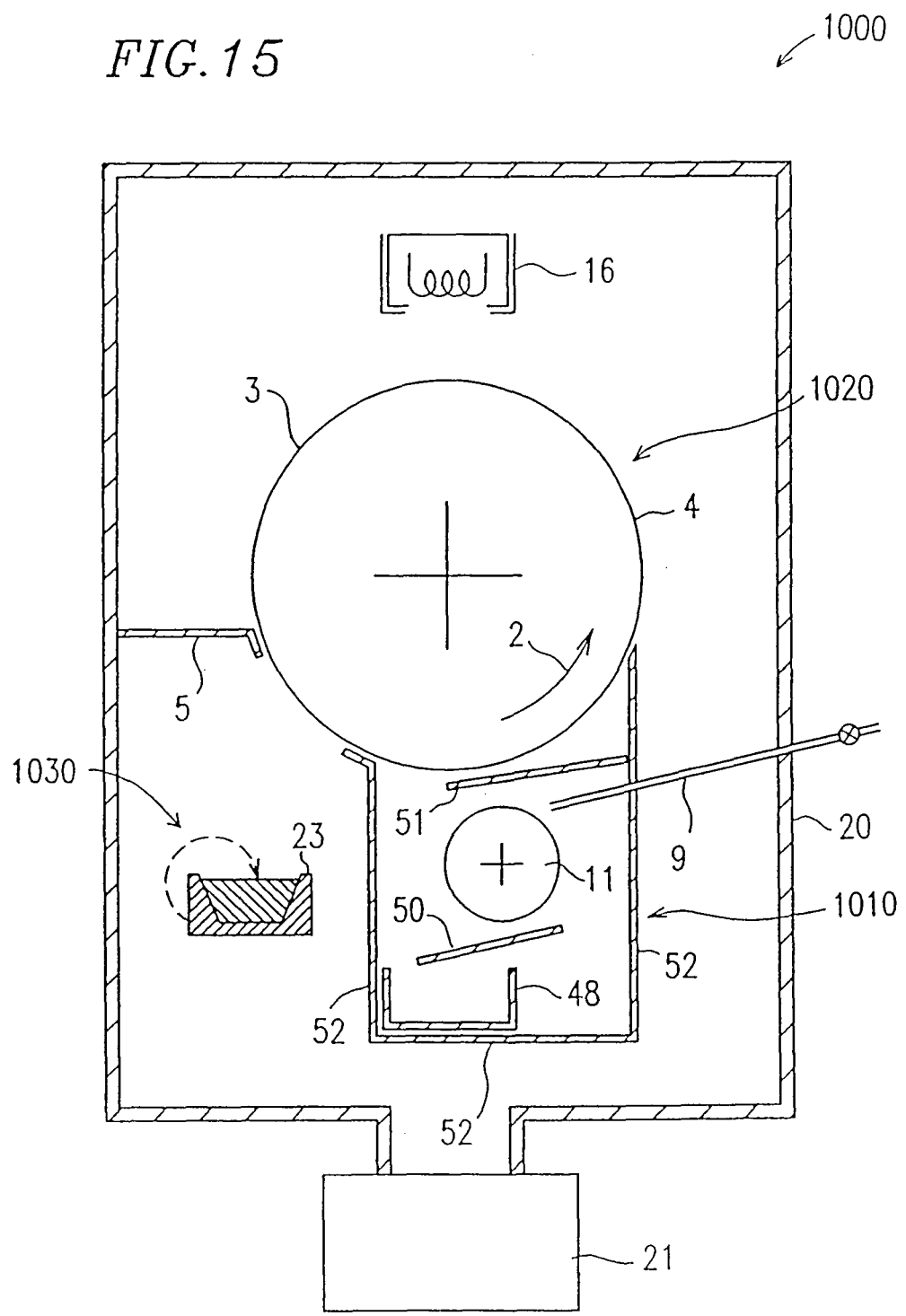
FIG. 15 is a schematic view showing another example of a thin film formation apparatus for forming a thin film according to the first aspect of the present invention.

FIG. 15 is a schematic view showing a thin film formation apparatus 1000 according to Example 12. The thin film formation apparatus 1000 has a vacuum chamber 20 which includes a deposition material supplying section (also referred to as a "resin thin film depositing section") 1010, a substrate running section 1020 and an electron beam radiation device 16. A metal thin film deposition section 1030 with an electron beam deposition source 23 is partitioned from a curing region by a shielding plate 5. The deposition material supplying section 1010 is surrounded by walls 52 so as to avoid an excessive decrease in the vacuum of the vacuum chamber 20.

The thin film formation apparatus 1000 according to Example 12 maintains a substrate 3 around a rotating cylindrical can 4 to form a laminate film including a plurality of metal thin film layers and resin thin film layers.

The deposition material supplying section 1010 according to Example 12 differs from the deposition material supplying section 910 according to Example 11 in that the liquid deposition material from the liquid delivery tube 9 is delivered directly onto the heated roller 11. The deposition material may generate coarse particles upon contact with the heated roller 11 due to excessive temperature rise. In order to prevent these coarse particles from directly reaching the deposition surface of the substrate, an obstruction wall 51 is provided between a portion of the heated roller 11 where the deposition material makes initial contact and the deposition surface. The deposition material on the rotating heated roller 11 continues to flow thereon until evaporation. The heated roller 11 provides greater area and time for the deposition material to evaporate. Thus, even when the size of the apparatus is reduced, the evaporation state is still stable. When the deposition material on the heated roller 11 exceeds the capacity of the heated roller 11, the excess amount of deposition material drops down from the lowermost portion of the heated roller 11 or is swept by a blade (not shown), etc. into a cup 48. The deposition material in the cup 48 can be heated for re-evaporation or cooled to be collected. In Example 12, the cup 48 is cooled.

According to Example 12, the liquid deposition material is introduced on the upper portion (i.e., surface facing the deposition surface of the substrate 3) of the heated roller 11. Alternatively, the liquid deposition material can be introduced to the lower portion of the heated roller 11 (for example, as the deposition material supplying section 510 shown in FIG. 5). In this case, the heated roller 11 will act in place of the obstruction wall 51 and thus the obstruction wall 51 can be omitted.

Example 13

Figure 16:
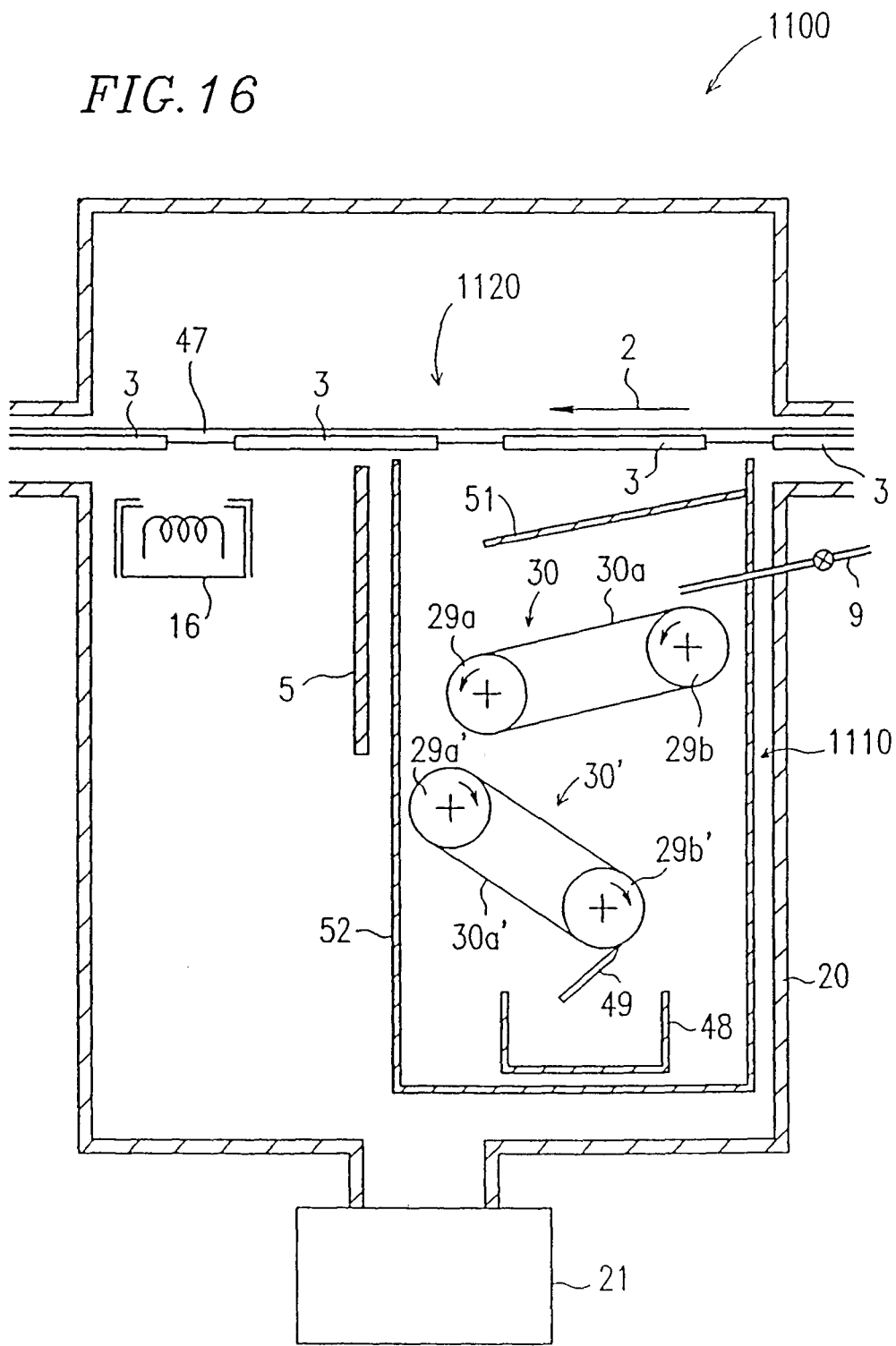
FIG. 16 is a schematic view showing another example of a thin film formation apparatus for forming a thin film according to the first aspect of the present invention.

FIG. 16 is a schematic view showing a thin film formation apparatus 1100 according to Example 13. The thin film formation apparatus 1100 has a vacuum chamber 20 which includes a deposition material supplying section 1110, a substrate running section 1120 and an electron beam radiation device 16. A deposition section is partitioned from a curing section by a shielding plate 5 in the vacuum chamber 20. The deposition material supplying section 1110 is surrounded by walls 52 so as to avoid an excessive decrease in the vacuum of the vacuum chamber 20.

The deposition material supplying section 1110 differs from the deposition material supplying section 910 according to Example 11 that it has two heated belts 30 and 30', and in using the electron beam radiation device 16 for curing. The first (and the second) heated belt 30 (30') include a belt 30a (30a') and driving rollers 29a and 29b (29a' and 29b'). The belt 30 (30') is rotated by the driving rollers 29a and 29b (29a' and 29b').

A liquid deposition material is delivered from the liquid delivery tube 9 to the belt 30a of the first heated belt 30 where it starts to run down along the slope. While running down, the deposition material spreads out as a thin liquid layer and partially vaporizes. The deposition material may generate coarse particles upon contact with the first heated belt 30 due to excessive temperature rise (for example, due to the bumping phenomenon). In order to prevent these coarse particles from directly reaching the deposition surface, an obstruction wall 51 is provided between a portion of the first heated belt 30 where the deposition material makes initial contact and the deposition surface. Once reaching the end of the first heated belt 30, the deposition material drops down to the belt 30a' of the second heated belt 30' and continues to run down and vaporize thereon.

The heated belts 30 and 30' provide greater area and time for the deposition material to evaporate compared to the second heated plate 50b according to Example 10. Thus, even when the size of the apparatus is reduced, the evaporation state is still stable. When the deposition material on the heated belt 30 or 30' exceeds the capacity of the heated belts 30 and 30', the excess amount of deposition material drops down from the lower-most portion of the heated belt 30 or 30' or is swept by a blade 49, etc. into a cup 48. In Example 13, the cup 48 is cooled to collect the deposition material. Alternatively, the cup may be heated for re-evaporation. The walls 52 and the obstruction wall 51 are also heated so that droplets, i.e., the deposition material, on the walls 52 and the obstruction wall 51 can be re-evaporated and removed.

Example 14

Figure 17:
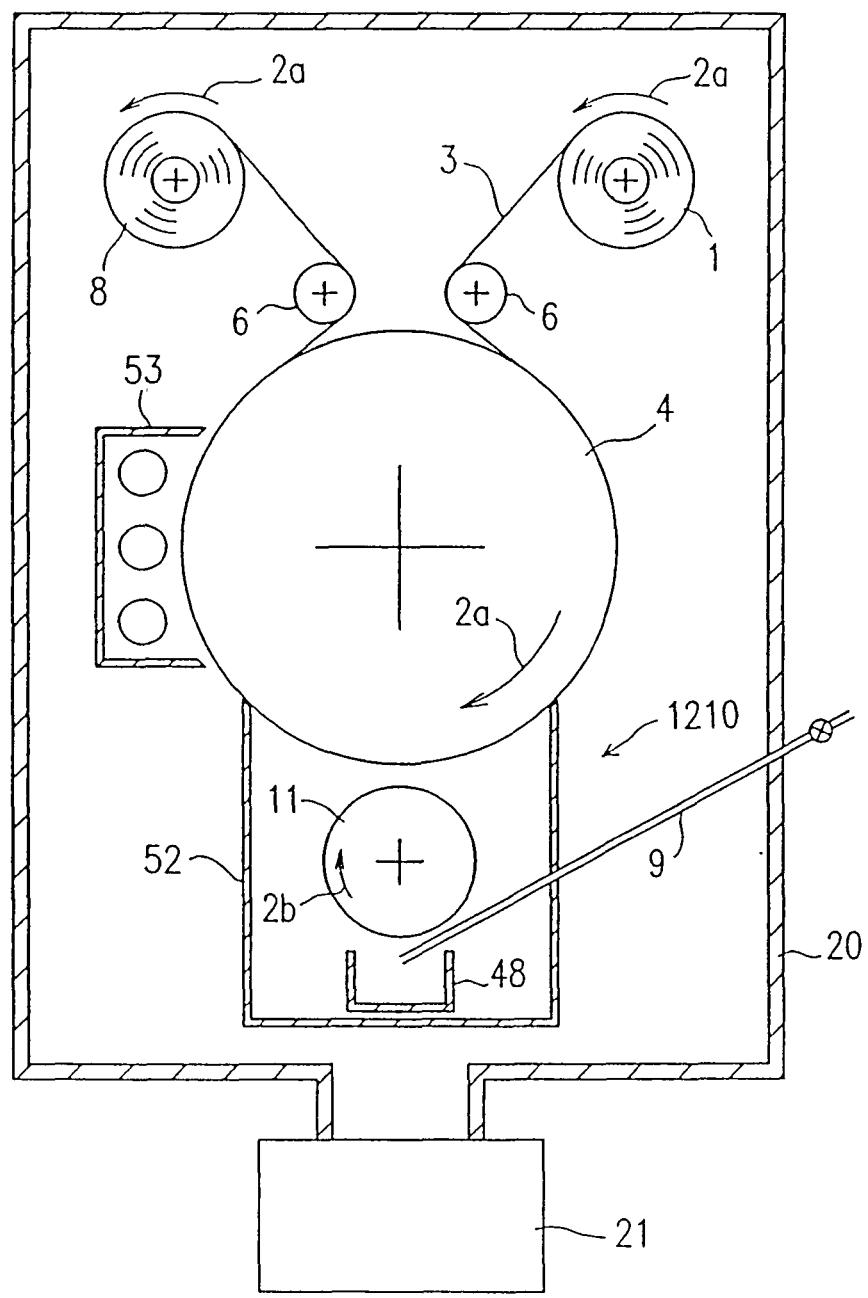
FIG. 17 is a schematic view showing another example of a thin film formation apparatus for forming a thin film according to the first aspect of the present invention.

FIG. 17 is a schematic view showing a thin film formation apparatus 1200 according to Example 14. A deposition material supplying section 1210 differs from the deposition material supplying sections 810 to 1110 according to Examples 10 through 13 in that there is no mechanism for running the liquid deposition material. Detailed description of the deposition material supplying section 1210 is omitted since it has substantially the same structure as the deposition material supplying sections according to Examples 1 to 9.

The deposition material is delivered from a liquid delivery tube 9 into a heated cup 48, thereby being evaporated. The evaporated deposition material, at first, attaches to the heated roller 11 and is carried and heated for evaporation. The deposition material evaporated from the heated cup 48 contains coarse particles. Accordingly, the heated roller 11 is arranged so that the coarse particles are prevented from reaching the deposition surface. As a result, defects caused by the coarse particles can be controlled. However, when the deposition rate (accumulation rate) is set high, the deposition rate is not stable and may cause defects in the thin film.

The relationships between the deposition rate and the surface characteristics of the film (the rate of occurrence of the defects) in Examples 10 through 14 are shown in Table 3. The surface characteristics were observed for an area of 5 cm×5 cm by an optical microscope and the number of the anomalous particles (i.e., the coarse particles) were evaluated. 1,9,-nonanediol diacrylate (#1), dimethylol-tri-cyclodecane diacrylate (#2) and 2-methyl-3-butanenitrile (#3) were used as the deposition materials.

TABLE 3

Film Formation Conditions and Surface Characteristics of the Resin Thin Film (Examples 10-14)

|  | Desired thickness (nm) | Deposition material | Deposition rate (nm/s) | Number of defects (particle/m$^2$) |
| --- | --- | --- | --- | --- |
| Example 10 | 0.5 | #1 | 2000 | 4 |
| Example 11 | 0.2 | #2 | 1000 | 3 |
| Example 12 | 0.1 | #3 | 2500 | 1 |
| Example 13 | 0.3 | #1 | 4000 | 2 |
| Example 14 | 0.5 | #1 | 700 | 5 |
| Example 14 | 0.5 | #1 | 2000 | 30 |
| Example 14 | 0.2 | #2 | 600 | 4 |
| Example 14 | 0.2 | #2 | 1000 | 18 |
| Example 14 | 0.1 | #3 | 500 | 2 |
| Example 14 | 0.1 | #3 | 700 | 4 |
| Example 14 | 0.1 | #3 | 1000 | 14 |
| Example 14 | 0.1 | #3 | 2500 | 30 |

As can be understood from Table 3, the resin thin film according to Example 14 has a smaller number of defects when the deposition rate is low. However, the resin thin film according to Example 14 exhibits sudden increase in the number of defects when the deposition rate exceeds about 1000 nm/s. On the other hand, according to Examples 10 to 13, the number of defects in the produced resin thin film are less even when the deposition rate exceeds 1000 nm/s.

This is due to the following reason. When the amount of the deposition material is increased in order to improve the deposition rate, in the case of Example 14, the area size for evaporation becomes insufficient. Accordingly, the temperature needs to be set higher. Since an increased amount of liquid deposition material supply increases the proportion of a volume to a surface area of the deposition material, bumping is more expected, especially at a higher temperature. It is considered that some of particles resulting from such bumping phenomenon attach to the deposition surface, thereby generating the above-described defects seen in the case of Example 14 at a high deposition rate. Since the particles resulting from the bumping phenomenon tend to jump in a linear manner, an obstruction wall can be provided such that the support body and the supplied liquid deposition material cannot be exposed to each other. Although such a method restrains a considerable amount of the particles caused by the bumping phenomenon from attaching to the support body, some particles still attach to the support body by being reflected upon collision. Moreover, when the temperature rises, the deposition material is partially cured, thereby deteriorating the stable evaporation rate.

According to Examples 10 to 13, the liquid deposition material spreads out as a thin liquid layer as it runs down and thus the evaporation area can be increased. Accordingly, even when the amount of deposition material is increased, i.e., even when the deposition rate is high, bumping or thermosetting of the deposition material are unlikely to occur. As a result, a resin thin film with fewer defects can be obtained.

According to Example 14, as described above, the resin material is likely to thermoset under a condition of a high deposition rate and thus the evaporation rate of the deposition material tends to vary with time. Accordingly, it is more difficult to select the film formation conditions for the thin film formation apparatus according to Example 14. In the case where the cup 48 is cooled to collect the deposition material as in Examples 12 and 13, although evaporation from the cup 48 cannot be expected, the entire amount of evaporation in the film formation apparatus becomes significantly stable. Accordingly, the cup 48 is preferably cooled when it is required to maintain an even evaporation rate.

According to the methods and apparatuses for forming the thin films of Examples 10 through 13, the deposition material can be efficiently evaporated while controlling the occurrence of thermosetting or bumping as much as possible. According to Examples 10 through 13, a resin thin film can be formed at a higher deposition rate in a stable manner. Therefore, Examples 10 to 13 have higher utility value in industrial fields.

Although an acrylic-type monomer material is used as the deposition material, other resin type material such as epoxy type material or an inorganic material can be used. Moreover, although UV curing or electron beam curing is employed in the above-described examples, the present invention is not limited thereto.

By employing the methods and apparatuses according to the first aspect of the present invention, a resin thin film with fewer defects can be formed. However, closer observation of the surfaces of resin thin films formed by the above-described methods (after curing) revealed that the surfaces turned out to be satin surfaces. It was also found that the surface roughness was greater when a resin material with higher viscosity was used. The observed surface roughness (roughness of several tens to several hundreds nanometers) was smoother than the surface roughness caused by the above-described coarse particles having a diameter of several microns or more (3 μm according to the above-described examples). However, this roughness of several tens to several hundreds nanometers may cause deterioration of the electric resistance of the resin thin film, and thus may not be suitable for some applications.

A second aspect of the present invention provides methods and apparatuses for forming a thin film, which can reduce the above-mentioned surface roughness of about several tens to several hundreds nanometers. According to the second aspect of the present invention, the above-mentioned surface roughness can be controlled by radiating a charged particle beam toward either one or both of a deposition surface of a base substrate and a deposition material at least before the deposition process. This is considered to be effective because the electrostatic energy of the charged particle beam accelerates attachment of the resin particles to the deposition surface and the electrostatic force allows the deposition material to be flattened after the deposition.

Hereinafter, examples according to a second aspect of the present invention will be described in detail. Herein, the second aspect of the present invention will be described as combined with those according to the first aspects of the present invention. However, the present invention is not limited thereto. Effects obtained by the methods according to the second aspect of the present invention can also be obtained even when the methods are used independently. By combining the methods according to the first and the second aspects, multiple effects and a high-quality thin film suitably used as electronic components, etc. can be obtained.

Example 15

Figure 18:
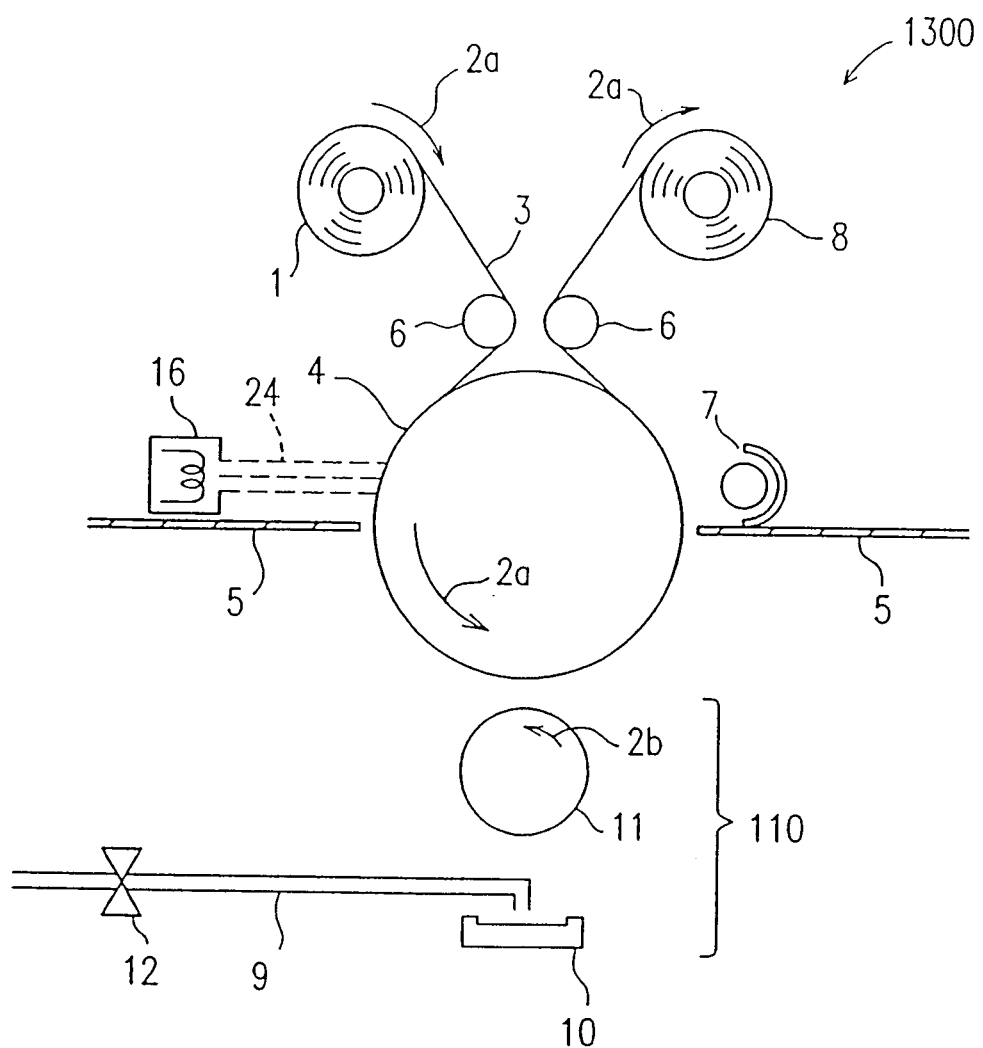
FIG. 18 is a schematic view showing one example of a thin film formation apparatus for forming a thin film according to a second aspect of the present invention.

FIG. 18 is a schematic view showing a thin film formation apparatus 1300 according to Example 15. The thin film formation apparatus 1300 has a structure that is substantially the same as the structure of the thin film formation apparatus 100 according to Example 1 except that an electron beam radiation device 16 is further provided. Accordingly, description of the thin film formation apparatus 1300 other than the electron beam radiation device 16 will be omitted.

Electron beams 24 are radiated onto a deposition surface of the base substrate by the electron beam radiation device 16 before the deposition material is deposited to the deposition surface of the base substrate from a deposition material supplying section 110 and carried along the round surface of a can 4. The resin thin film is formed using the same material and under the same conditions as those of Example 1.

Example 16

Figure 19:
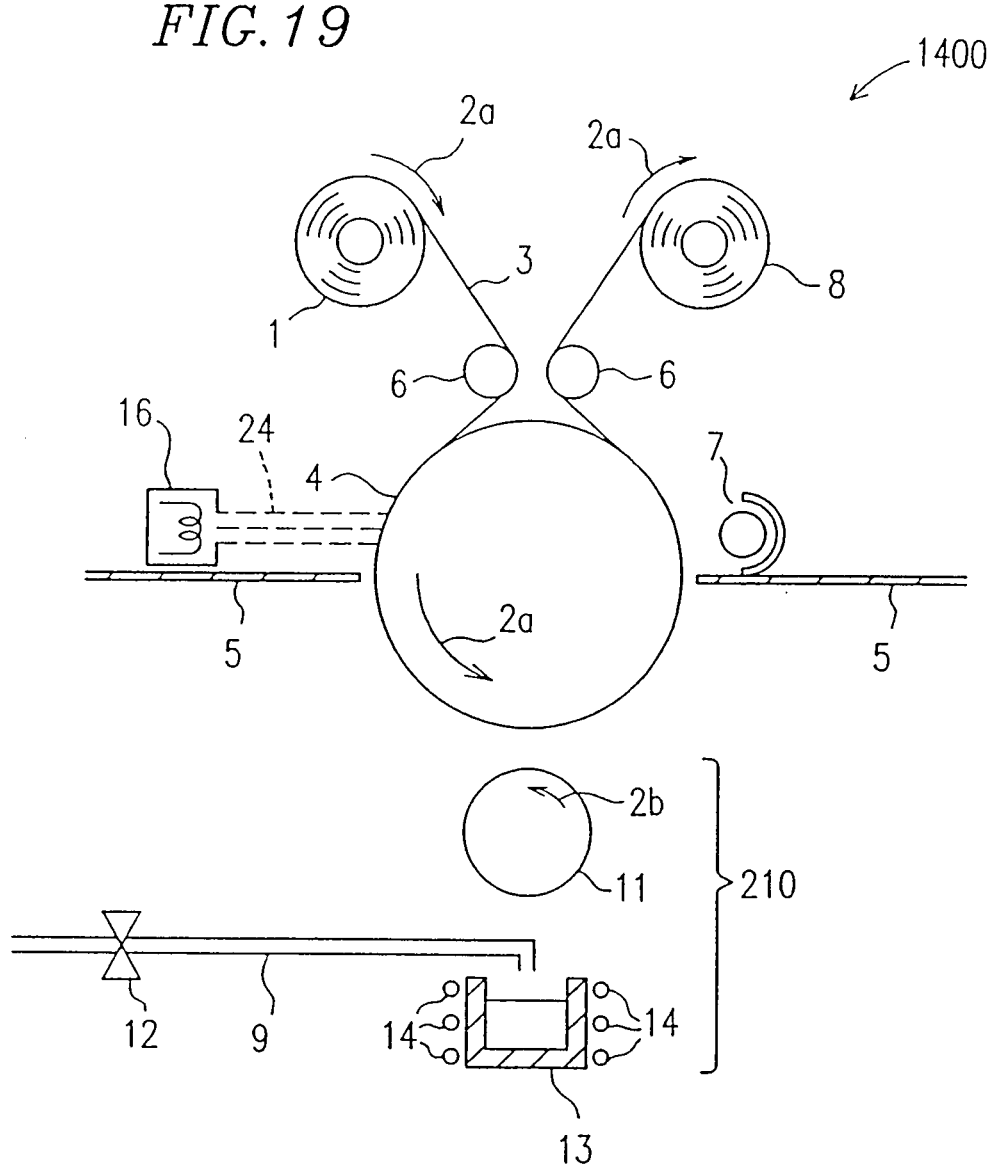
FIG. 19 is a schematic view showing another example of a thin film formation apparatus for forming a thin film according to the second aspect of the present invention.

FIG. 19 is a schematic view showing a thin film formation apparatus 1400 according to Example 16. The thin film formation apparatus 1400 has a structure that is substantially the same as the structure of the thin film formation apparatus 200 according to Example 2 except that an electron beam radiation device 16 is further provided. Accordingly, description of the thin film formation apparatus 1400 other than the electron beam radiation device 16 will be omitted.

An electron beam 24 is radiated on a deposition surface of a base substrate 3 by the electron beam radiation device 16 before the deposition material is deposited onto to the deposition surface of the base substrate 3 from a deposition material supplying section 210 and carried along the round surface of a can 4. The resin thin film is formed using the same material and under the same conditions as those of Example 2.

Example 17

Figure 20:
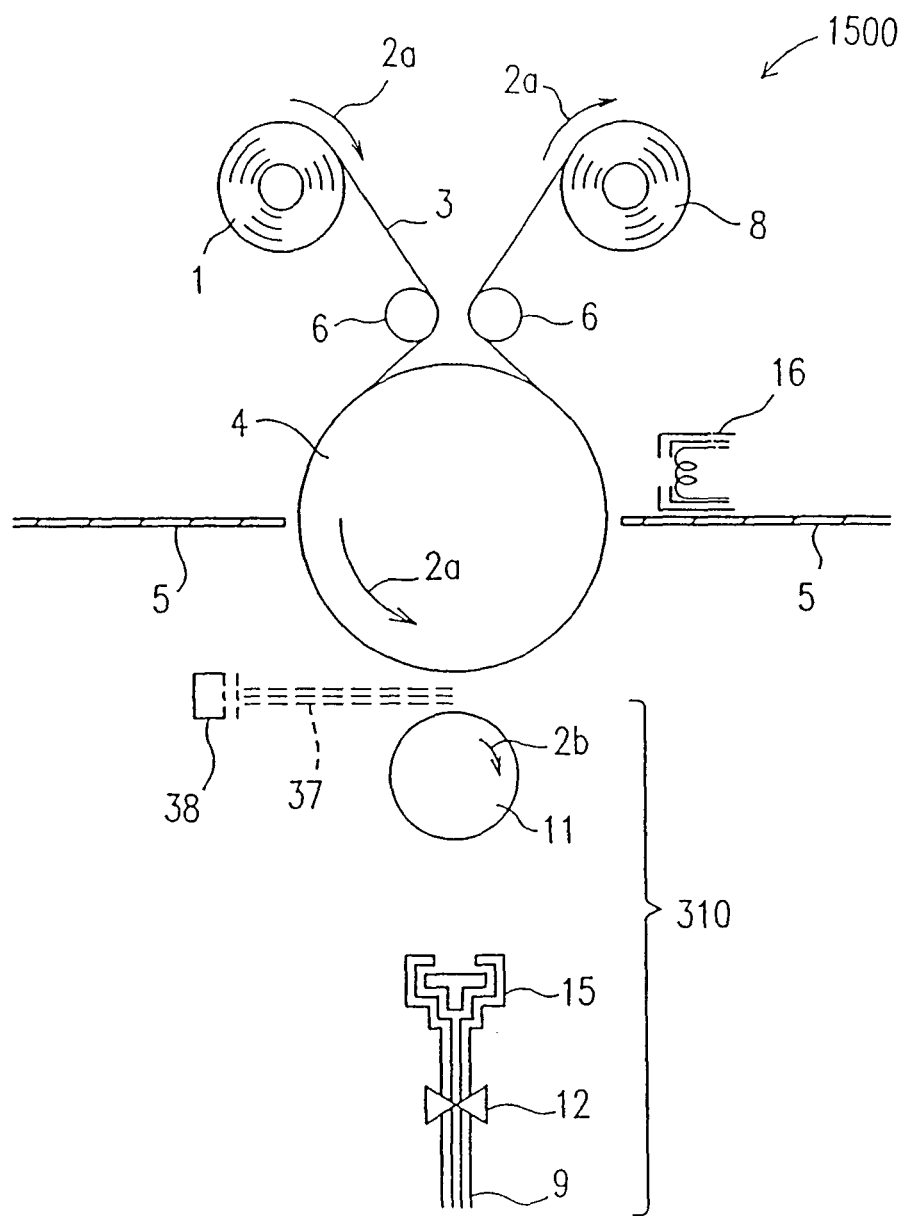
FIG. 20 is a schematic view showing another example of a thin film formation apparatus for forming a thin film according to the second aspect of the present invention.

FIG. 20 is a schematic view showing a thin film formation apparatus 1500 according to Example 17 of the present invention. The thin film formation apparatus 1500 has a structure that is substantially the same as the structure of the thin film formation apparatus 300 according to Example 3 except that an ion radiation device 38 is further provided. Accordingly, description of the thin film formation apparatus 1500 other than the ion radiation device 38 will be omitted.

An ion beam 37 is radiated on the deposition surface of the base substrate 3 by the ion radiation device 38 before the deposition material is supplied to the deposition surface of the base substrate 3 from a deposition material supplying section 310 and carried along the round surface of a can 4. The ion radiation device 38 according to Example 17 is arranged such that the ion beams 37 can radiate toward the atomized deposition material and the deposition surface of the base substrate 3. The resin film is formed using the same material and under the same conditions as those of Example 3.

Resin thin films having a thickness of about 0.1 μm and a thickness of about 0.8 μm were formed according to each of the methods described in Examples 15 through 17 and Examples 1 through 3 as a comparison, while varying the running rate of the Al. deposition film 3. A 5 cm×5 cm area of each of the resin thin films was observed by an optical microscope in order to quantitatively evaluate the surface characteristics thereof by a surface roughness tester (Surfcom produced by Tokyo Seimitsu Co., Ltd.).

An Al layer (1 cm×1 cm) having a thickness of 100 nm was further formed on each of the resin thin films. Accordingly, this film has three layers: a first Al layer (the Al deposition film 3), a resin thin film and a second Al layer. The two Al layers sandwich the resin thin film so as to enable the Al layers to be used as electrodes. Resistance under the application of a DC voltage of 5V was measured in order to evaluate the insulation characteristics of the films. The thickness of the Al layer of the Al deposition film 3 was set to 50 nm. The results are shown in Table 4. When a polymer film with no Al deposition layer was used as the base substrate, the surface characteristic of the resin thin film showed little difference from the above-mentioned results.

TABLE 4

Results of Evaluation of the Resin Thin Film
(Examples 15-17 and 1-3)

| | Thickness 0.1 μm | | | Thickness 0.8 μm | | |
|---|---|---|---|---|---|---|
| | Surface condition (microscope) | Height of waviness (nm) | Resistance (Ω) | Surface condition (microscope) | Height of waviness (nm) | Resistance (Ω) |
| Example 15 | Flat surface | 2 | $5 \times 10^8$ | Flat surface | 6 | $3 \times 10^{11}$ |
| Example 16 | Flat surface | 4 | $3 \times 10^8$ | Flat surface | 8 | $4 \times 10^{11}$ |
| Example 17 | Flat surface | 3 | $4 \times 10^8$ | Flat surface | 8 | $5 \times 10^{10}$ |
| Example 1 | Satin surface | 25 | $2 \times 10^4$ | Satin surface | 260 | $5 \times 10^7$ |
| Example 2 | Satin surface | 30 | $8 \times 10^5$ | Satin surface | 400 | $1 \times 10^7$ |
| Example 3 | Satin surface | 40 | $4 \times 10^5$ | Satin surface | 300 | $3 \times 10^7$ |

As can be appreciated from the results shown in Table 4, by radiating the deposition material and/or the deposition surface of the base substrate 3 with charged particle beams (i.e., electron beams or ion beams) the deposition material and/or the deposition surface of the base substrate 3 was found to flatten the resin thin film. This is considered to be due to the electrostatic energy of the charged particle beam that accelerates attachment of the resin particles and the electrostatic force that allows the deposition material to be flattened after the deposition.

Moreover, the results of resistance measurement indicate that the resistance is higher in the case of flatter surface, which means that the methods and the apparatuses according to Examples 15 to 17 are more effective for the applications where a high insulation characteristic of the resin thin film is required. The reason that the resistance values of Examples 1 through 3 in Table 4 are different (by about one digit) from those of Examples 1 through 3 in Table 1 is due to the variation of the production lots. However, by comparing the result obtained in Example 15 with that of Example 1, the result obtained in Example 16 with that of Example 2 and the result obtained in Example 17 with that of Example 3, it is obvious that the charged particle beam increases the electric resistance by about 2 digits to about 4 digits and has a greater effect.

As described in Examples 6 to 9, the first supplying device, the heated roller and the deposition surface are preferably arranged so that the primary particles of the deposition material generated at the first supplying device are prevented from reaching the deposition surface.

Figure 21:
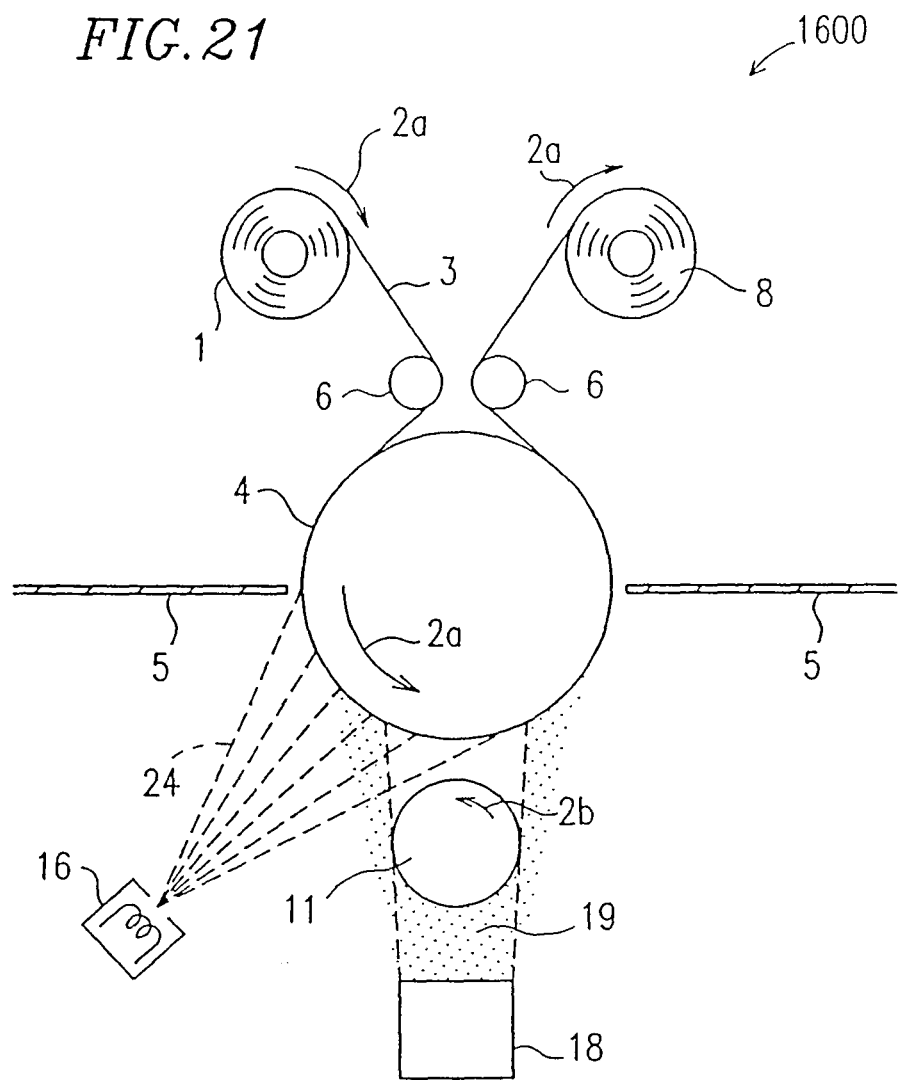
FIG. 21 is a schematic view showing another example of a thin film formation apparatus for forming a thin film according to the second aspect of the present invention.
Figure 22:
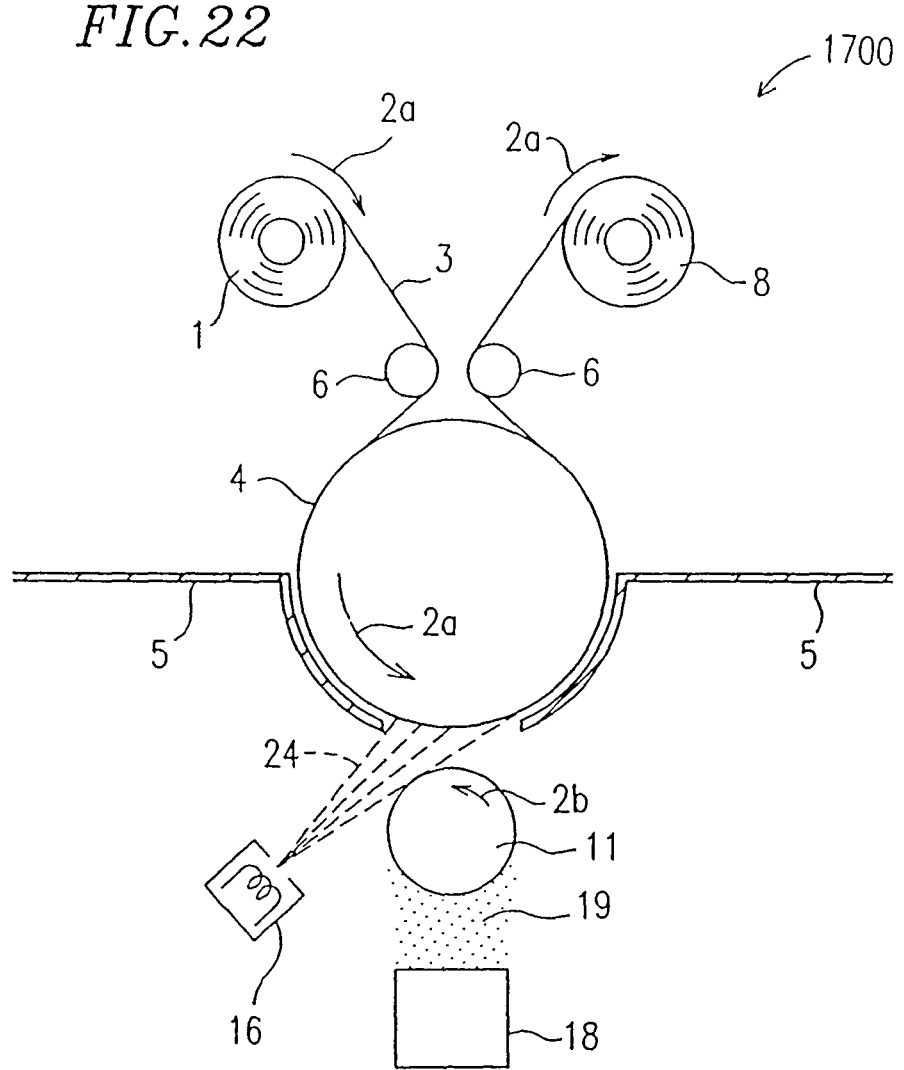
FIG. 22 is a schematic view showing another example of a thin film formation apparatus for forming a thin film according to the second aspect of the present invention.

FIG. 21 is a schematic view showing a thin film formation apparatus 1600. In the case of the thin film formation apparatus 1600, primary particles 19 of the deposition material generated by a first supplying device 18 are supplied (splashed) outside of a space which is enclosed by broken lines extending from the ends of the first supplying device to the ends of the heated roller 11 as shown in FIG. 21. In other words, the primary particles generated by the first supplying device 18 reach the deposition surface. As a result, the anomalous particles are included in the primary particles that reach the deposition surface, thereby deteriorating the quality of the resultant resin thin film. FIG. 22 is a schematic view showing a thin film formation apparatus 1700. As shown in FIG. 22, the thin film formation apparatus 1700 is provided with shielding plates 5 so that the primary particles of the deposition material generated at a first supplying device 18 are prevented from reaching the deposition surface. The direct path of the deposition material (i.e., primary particles) from the first supplying device to the region defined by the opening between the shielding plates 5 is shielded by the heated roller 11. As a result, generation of defects due to anomalous particles is restrained.

A device for radiating charged particles, such as the electron beam radiation device 16 may be arranged such that, as shown in FIGS. 18 and 19, a electron beam is radiated only toward the deposition surface, or as shown in FIGS. 21 and 22 such that the electron beam is radiated toward both of the deposition surface and the atomized or evaporated deposition material. Moreover, the charged particle beam may be radiated only toward the deposition material.

Although the heated roller 11 is used in the above-described examples, the heated roller 11 can be replaced with other heated devices.

Figure 23:
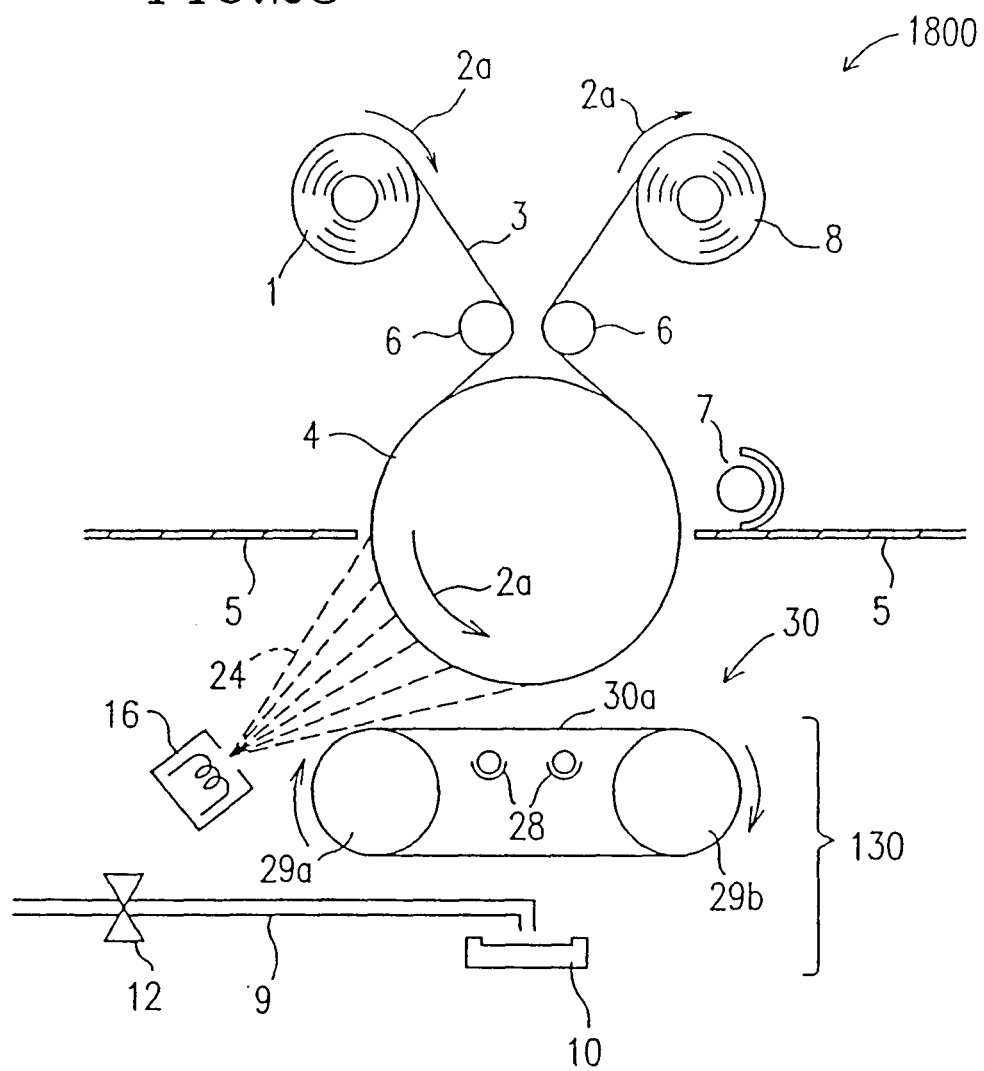
FIG. 23 is a schematic view showing another example of a thin film formation apparatus for forming a thin film according to the second aspect of the present invention.

For example, the heated roller 11 in the thin film formation apparatus 1300 shown in FIG. 18 can be replaced with a heated belt 30 so as to constitute a thin film formation apparatus 1800 shown in FIG. 23. A deposition material supplying section 130 is substantially the same as the deposition material supplying section 130 shown in FIG. 9 and thus the description thereof is omitted.

Figure 24:
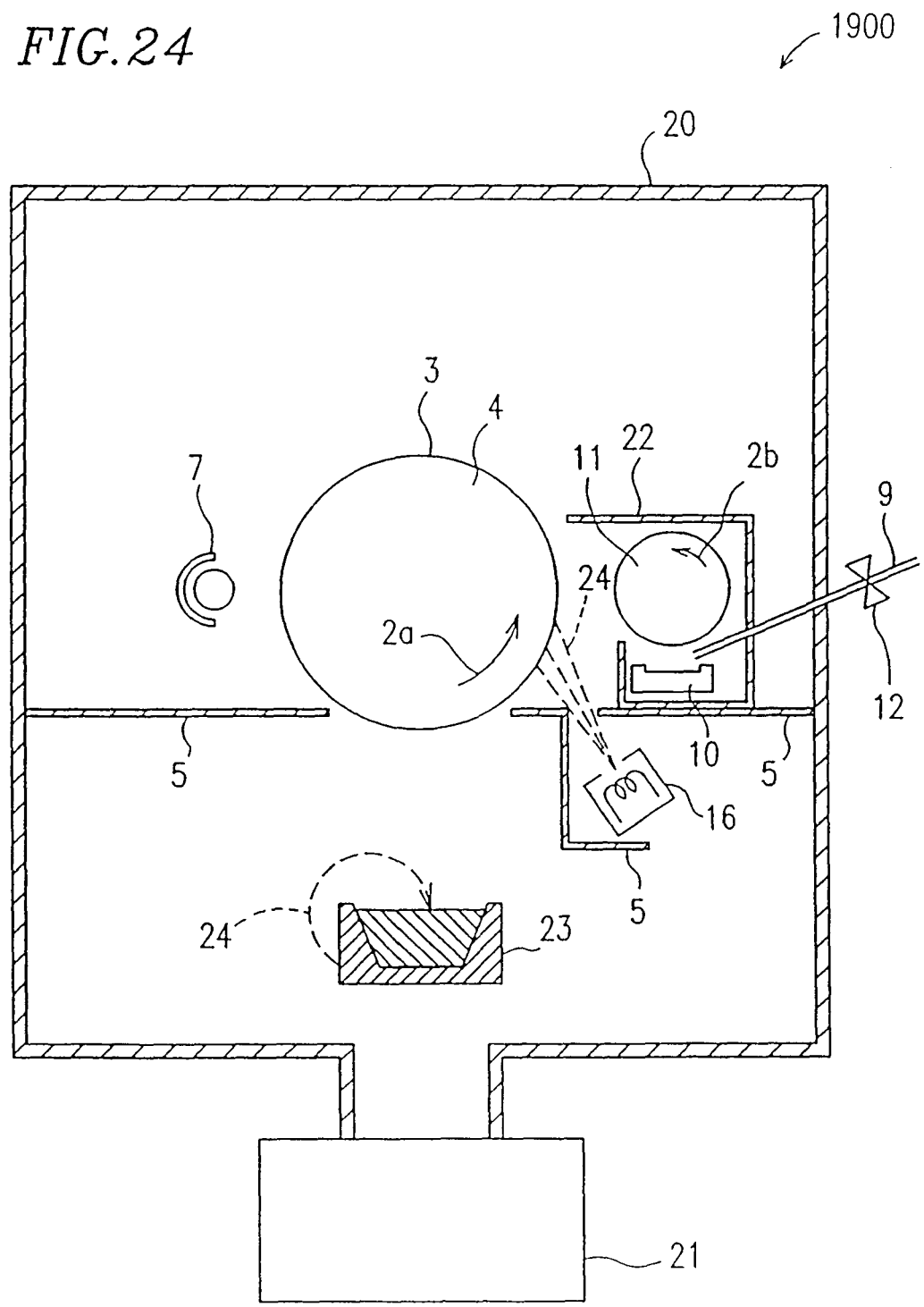
FIG. 24 is a schematic view showing another example of a thin film formation apparatus for forming a thin film according to the second aspect of the present invention.
Figure 25:
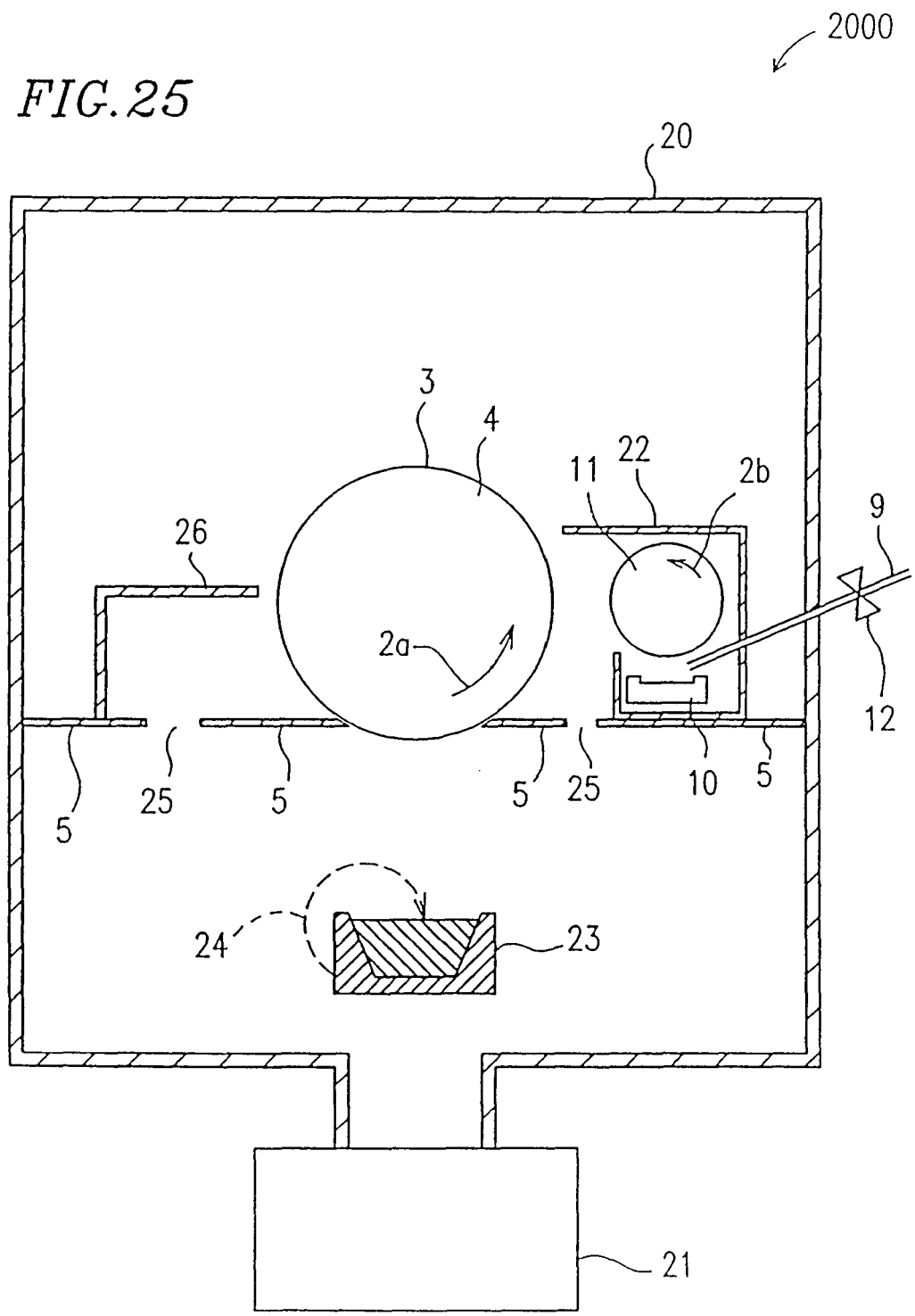
FIG. 25 is a schematic view showing another example of a thin film formation apparatus for forming a thin film according to the second aspect of the present invention.
Figure 26:
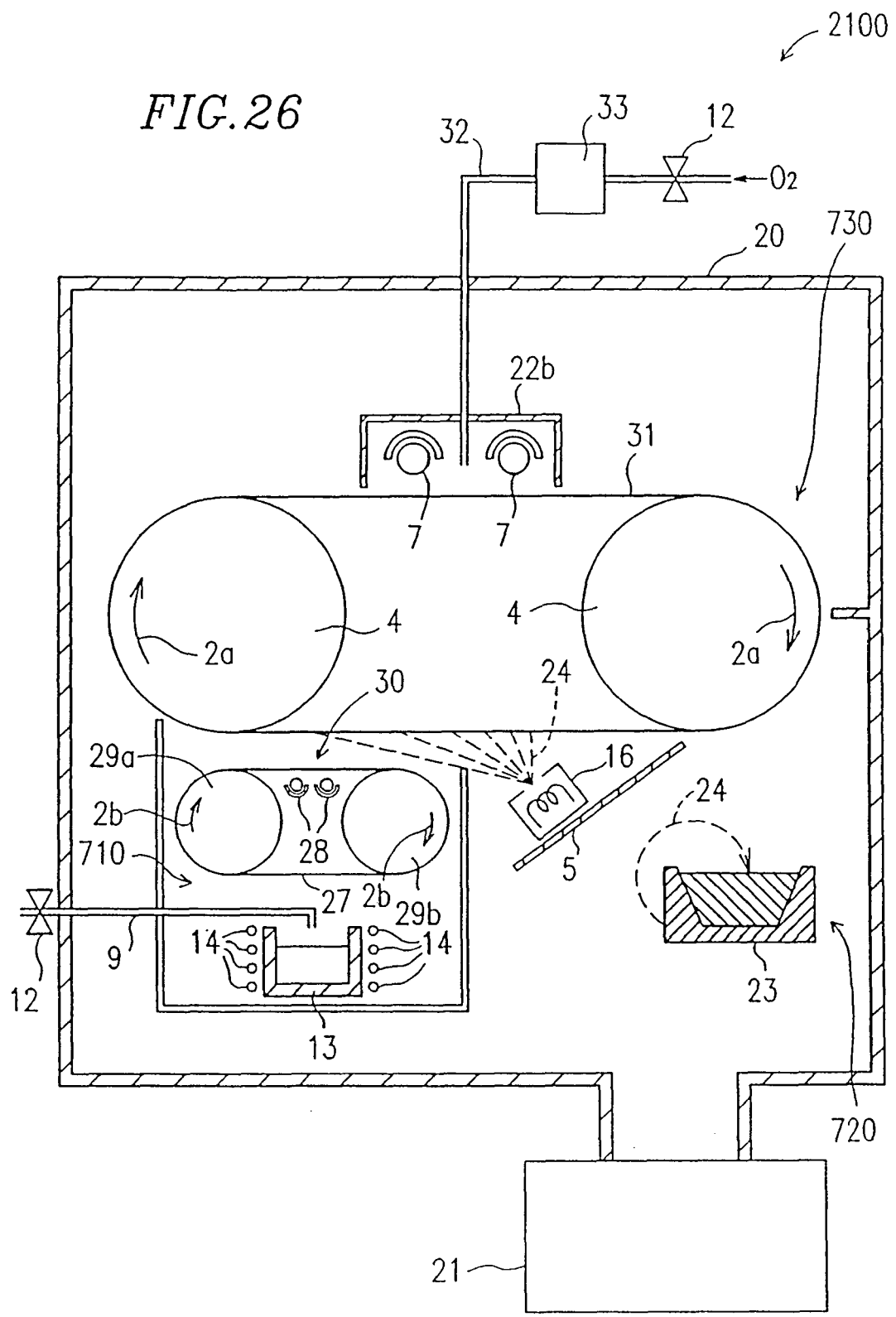
FIG. 26 is a schematic view showing another example of a thin film formation apparatus for forming a thin film according to the second aspect of the present invention.

Furthermore, an electron beam radiation device 16 can be provided in the thin film formation apparatus 600 shown in FIG. 10 to constitute a thin film formation apparatus 1900 shown in FIG. 24. The thin film formation apparatus is capable of forming a resin thin film with superior flatness. In the case where an electron beam is used to cure the deposition material, in order to enhance the flatness of the obtained resin thin film, the shielding plates 5 of the thin film formation apparatus shown in FIG. 11 can be provided with opening 25 for introducing the electron beams generated from the electron beam deposition source 23. FIG. 25 is a schematic view showing a thin film formation apparatus 2000 having such a structure. Such a structure allows an electron beam source for generating electron beams for curing the deposition material and electron beams for depositing a metal thin film to be used as a electron beam source for flattening the resin thin film. An electron beam radiation device 16 can be provided in the thin film formation apparatus 700 shown in FIG. 12 to constitute a thin laminate film formation apparatus 2100 shown in FIG. 26. The laminate thin film formation apparatus 2100 is capable of forming a resin thin film having superior flatness.

Although only the resin thin films having thicknesses of about 0.1 µm and about 0.8 µm are described in the above-described examples, resin thin films having a thickness in a range of about 0.05 µm to about 3 µm were confirmed to have equal effects as the examples according to the second aspect of the present invention. Although only 3 types of acrylic resin were used in the above-described examples, the present invention is widely applicable to the case where other types of acrylic resin or a resin other than an acrylic resin is used.

As a result of studies on various kinds of materials, the obtained effect according to the second aspect of the present invention was especially prominent when the viscosity of the resin-type material is about 30 cps to about 800 cps under a normal temperature and pressure. When the viscosity was 30 cps or lower, a resin thin film with a relatively high flatness was obtained without using the methods and/or apparatus according to the present invention. On the other hand, in the case where the viscosity was about 800 cps or higher, even when the method and/or apparatus according to the present invention are used, waviness remained although there was a slight effect of flatness.

As a charged particle beam, an electron beam and an ion beam were confirmed to exhibit equal effects of flattening in various materials. Moreover, the effect of flattening was observed when the acceleration voltage of the charged particles was about 50V or more. The effect was insufficient at an acceleration voltage of about 50 V or lower. This is considered to be due to an energy shortage or unstableness of the used electron beam radiation device at a lower voltage. The upper limit of the acceleration voltage is not confirmed but the effect of the present invention was obtainable at least to an acceleration of about 30 kV.

According to a third aspect of the present invention, a method for enhancing the adhesion between alternately laminated metal thin films and resin thin films of a laminate film, is provided.

In the case of a laminate film including alternate resin thin films and metal thin films, adhesion between the film layers, i.e., between the resin thin films and the metal thin films is important as well as the performance of each film layer. Insufficient adhesion between the film layers will cause a minor separation between the film layers during subsequent production steps or during actual usage. Such a minor separation often results in separation of the entire adhesion area between the film layers. Methods and apparatuses for forming a thin film according to the third aspect of the present invention enhance the adhesion strength between the resin thin film and the metal thin film formed on the resin thin film. Thus, the method and the apparatus are suitable for use in the formation of laminate films used in electronic components or the like.

Hereinafter, examples according to the third aspect of the present invention will be described as combined with the film formation methods and apparatuses according to the first aspect of the present invention. However, the film formation methods and apparatuses according to the third aspect of the present invention are not limited thereto, and the effects thereof are obtainable even when used individually. Moreover, the examples according to the third aspect of the present invention may be combined with the methods and the apparatuses according to the first aspect and/or the second aspect of the present invention other than those described below. In the case where the methods and the apparatuses according to the third aspect of the present invention are applied to the case of producing a laminate film suitable for use in electronic components, it is preferable to combine with the method and the apparatus according to the first aspect and/or the second aspect of the present invention so as to obtain multiple effects.

Example 18

Figure 27:
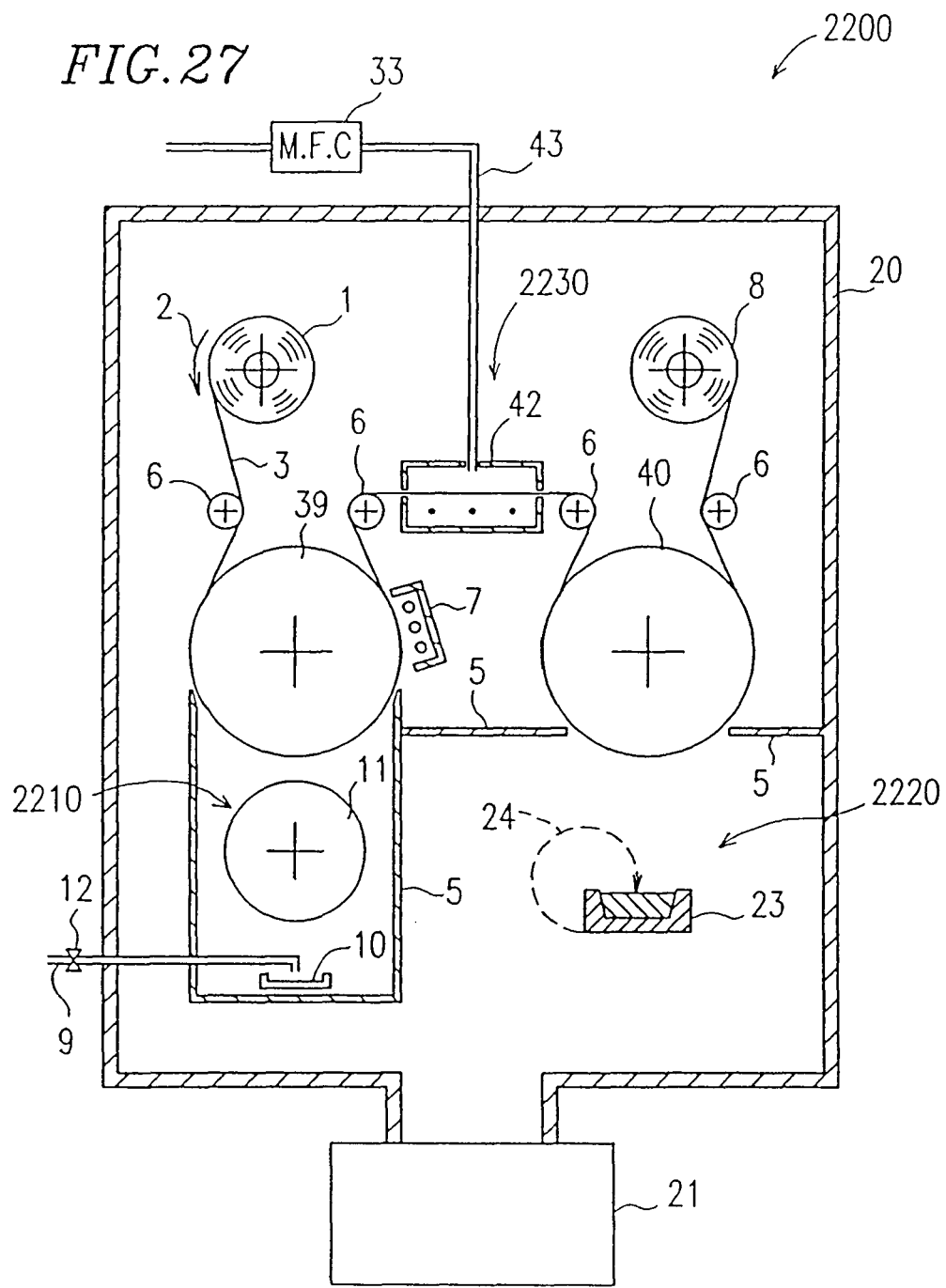
FIG. 27 is a schematic view showing one example of a thin film formation apparatus for forming a thin film according to a third aspect of the present invention.

FIG. 27 is a schematic view showing a thin film formation apparatus 2200 according to Example 18 of the present invention. The thin film formation apparatus 2200 includes a resin thin film depositing section 2210, a metal thin film depositing section 2220 and a glow discharge treatment section 2230. A base substrate 3 is treated at the glow discharge treatment section 2230 while being transferred from the resin thin film depositing section 2210 to the metal thin film depositing section 2220. The steps of forming the resin thin film and the metal thin film are substantially the same as those in the examples according to the first aspect of the present invention and thus the description thereof is omitted.

While a copper deposition film as a film 3 is running along the peripheral surface of a can 39, a deposition material is deposited on a deposition surface of the film 3 and the deposition material is cured with a UV light radiation device 7, thereby forming a resin thin film. Thereafter, the thin film is treated at the glow discharge treatment section 2230 before being provided with a metal thin film on a can 40.

The glow discharge treatment section 2230 is provided with a glow discharge device 42 and an oxygen inlet tube 43. The flow rate of the oxygen gas supplied into the glow discharge device 42 by the oxygen inlet tube 43 is controlled by a mass flow controller (MFC) 33. While passing through the glow discharge device 42, the base substrate 3 is exposed to glow discharge in an oxygen atmosphere. Thereafter, the base substrate 3 having the resin thin film thereon is transferred to the metal thin film depositing section 2220 so that a metal thin film is formed on the resin thin film subjected to a glow discharge treatment.

A polyethylene terephthalate film having a thickness of 2 μm with a copper layer having a thickness of 200 nm formed thereon is used as the copper deposition film. 1,9-nonanediol diacrylate mixed with 10% by weight of a photopolymerization initiator is used as the deposition material. The temperature of the heated roller 11 is set to be 130° C. The running rate of the film 3 is set to be 50 m/min. A UV radiation device 7 of 300 W is used.

The glow discharge treatment is conducted while introducing oxygen gas in the glow discharge device 42 under the following two conditions: (A) an oxygen gas flow rate of 10 sccm, an AC voltage of 600 V and an AC current of 20 mA; and (B) an oxygen gas flow rate of 20 sccm, a DC voltage of 1000 V and a DC current of 100 mA. A copper with a fineness of 99.95% is used as the metal thin film material. An electron beam deposition is conducted with an acceleration voltage of 15 kV. A copper thin film is set to a thickness of 200 nm.

Example 19

Figure 28:
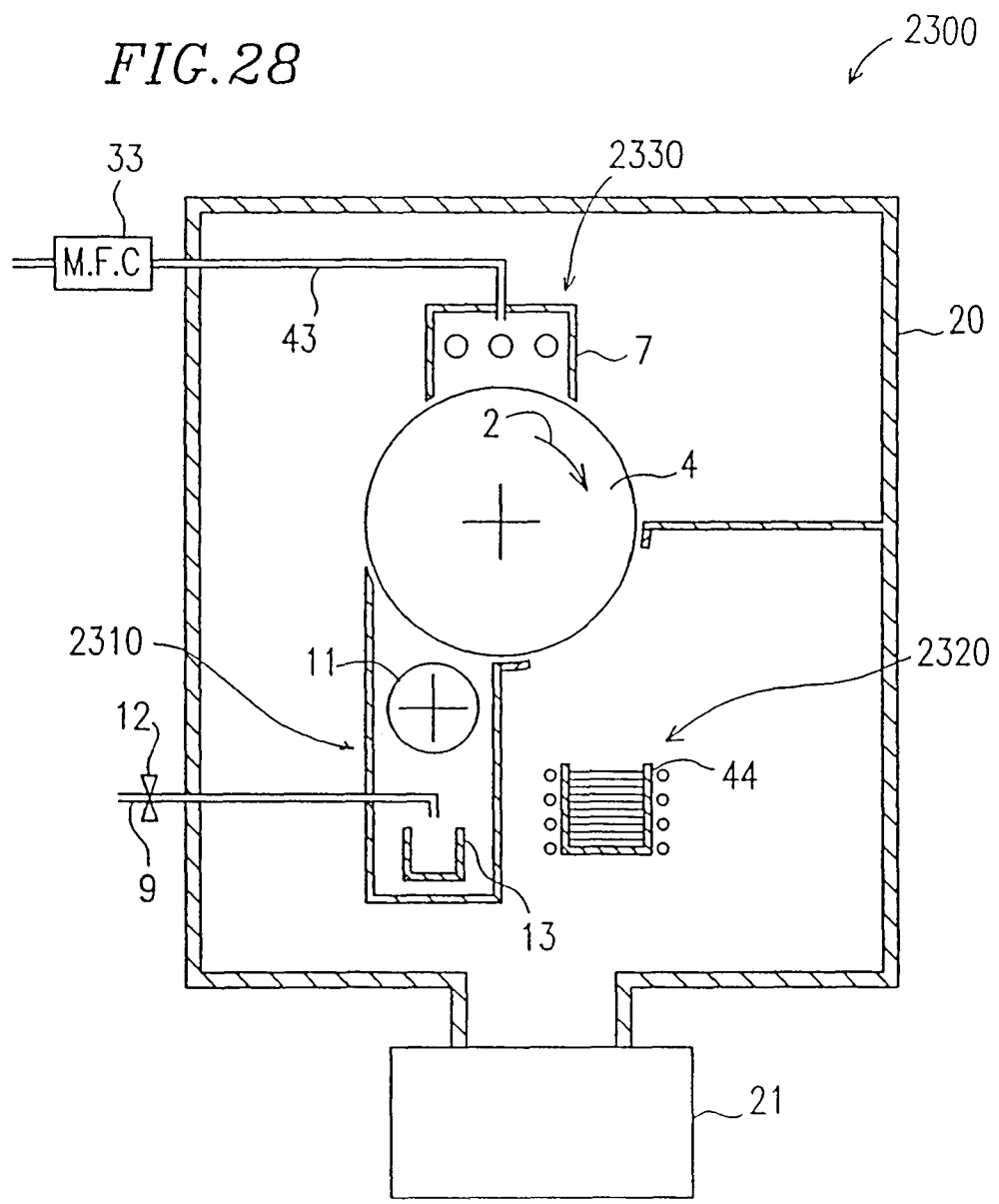
FIG. 28 is a schematic view showing another example of a thin film formation apparatus for forming a thin film according to a third aspect of the present invention.

FIG. 28 is a schematic view showing a thin film formation apparatus 2300 according to Example 19. The thin film formation apparatus 2300 is provided with a resin thin film depositing section 2310, a metal thin film depositing section 2320 and an UV radiation section 2330. In Example 19, a laminate film is directly formed on a can 4. A resin thin film formed on the can 4 by the resin thin film depositing device 2310 is irradiated with UV light while being moved toward the metal thin film depositing section 2320. The steps for forming the resin thin film and the metal thin film are substantially the same as those according to the examples of the first aspect of the present invention and thus the detailed description thereof is omitted.

The UV radiation section 2330 is provided with an UV radiation device 7 and an oxygen inlet tube 43. The flow rate of oxygen gas supplied into the UV light radiation device 7 by the oxygen inlet tube 43 is controlled by a mass flow controller (MFC) 33. The UV light is radiated in an oxygen atmosphere while the deposition surface of the can 4 passes through the UV light radiation device 7. Thereafter, the resin thin film formed on the can 4 moves to the metal thin film depositing section 2320 where a metal thin film is formed on the resin thin film.

A peripheral surface of the can 4 is subjected to chrome plating and finished so as to have a surface property of 0.3 s by polishing. Dimethylol-tri-cyclodecane diacrylate mixed with 0.5% by weight of a photopolymerization initiator is used as the deposition material. The temperature of the heated roller 11 is set to be 110° C. The peripheral speed is set to be 60 m/min. The resin thin film is formed by using a UV light device 7 of 300 W, while introducing oxygen gas at a flow rate of (A) 2 sccm, (B) 10 sccm and (C) 100 sccm in the UV light radiation device. The metal thin film is formed by using an aluminum with a fineness of 99.95% as a metal thin film material and by employing an induction heating evaporation source 44. The thickness of the resin thin film is about 0.1 μm and the thickness of the metal thin film is about 30 nm. Approximately 500 layers of each of the resin thin film and the metal thin film (approximately 1,000 layers in total) are alternately laminated in a repeated manner.

Example 20

Figure 29:
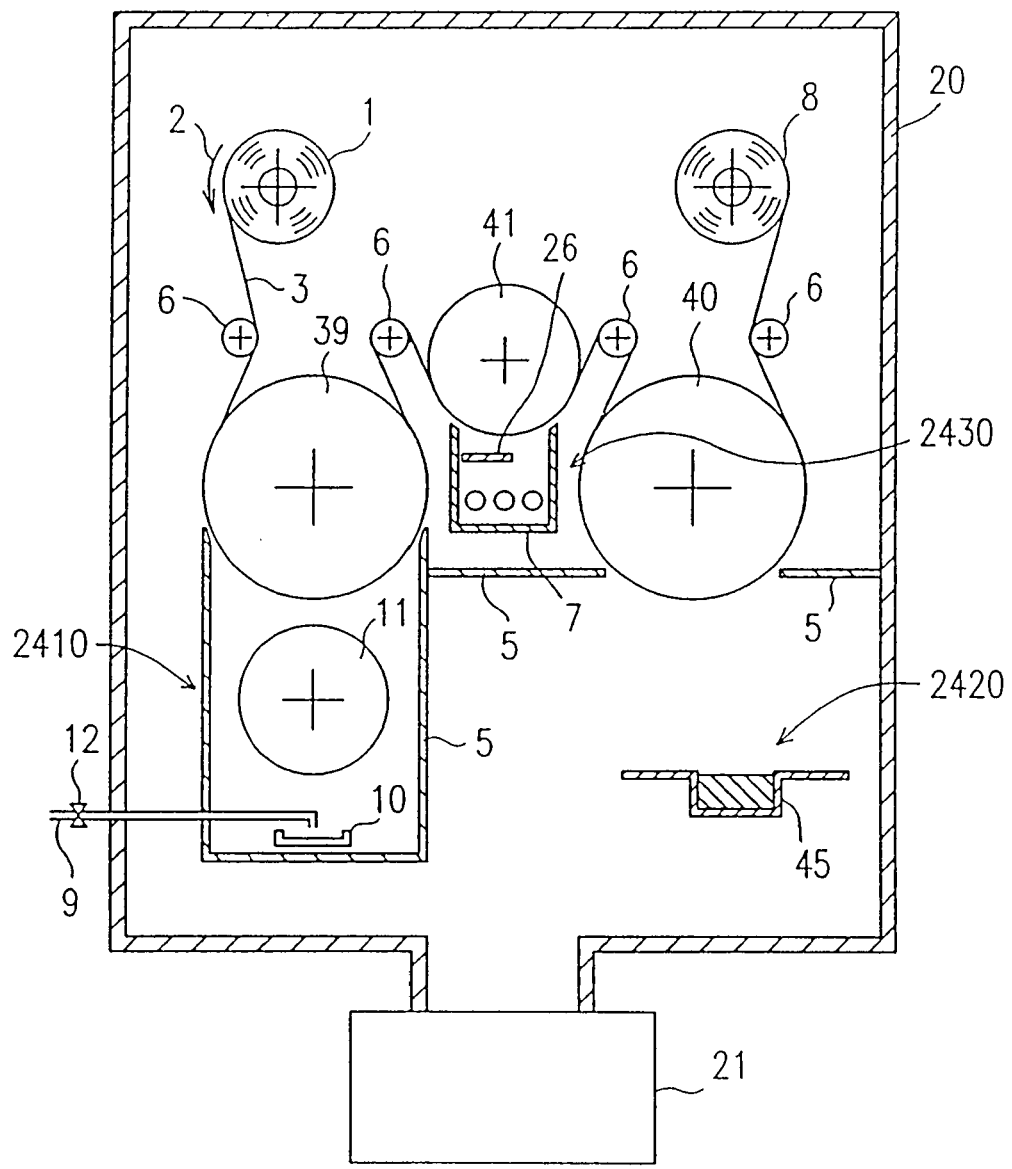
FIG. 29 is a schematic view showing another example of a thin film formation apparatus for forming a thin film according to a third aspect of the present invention.

FIG. 29 is a schematic view showing a thin film formation apparatus 2400 according to Example 20. The thin film formation apparatus 2400 is provided with a resin thin film depositing section 2410, a metal thin film depositing section 2420 and an UV light radiation section 2430. A resin thin film formed on the base substrate 3 by the resin thin film depositing device 2410 is irradiated with UV light while being moved toward the metal thin film depositing section 2420. The steps for forming the resin thin film and the metal thin film are substantially the same as those according to the examples of the first aspect of the present invention and thus the detailed description thereof is omitted.

While running along a can 41, the resin thin film formed on the base substrate 3 is cured by being irradiated with UV light from a UV light radiation device 7. The UV light radiation device 7 is provided with a water-cooled copper plate (shielding plate) 26. The water-cooled copper plate 26 adjusts the UV light radiation area of the resin thin film (i.e., the amount of UV light radiation) by partially shielding the area. Then, a metal thin film is formed on the resin thin film irradiated with UV light, at the metal thin film depositing section 2420.

A polyethylene naphthalate film having a thickness of about 4 μm with an Al layer having a thickness of about 70 nm formed thereon is used as the Al deposition film, i.e., the base substrate, 3. A mixture of 1,9-nonanediol diacrylate and dimethylol-tri-cyclodecane diacrylate in a weight ratio of 1:1 is used as the deposition material. The temperature of the heated roller 11 is set to be 120° C. The thickness of the obtained resin thin film is set to be about 0.4 μm. The peripheral speed of the cans 39 and 41 are set to be 80 m/min.

The surface of a UV light radiation device 7 where the UV light is radiated is partially shielded by a water-cooled copper plate 26, with the shielding rate being varied within a range of about 20% to about 100%, so as to vary the amount of radiation toward the surface of the resin thin film. A UV light radiation device 7 of 300 W is used. The metal thin film (thickness: about 50 nm) is formed by a resistance heating type evaporation source 25 by using aluminum with a fineness of 99.95% as the metal thin film material.

Example 21

After forming and curing a resin thin film according to Example 18, the film is taken up prior to a glow discharge treatment or a metal thin film formation. Then, the vacuum chamber 20 is exposed to the atmosphere and then again evacuated to perform the glow discharge treatment and to form the metal thin film.

Example 22

Resin thin films and metal thin films are formed substantially in the same manner as that according to Example 18, except no discharge by the glow discharge apparatus 42 is performed.

Example 23

Resin thin films and metal thin films are formed substantially in the same manner as that according to Example 19, except that no oxygen gas (oxygen flow rate of 0 sccm) is introduced in the UV light radiation device 7.

Example 24

Resin thin films and metal thin films are formed substantially in the same manner as that according to Example 20, except that a surface of the UV light radiation device 7 where the UV light is radiated is not shielded (shielding rate of 0%) upon UV light radiation.

Adhesion at an interface of the alternating resin thin films and metal thin films of the laminate film were evaluated for Examples 18 through 24. First, each laminate film was scratched in a lattice pattern with a cutter. Then, an adhesive tape was applied on the scratched surface and peeled off to obtain the proportion of the peeled off area to the entire area (a peeled area ratio) of the laminate film. Moreover, aluminum cubic blocks (5 mm×5 mm) were adhered on both surfaces of the laminate film so as to evaluate the load required to separate the blocks from the surfaces. The interface where the peeling occurred was also visually evaluated. The results are shown in Table 5.

TABLE 5

Results of the Evaluation of Adhesion Strength (Examples 18-24)

| | | Tape peeling test | Aluminum block load test | |
|---|---|---|---|---|
| | Conditions | Area ratio (%) | Load (g) | Observation |
| Example 18 | Discharge condition (A) AC voltage 600 V | 2 | 1000 | Random |
| Example 19 | Discharge condition (B) DC voltage 1000 V | | | |
| | Oxygen 2 sccm | 3 | 800 | Random |
| | Oxygen 10 sccm | 6 | 600 | Metal portion on resin |
| | Oxygen 100 sccm | 100 | 2 | Resin was not cured |
| Example 20 | Shielding % 20% | 30 | 150 | Metal portion on resin |
| | Shielding % 40% | 20 | 200 | Metal portion on resin |
| | Shielding % 60% | 8 | 600 | Random |
| | Shielding % 80% | 5 | 800 | Random |
| | Shielding % 100% | 100 | 2 | Resin was not cured |
| Example 21 (Exposed to the atmosphere) | | 40 | 100 | Metal portion on resin |
| Example 22 (No discharge) | | 10 | 400 | Metal portion on resin |
| Example 23 (Oxygen 0 sccm) | | 20 | 200 | Metal portion on resin |
| Example 24 (Shielding % 0%) | | 30 | 150 | Metal portion on resin |

With reference to Table 5, it can be understood from the results of Examples 18, 21 and 22 that the adhesion strength is greatly enhanced by exposing the surface of the resin thin film in a glow atmosphere containing oxygen. The AC voltage and the DC voltage applied to the glow atmosphere did not have a significant difference. However, as seen from the results obtained in Examples 18 and 21, when the glow discharge treatment is performed after exposing the surface of the resin thin film to an atmospheric pressure, the enhancement of the adhesion strength by the glow discharge treatment is relatively low.

The results obtained in Examples 19 and 23 show that the adhesion strength is greatly enhanced when a small amount of oxygen is introduced upon UV light curing. However, when an excessive amount of oxygen is introduced, curing of the resin thin film is hindered and therefore a metal thin film is formed on an incompletely cured resin thin film, thereby remarkably deteriorating the adhesion strength. For example, in the case of Example 19, the load required for separation at an oxygen flow rate of 100 sccm was merely about 2 g. Accordingly, the amount of oxygen suitable for enhancing the adhesion intensity should be selected in accordance with the used material. Generally, materials such as an acrylic resin, etc. with radial reaction property is prevented from curing under presence of oxygen. However, the degree thereof varies depending on the material type (the type and amount of a monomer, an initiator and an additive).

Figure 30:
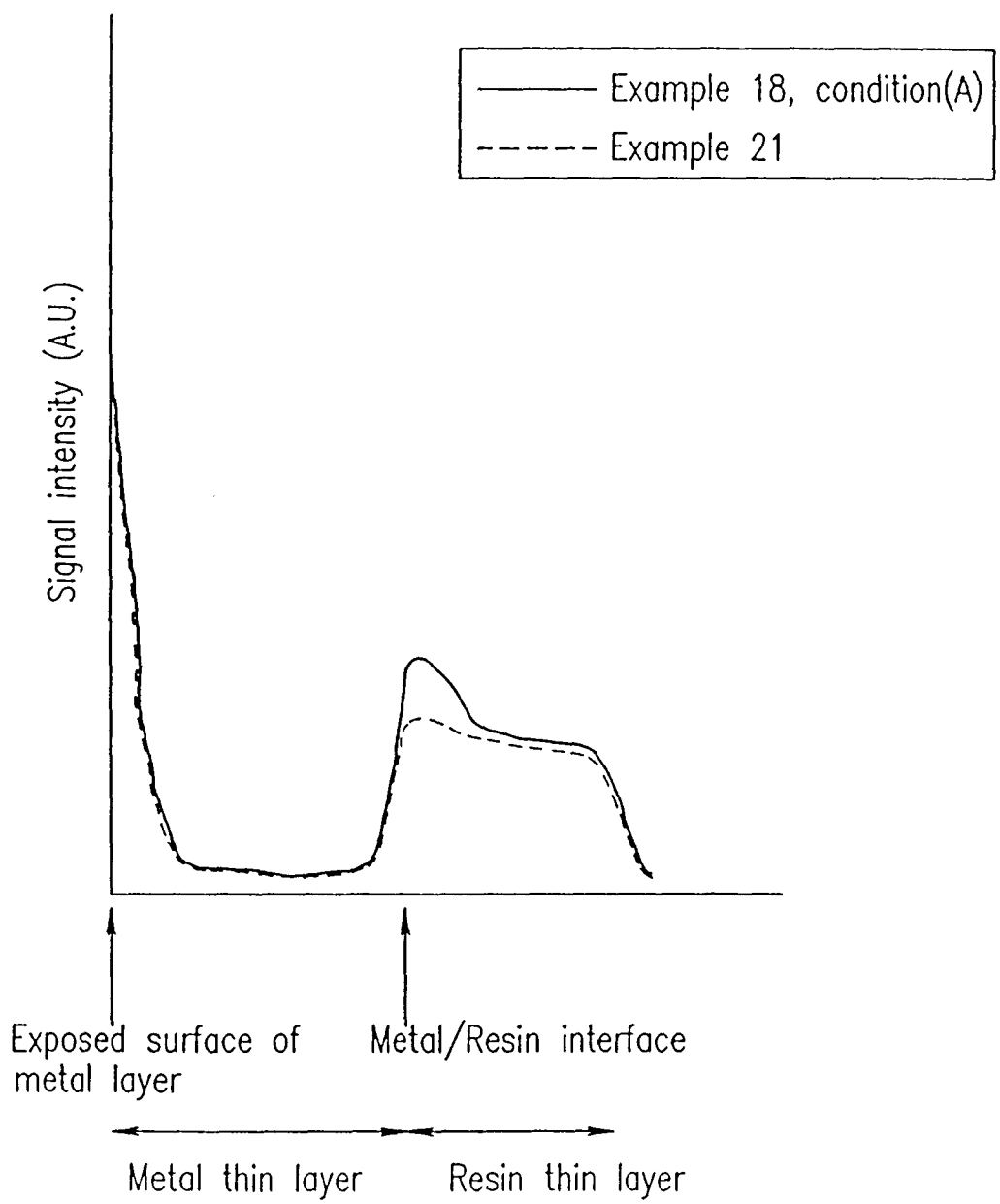
FIG. 30 is a graph showing an exemplary depth profile of an oxygen concentration of a thin film according to the present invention.

There is no clear reason for the enhancement of the adhesive strength seen in Examples 18 and 19. It is possible that the adhesive strength is enhanced due to the considerable amount of oxygen present at the interface between the resin thin film and the metal thin film. Moreover, it is also possible that a combined effects which includes: the resin thin film having a smaller degree of curing where a minute amount of oxygen is introduced; the stress not concentrated on the interfaces when there is internal or external stress; and the high oxygen concentration at or near the interfaces. FIG. 30 is an example of an Auger depth profile in the case of Examples 18 and 22, where changes of peak oxygen concentration in Auger electron spectrum were measured by etching the laminate film from the metal thin film surface side (i.e., an exposed surface of metal layer). As can be appreciated from FIG. 30, the oxygen concentration at the interface between the resin thin film and the metal thin film of the laminate film according to Example 18, which has higher adhesion strength, is higher than an oxygen concentration of the laminate film according to Example 22.

Figure 31:
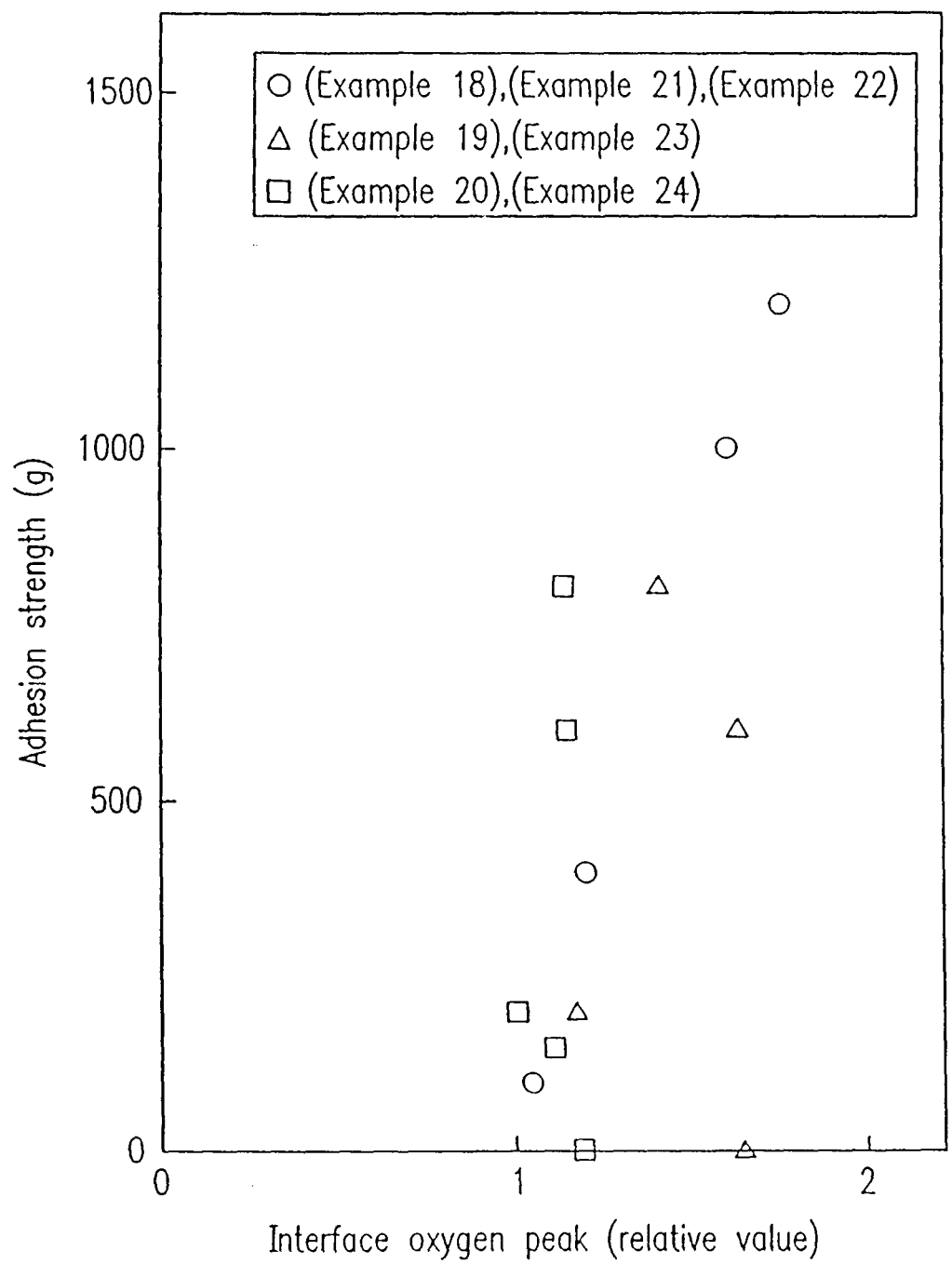
FIG. 31 is a graph showing a relationship between oxygen concentrations (intensity) and adhesion strengths at an interface of a resin thin film and a metal thin film.

FIG. 31 is a graph showing a relationship between a relative value of the oxygen concentration and the adhesion strength at the interface between the resin thin film and the metal thin film in each of Examples 18 through 24. In FIG. 31, the relative concentration of oxygen is represented by a ratio of an oxygen concentration in the vicinity of a resin thin film surface where a metal thin film is to be formed to the oxygen concentration in the vicinity of a middle portion of the resin thin film (i.e., relative concentration=an oxygen concentration in the vicinity of the interface/the oxygen concentration in the vicinity of a middle portion of the resin thin film in its thickness direction). As can be understood from FIG. 31, correlation is recognized between the oxygen intensity and the adhesion strength at the interface, suggesting that controlling the oxygen concentration at the interface is important to enhanced adhesion strength. FIG. 31 shows that the enhancement of the adhesion strength is prominent at the relative value of the oxygen concentration of about 1.3 or more. The relative intensity of about 1.6 is more preferable so as to obtain a sufficiently high adhesion strength of about 1,000 g or higher.

As can be seen from the results in Examples 20 and 24, when a metal thin film is formed on a resin film which is cured to a lower degree by partially shielding UV light upon UV light radiation, the adhesion strength can also be enhanced to some degree. However, an increase in the oxygen concentration at the interface in the case of Example 20 was not as successful as those seen in Examples 18 and 19. As can be presumed from FIG. 31, the adhesion strength was enhanced in Example 20, not only due to the oxygen increase but also due to factors other than the oxygen increase, for example, reaction at the end of the curing step proceeded by the heat of condensation which is generated upon the deposition of the metal thin film. In the case where the UV light was completely shielded, the resin thin film was uncured, thereby rendering satisfactory adhesion strength unobtainable. The suitable percentage of shielding greatly differs depending on the heat of condensation of the metal materials to be used and the steps for forming the metal thin film (especially, on whether an electron beam is used or not) and thus requires optimization. The resin thin film can be suitably cured by using reflecting electrons generated when the metal thin film is formed by a electron beam deposition or by using a method in which the metal thin film is formed after radiating electron beam to a surface of a resin thin film. Furthermore, in the case where the number of the resin thin films and the metal thin films in the laminate thin film according to Example 19 are doubled to be about 1,000 layers each (about 2,000 layers in total) when an oxygen flow rate of 2 sccm was introduced, an adhesion strength of about 800 g was obtained in Example 19, when no oxygen is introduced, an adhesion strength of 120 g was obtained which is lower than that obtained in the thin film of Example 23. This fact indicates that deterioration of adhesion strength due to increased internal stress is effectively restrained by methods according to the present invention.

According to the third aspect of the present invention, a laminate film of a resin thin film and a metal thin film can be obtained, which has excellent adhesion strength. Such a laminate film can realize a high-performance electronic component, etc.

[Electronic Components Using Laminate Film]

Resin thin films and laminate films consisting of resin thin films and metal thin films according to the present invention can be widely utilized in various fields. Examples of applications of resin thin films and laminate films include electronic components such as high-frequency conductors, capacitors and thin film coils, circuit substrates, protection films, functional films (e.g., an electronic conductive film), etc.

Figure 32A:
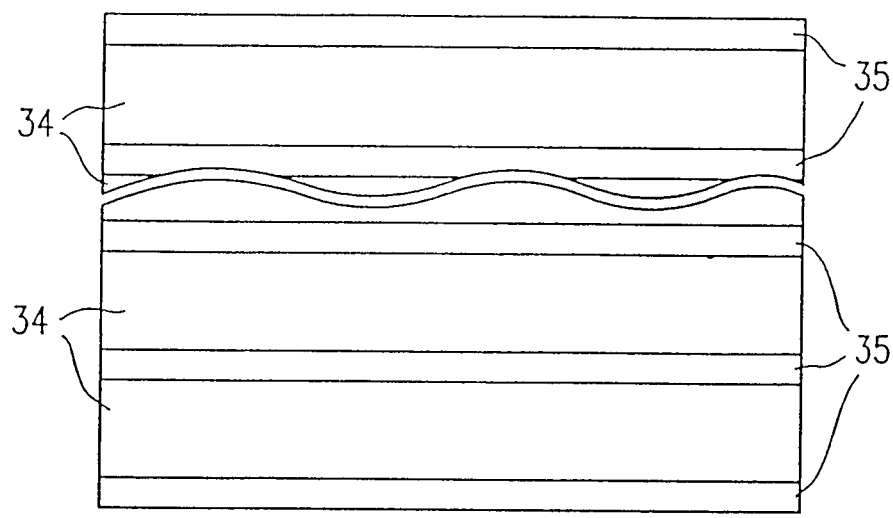
FIG. 32A is a cross-sectional view showing an exemplary electronic component incorporating a resin thin film (laminate film) according to the present invention.

When necessary, a lead electrode may be provided, for example, by thermal spraying. The obtained lamination layer may be formed on a substrate, mechanically fabricated and etched so as to act as a circuit substrate. For example, a conductor (shown in FIG. 32A) having an excellent high-frequency characteristics can be formed by laminating metal thin film layers 35 made of Al, Cu, etc. and resin thin film layers 34 made of acrylic. Since an extremely thin film can be obtained according to the present invention, the high-frequency conductors can be thin. For example, the thickness of the metal thin film layer such as Al is in a range of about 50 nm to about 2000 nm and the thickness of the resin thin film layer is in a range of 0.5 μm to 3 μm. Accordingly, a conductor that can withstand stronger bending can be formed, which has wider applications.

Figure 32B:
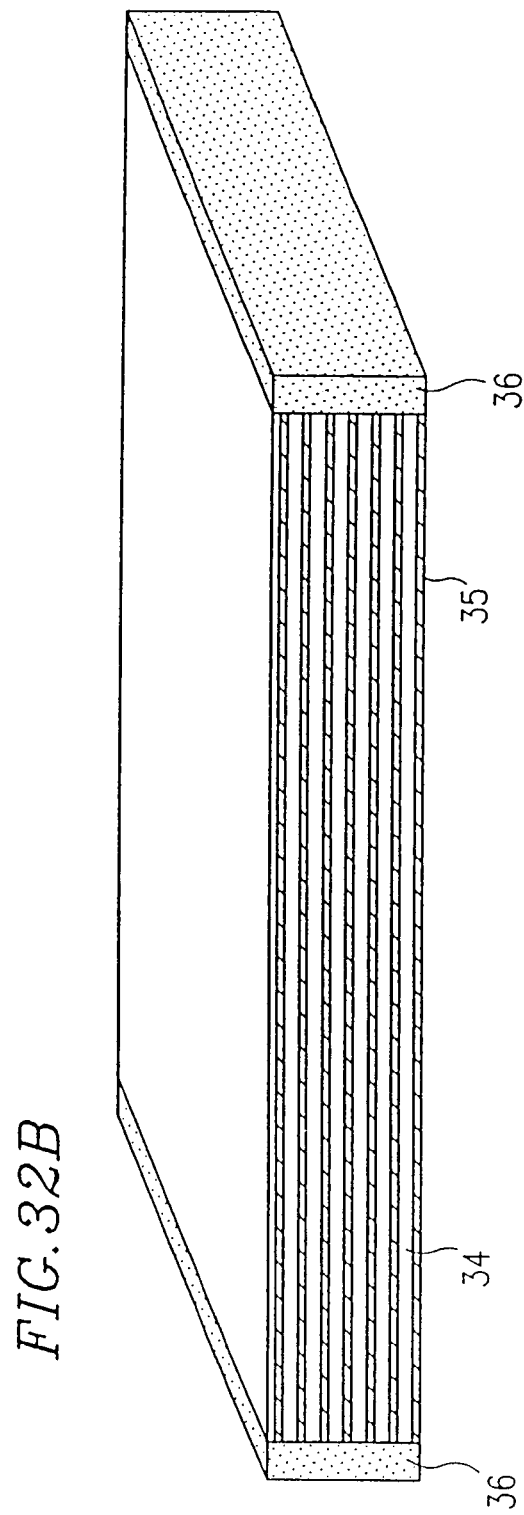
FIG. 32B is an isometric view showing an exemplary electronic component incorporating a resin thin (laminate) film according to the present invention.

Furthermore, as shown in FIG. 32B, lead electrodes 36 can be formed by applying, for example, brass by a spraying method (i.e., a metallikon method). The material used for the lead electrodes 36 is not limited, and can be selected depending on the material used for the metal thin films 35.

Moreover, a multichannel high-frequency conductor can be formed by forming striped metal thin film layers, for example, by a tape margin method or a oil margin method. According to the tape margin method and the oil margin method, a metal thin film with a desired pattern can be formed by covering regions where the metal thin films are not to be formed with tapes or oil so that the unnecessary metal thin films formed thereon can be removed along with the tapes or the oil.

Figure 33A:
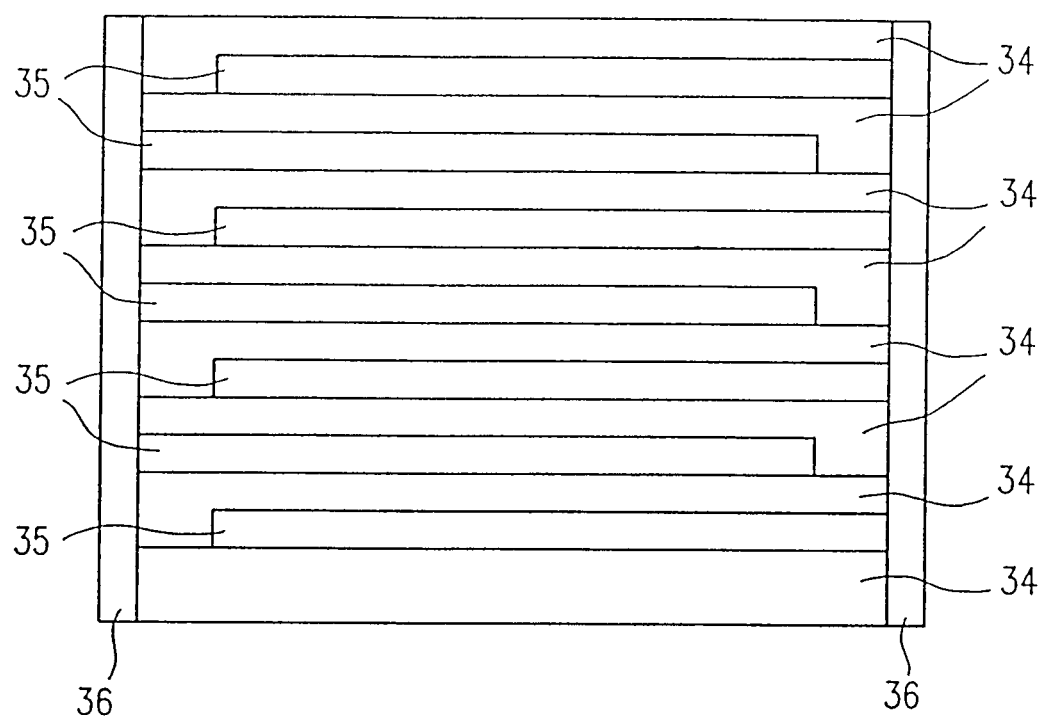
FIG. 33A is a cross-sectional view showing another exemplary electronic component incorporating a resin thin (laminate) film according to the present invention.
Figure 33B:
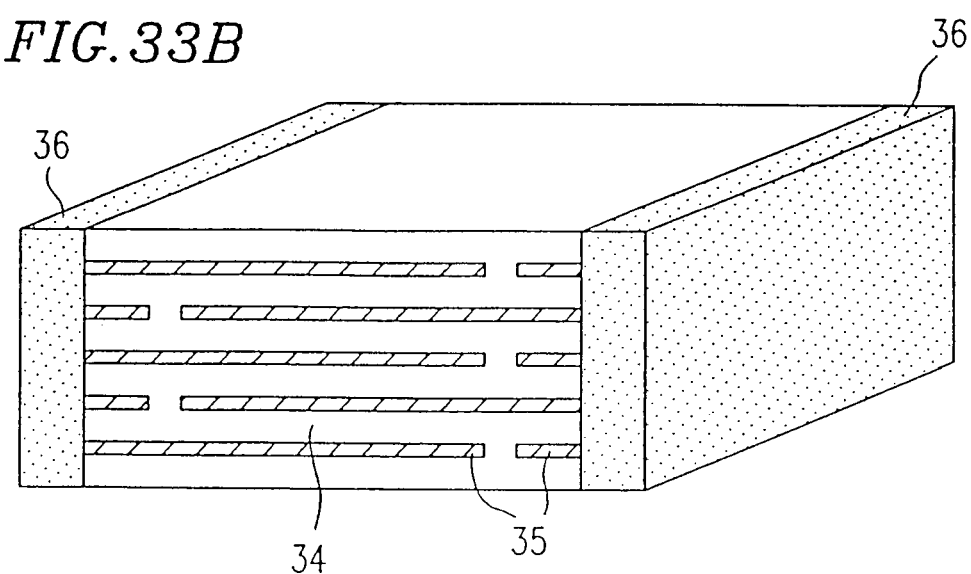
FIG. 33B is an isometric view showing an exemplary electronic component incorporating a resin thin (laminate) film according to the present invention.

Furthermore, as shown in FIGS. 33A and 33B, a small mass storage capacitor can be realized by alternating leads of the metal thin film 35. In this case, for example, metal thin films 35 made of Al can have a thickness of about 20 nm to about 100 nm and resin thin films 34 can have a thickness of about 0.05 μm to about 1 μm. Lead electrodes 36 can be formed by thermal spraying or by other known methods. By using an extremely sheer resin thin film with less defects according to the present invention, a capacitor can be produced which has a greater storage capacitance and a lower production cost compared with those of a capacitor made from a conventional polymer film which is as thin as about 1 μm.

A circuit substrate can be formed by providing a laminate film according to the present invention on a substrate, and forming a desired pattern by mechanical fabrication, etching, or the like. This patterning can be performed by a known method.

The metal thin film layers can be made of more than one kind of metal layer. For example, the metal thin film layer can be made from an Al layer and Cu layer so as to complement the characteristics thereof and to realize high performance of a thin film.

A long laminate film formed on a film may be cut into a desired length by using a known cutting device such as a tape slitter. Moreover, a plurality of films each with laminate films may be overlaid with each other and pressed with heat to be integrated. The integrated laminated film may be cut into desired pieces by a dicing saw. The cutting step tends to cause edge dripping of the resin thin film where the cutting starts and ends. The defect rate caused upon cutting can be reduced by making one or more layers at regions of the resin thin film where the cutting starts and ends thicker than the rest of the region.

According to the present invention, a method and an apparatus for forming a high-quality resin thin film is provided. According to the film formation method of the present invention, no solvent is required and thus superior productivity and environmental protection can be realized. Further, according to the method and the apparatus of the present invention, a resin thin film with excellent flatness and thus high-performance electronic components can be provided. Moreover, according to the method and the apparatus of the present invention, laminate film layers can be produced having strong adhesion between the film layers and thus highly-reliable high-performance electronic components can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film formation apparatus, comprising:
   a heater having a movable heated surface for carrying a deposition material in a non-vapor state to be deposited on a deposition surface;
   a supplier which vaporizes the deposition material so as to supply the vaporized deposition material to the movable heated surface so as to be carried in the non-vapor state;
   a support body which maintains a substrate with the deposition surface, the support body exposed between a pair of shielding plates configured to restrain the deposition material vaporized by the supplier from directly reaching the deposition surface;
   wherein the heater is configured to deposit the carried deposition material on the deposition surface of the support body by heating and vaporizing the carried deposition material; and
   a curing device which cures the deposition material on the deposition surface,
   wherein the deposition material is supplied in an atomized or vaporized state at a position of the movable heated surface where atomized or vaporized deposition material from a point at which the deposition material is supplied to the movable heated surface does not linearly reach the deposition surface, and
   the supplier comprises at least one of an ultrasonic atomizing device, a mechanical atomizing device; and an evaporating device.

2. A film formation apparatus according to claim 1, wherein the heater comprises a heated surface which rotates and carries the deposition material supplied to the heated surface at a position where the deposition material, when vaporized, directly reaches the deposition surface.

3. A film formation apparatus according to claim 2, wherein the heater is a heated roller having the heated surface.

4. A film formation apparatus according to claim 2, wherein the heater is a heated belt having the heated surface.

5. A film formation apparatus according to claim 2, wherein the supplier supplies the deposition material which is in either an atomized state or a vaporized state, to a prescribed position.

6. A film formation apparatus according to claim 1, wherein the heated surface of the heater is tilted so that the deposition material supplied to the heated surface flows, the deposition material being heated and vaporized while moving thereon.

7. A film formation apparatus according to claim 6, further comprising a second heater, the second heater having a first heated surface which rotates and receives the deposition material on the first heated surface from the heater and heats and vaporizes the deposition material while carrying the deposition material.

8. A film formation apparatus according to claim 7, wherein the second heater comprises at least one of a heated roller having a heated surface and a heated belt having a heated surface.

9. A thin film formation apparatus according to claim 6, further comprising a vacuum chamber, wherein the vacuum chamber includes the heater, the support body and the curing device, and the supplier supplies the deposition material to the heated surface of the heater from outside of the vacuum chamber.

10. A film formation apparatus according to claim 1, further comprising an obstruction wall between the position where the deposition material is supplied to the heated surface and the deposition surface, so that the deposition material is prevented from reaching the deposition surface in a linear manner.

11. A thin film formation apparatus according to claim 1, further comprising a container for collecting the deposition material.

12. A thin film formation apparatus according to claim 1, wherein the curing device comprises at least one of a UV light radiation device, an electron beam radiation device and a thermosetting device.

13. A thin film formation apparatus according to claim 1, wherein the curing device comprises a UV light radiation device and an oxygen gas inlet provided in the UV light radiation device.

* * * * *